S008460580B2

US008460580B2

(12) United States Patent
Watanabe et al.

(10) Patent No.: US 8,460,580 B2
(45) Date of Patent: Jun. 11, 2013

(54) ALLOY POWDER FOR RAW MATERIAL OF INORGANIC FUNCTIONAL MATERIAL AND PHOSPHOR

(75) Inventors: Hiromu Watanabe, Yokohama (JP); Masumi Itou, Yokohama (JP); Keiichi Seki, Yokohama (JP); Hiroshi Wada, Yokohama (JP); Motoyuki Shigeiwa, Yokohama (JP); Kaoru Terada, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 136 days.

(21) Appl. No.: 12/615,002

(22) Filed: Nov. 9, 2009

(65) Prior Publication Data

US 2010/0052515 A1  Mar. 4, 2010

Related U.S. Application Data

(62) Division of application No. 11/910,320, filed as application No. PCT/JP2006/306903 on Mar. 31, 2006, now Pat. No. 7,824,573.

(30) Foreign Application Priority Data

Apr. 1, 2005 (JP) .................. 2005-106285
Mar. 27, 2006 (JP) .................. 2006-085148
Mar. 27, 2006 (JP) .................. 2006-085149
Mar. 27, 2006 (JP) .................. 2006-085150
Mar. 28, 2006 (JP) .................. 2006-086849
Mar. 28, 2006 (JP) .................. 2006-086850

(51) Int. Cl.
*C09K 11/59* (2006.01)
*C09K 11/62* (2006.01)
*C09K 11/64* (2006.01)
*C09K 11/66* (2006.01)
*C09K 11/67* (2006.01)
*C09K 11/77* (2006.01)

(52) U.S. Cl.
USPC ................... 252/301.4 F; 313/486

(58) Field of Classification Search
USPC .................................. 252/301.4 F
See application file for complete search history.

(56) References Cited

U.S. PATENT DOCUMENTS

| 5,252,148 | A | 10/1993 | Shigeta et al. |
| 6,080,954 | A | 6/2000 | Inoue et al. |
| 6,156,993 | A | 12/2000 | Inoue et al. |
| 6,558,447 | B1 | 5/2003 | Shekhter et al. |
| 6,632,379 | B2 | 10/2003 | Mitomo et al. |
| 6,649,946 | B2 | 11/2003 | Bogner et al. |
| 6,670,748 | B2 | 12/2003 | Ellens et al. |
| 6,682,663 | B2 | 1/2004 | Botty et al. |
| 6,776,927 | B2 | 8/2004 | Mitomo et al. |
| 7,258,816 | B2 | 8/2007 | Tamaki et al. |
| 2004/0135504 | A1 | 7/2004 | Tamaki et al. |
| 2006/0038477 | A1 | 2/2006 | Tamaki et al. |
| 2006/0076883 | A1 | 4/2006 | Himaki et al. |
| 2006/0255710 | A1 | 11/2006 | Mueller-Mach et al. |
| 2007/0007494 | A1 | 1/2007 | Hirosaki et al. |
| 2009/0066230 | A1 | 3/2009 | Hirosaki et al. |
| 2010/0052515 | A1* | 3/2010 | Watanabe et al. ............. 313/503 |

FOREIGN PATENT DOCUMENTS

| CN | 1522291 | | 8/2004 |
| CN | 1556843 | | 12/2004 |
| EP | 0 854 669 | | 7/1998 |
| EP | 1 433 831 | A1 | 6/2004 |
| EP | 1696016 | * | 8/2006 |
| EP | 1 867 695 | A1 | 12/2007 |
| JP | 11-166179 | | 6/1999 |
| JP | 2001-011438 | | 1/2001 |
| JP | 2003-171661 | | 6/2003 |
| JP | 2004-010786 | | 1/2004 |
| JP | 2004-182781 | | 7/2004 |
| JP | 2005-054182 | | 3/2005 |
| JP | 2005-60557 | | 3/2005 |
| JP | 2005-68169 | | 3/2005 |
| JP | 2005-235934 | | 9/2005 |
| JP | 2005-239985 | | 9/2005 |
| JP | 2005-255885 | | 9/2005 |

(Continued)

OTHER PUBLICATIONS

Takashi Horikawa, et al., "Synthesis and Fluorescent Characteristics of Complex Metal Nitride $Sr_2Si_5N_8:Eu^{2+}$", The Japan Institute of Metals, Spring Meeting, 2006, pp. 441 and 550 (with an additional page and English translation).

Michael Woike, et al., "Preparation and Crystal Structure of the Nitridosilicates $Ln_3Si_6N_{11}$ (Ln = La, Ce, Pr, Nd, SM) and $LnSi_3N_5$ (Ln = Ce, Pr, Nd)", American Chemical Society, vol. 34, 1995, pp. 5105-5108.

Xianqing Piao, et al., "Preparation of $CaAlSiN_3:Eu^{2+}$ Phosphors by the Self-Propagating High-Temperature Synthesis and Their Luminescent Properties", Chemical Material, vol. 19, 2007, pp. 4592-4599.

(Continued)

*Primary Examiner* — Carol M Koslow
(74) *Attorney, Agent, or Firm* — Oblon, Spivak, McClelland, Maier & Neustadt, L.L.P.

(57) ABSTRACT

The present invention relates to a phosphor comprising a nitride or an oxynitride, comprising an X-ray powder diffraction pattern comprising at least one Region having at least one peak with an intensity ratio I of 8% or less, the X-ray powder diffraction pattern measured in the 2θ range from 10° to 60° using a CuKα line (1.54184 Å), wherein the Region is the 2θ range from 41.5° to 47°, the intensity of each peak is a value obtained after background correction, and the intensity ratio I is defined by the formula $(I_p \times 100)/I_{max}$ (%), where $I_{max}$ represents the height of the most intense peak present in the 2θ range from 34° to 37° and $I_p$ represents the height of each peak.

57 Claims, 7 Drawing Sheets

FOREIGN PATENT DOCUMENTS

| | | | |
|---|---|---|---|
| JP | 2005-336253 | * | 12/2005 |
| JP | 2006-008721 | | 1/2006 |
| JP | 2006-49799 | | 2/2006 |
| JP | 2006-52363 | | 2/2006 |
| JP | 2006-063286 | | 3/2006 |
| JP | 2006-77079 | | 3/2006 |
| JP | 2006-77259 | | 3/2006 |
| JP | 2006-199876 | | 8/2006 |
| JP | 2008-163078 | | 7/2008 |
| TW | 200944577 | | 11/2009 |
| WO | WO 03/080764 A1 | | 10/2003 |
| WO | WO 2005/052087 | * | 6/2005 |
| WO | WO 2005/103199 A1 | | 11/2005 |
| WO | WO 2006/080535 A1 | | 8/2006 |

OTHER PUBLICATIONS

Motoharu Imai, et al., "Superconductivity of $Ca(Al_{0.5}, Si_{0.5})_2$, A Ternary Silicide With the $AlB_2$-Type Structure", Applied Physics Letters, vol. 80, No. 6, Feb. 11, 2002, pp. 1019-1021.

Motoharu Imai, et al., "Superconducting Properties of Single-Crystalline $Ca(Al_{0.5}, Si_{0.5})_2$: A Ternary Silicide With the $AlB_2$—Type Structure", The American Physical Society, vol. 68, 2003, pp. 064512-1-064512-7.

Third Party's Opinion issued Feb. 10, 2011, in European Patent Application No. 06730851.0.

English translation of the Third Party's Opinion issued Aug. 26, 2010, in Japanese Patent Application No. 2007-70850 (Japanese version of the Third Party's Opinion previously filed on Oct. 4, 2010).

English translation of the Third Party's Opinion issued on Jul. 9, 2010, in Japanese Patent Application No. 2006-085148 (previously filed on Oct. 4, 2010).

Office Action issued Oct. 18, 2011, in Japanese Patent Application No. 2006-085148 with English translation.

Office Action issued Oct. 18, 2011, in Japanese Patent Application No. 2006-086850 with English translation.

Chinese Office Action Issued Feb. 13, 2012, in Chinese Patent Application No. 200680015862.5 with English translation.

Kyota Uheda, et al., Red nitride phosphor for white LED, 305 Conference of Phosphor Society, 2004, pp. 37-47.

Chinese Office Action issued Sep. 20, 2012, in Chinese Patent Application No. 200680015862.5.

European Search Report issued Feb. 21, 2013, issued in corresponding European Patent Application No. 06730851.0.

C.M.,. Chen et al, "Thixocasting of Hypereutectic Al-25Si-2.5Cu-1Mg-0.5Mn Alloys Using Densified Powder Compacts," Materials Science and Engineering, A366, (2004), pp. 183-194.

* cited by examiner

EXAMPLE 4-1

COMPARATIVE EXAMPLE 4-1

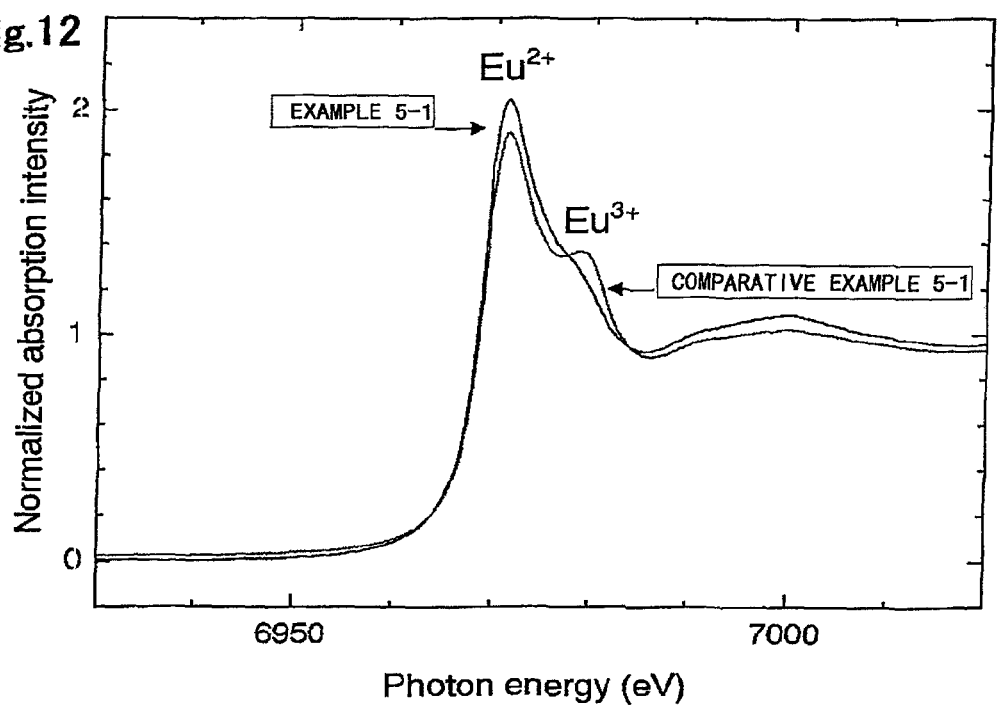

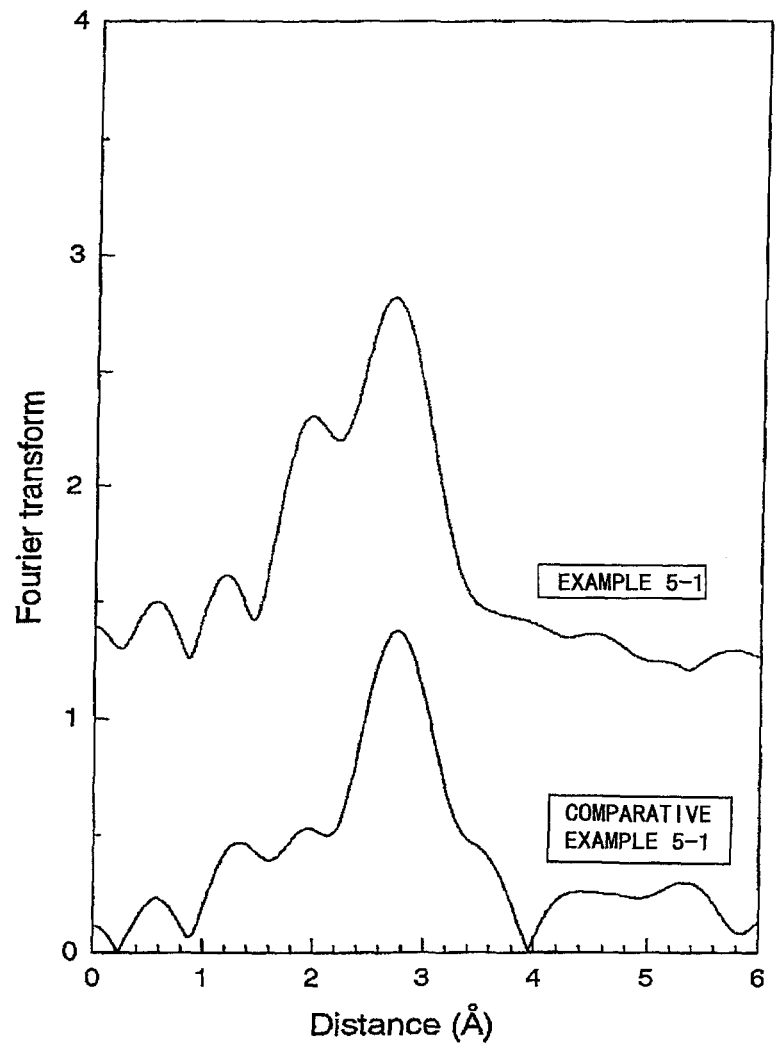

ALLOY POWDER FOR RAW MATERIAL OF INORGANIC FUNCTIONAL MATERIAL AND PHOSPHOR

CROSS REFERENCE TO RELATED APPLICATION

This application is a divisional application of U.S. application Ser. No. 11/910,320, filed on Jan. 31, 2008, which is a 371 of PCT/JP06/306903, filed on Mar. 31, 2006, and claims priority to the following Japanese Patent Applications: No. 2005-106285, filed on Apr. 1, 2005; No. 2006-085148, filed on Mar. 27, 2006; No. 2006-085149, filed on Mar. 27, 2006; No. 2006-085150, filed on Mar. 27, 2006; No. 2006-086849, filed on Mar. 28, 2006; and No. 2006-086850, filed on Mar. 28, 2006.

TECHNICAL FIELD

The present invention relates to alloy powders for inorganic functional material precursors and method for producing the alloy powders. In particular, the present invention relates to an alloy powder for an inorganic functional material precursor suitable for producing a phosphor and also relates to a method for producing the alloy powder. Furthermore, the present invention relates to the phosphor and a method for producing the phosphor. The present invention relates to a phosphor-containing composition containing the phosphor, a light-emitting device containing the phosphor, a display including the light-emitting device, and a lighting system including the light-emitting device.

BACKGROUND ART

Phosphors are used for fluorescent tubes, vacuum fluorescent displays (VFD), field emission displays (FED), plasma display panels (PDP), cathode ray tubes (CRT), white light-emitting diodes (LED), and the like. In these uses, in order to allow the phosphors to emit light, energy for exciting the phosphors needs to be applied to the phosphors. When the phosphors are excited with excitation sources, such as vacuum ultraviolet rays, ultraviolet rays, visible rays, and electron beams, having high energy, the phosphors emit ultraviolet, visible, or infrared light. However, there is a problem in that the brightness of the phosphors is decreased while the phosphors are being exposed to the excitation sources for a long time.

In recent years, various novel materials including nitrides containing three or more elements have been synthesized and have been replacing conventional phosphors such as silicate phosphors, phosphate phosphors, aluminate phosphors, borate phosphors, sulfide phosphors, and oxysulfide phosphors. In particular, the following phosphors have been recently developed: silicon nitride-based phosphors, such as multi-component nitrides and oxynitrides, having excellent properties.

Patent Document 1 discloses a phosphor represented by the formula $M_xSi_yN_z$:Eu, wherein M is at least one alkaline-earth metal selected from the group consisting of the group Ca, Sr, and Ba and $z=2/3x+4/3y$. This phosphor is synthesized by a method in which a nitride of the alkaline-earth metal is synthesized by nitridating the alkaline-earth metal and is then mixed with silicon nitride or by a method in which the alkaline-earth metal and silicon imide, which are raw materials, are heated in an $N_2$ or Ar flow. In both methods, the alkaline-earth metal, which is sensitive to air and moisture, needs to be used; hence, the methods are problematic in industrial large-scale synthesis.

Patent Document 2 discloses oxynitride phosphors derived from an oxynitride represented by the formula $M_{16}Si_{15}O_6N_{32}$ and sialons each represented by the formula $MSiAl_2O_3N_2$, $M_{13}Si_{18}Al_{12}O_{18}N_{36}$, $MSi_5Al_2ON_9$, or $M_3Si_5AlON_{10}$. In particular, when M is Sr, a phosphor represented by the formula $SrSiAl_2O_3N_2$:$Eu^{2+}$ can be obtained in such a manner that $SrCO_3$, AlN, and $Si_3N_4$ are mixed at a ratio of 1:2:1 and the mixture is heated in a reducing atmosphere ($N_2/H_2$).

In this case, all the phosphors obtained are oxynitrides and any nitrides containing no oxygen cannot be obtained.

A Ca-alpha sialon phosphor, which is an oxynitride phosphor, activated with $Eu^{2+}$ ions has been proposed (Patent Document 4).

This phosphor is produced by a process below.

A raw material powder is prepared in such a manner that silicon nitride ($Si_3N_4$), aluminum nitride (AlN), and europium oxide ($Eu_2O_3$) are mixed such that the ratio of Si to Al to Eu is 13:9:1. The raw material powder is fired at 1700° C. for one hour in a 1 atm nitrogen atmosphere by a hot press technique in which the raw material powder is compression-molded at a pressure of 200 atm, whereby an Eu-alpha sialon is produced. Another raw material powder is prepared in such a manner that silicon nitride ($Si_3N_4$), aluminum nitride (AlN), and calcium oxide (CaO) are mixed such that the ratio of Si to Al to Ca is 13:9:3. This raw material powder is fired at 1700° C. for one hour in a 1 atm nitrogen atmosphere by a hot press technique in which this raw material powder is compression-molded at a pressure of 200 atm, whereby a Ca-alpha sialon is produced. The Eu-alpha sialon and the Ca-alpha sialon are mixed at a ratio of 50:50. This mixture is fired at 1700° C. for one hour in a 1 atm nitrogen atmosphere by a hot press technique, whereby the target Eu ion-activated Ca-alpha sialon phosphor is produced. It has been reported that the phosphor obtained by this process emits yellow light with a wavelength of 550 nm-600 nm when the phosphor is excited by blue light with a wavelength of 450 nm-500 nm.

Phosphors, excited with ultraviolet rays or blue light, for white LED use or plasma display panel use need to be resistant to degradation during their use.

The raw material powder used to produce the nitride or oxynitride phosphor has low reactivity and therefore is heated in such a manner that the raw material powder is compression-molded at high temperature, that is, the contact area between particles of the raw material powder is increased such that the solid state reaction of the raw material powder is promoted during firing. Hence, the nitride or oxynitride phosphor is obtained in the form of an extremely hard sintered body. The sintered body obtained as described above needs to be finely milled depending on the purpose of the phosphor. However, if the hard sintered body, that is, the phosphor is mechanically milled with, for example, an ordinary jaw crusher or ball mill for a long time with a huge amount of energy, a large number of defects are caused in the host crystal of the phosphor. This causes a problem in that the emission intensity of the phosphor is significantly reduced.

Therefore, the following technique has been attempted: a technique in which the powder is fired without compression-molding the powder. The solid state reaction of the nitride powder does not proceed at low temperature. This is ineffective in producing the target phosphor. Therefore, the phosphor needs to be synthesized at a high temperature of 1800° C. or more. The firing of the powder at such a high temperature causes a problem in that nitrogen is dissociated from the nitride, that is, the nitride is decomposed. In order to prevent this problem, the powder needs to be fired in a nitrogen atmosphere with a pressure of 5 atm or more. This requires not only a large amount of firing energy but also a very expensive high-temperature, high-pressure furnace, causing an increase in the production cost of the phosphor.

In order to synthesize a nitride with low oxygen content, an alkaline-earth metal nitride, for example, calcium nitride ($Ca_3N_2$) or strontium nitride ($Sr_3N_2$) needs to be used instead of a powder of the alkaline-earth metal. Nitrides of divalent metals are usually unstable in a moisture-containing atmosphere and react with moisture to produce hydroxides. This tendency is particularly remarkable in strontium nitride. Therefore, it has been difficult to produce a phosphor with low oxygen content.

Therefore, a novel production method in which none of the metal nitrides is used as a starting material has been demanded.

Patent Document 3, which relates to methods for producing nitride phosphors from metal materials, has been recently published. Patent Document 3 discloses an example of a method for producing an aluminum nitride-based phosphor and describes that a transition element, a rare-earth element, aluminum, and an alloy thereof can be used as raw materials. However, this document discloses no example in which such an alloy is used as a starting material but discloses that metallic Al is used as an Al source. This method uses a combustion synthesis technique in which a starting material is rapidly heated to a high temperature (3000 K) by igniting the starting material and therefore is significantly different from a method according to the present invention. It is probably difficult to produce a high-performance phosphor by this method. That is, any activating element cannot be uniformly distributed by the technique, in which the starting material is rapidly heated to 3000 K; hence, it is difficult to produce such a high-performance phosphor. This document describes no nitride phosphor containing an alkaline-earth element obtained from the alloy or no nitride phosphor containing silicon.

Known examples of an alloy containing Si and an alkaline-earth metal include $Ca_7Si$, $Ca_2Si$, $Ca_5Si_3$, $CaSi$, $Ca_2Si_2$, $Ca_{14}Si_{19}$, $Ca_3Si_4$, $SrSi$, $SrSi_2$, $Sr_4Si_7$, $Sr_5Si_3$, and $Sr_7Si$. Known examples of an alloy containing Si, aluminum, and an alkaline-earth metal include $Ca(Si_{1-x}Al_x)_2$, $Sr(Si_{1-y}Al_y)_2$, $Ba(Si_{1-x}Al_x)_2$, and $Ca_{1-x}Sr_x(Si_{1-y}Al_y)_2$. In particular, $A(B_{0.5}Si_{0.5})_2$ has been investigated for superconductivity and is disclosed in, for example, Non-patent Documents 1 and 2, wherein A is Ca, Sr, or Ba and B is Al, or Ga. However, there is no example in which any one of these alloys is used as a phosphor precursor. These alloys have been prepared for investigation in a laboratory scale and have not been ever produced in a large industrial scale.

Phosphors, such as $Sr(Ca)_2Si_5N_8$ and $CaAlSiN_3$, containing Si and an alkaline-earth metal emit yellow to red light when the phosphors are excited with blue or near-ultraviolet light-emitting diodes, as described above. Therefore, the phosphors, which can be used in combination with such blue or near-ultraviolet light-emitting diodes, are industrially useful materials for forming white light-emitting diodes.

However, there has been no method for producing the alloy containing Si and an alkaline-earth metal necessary to produce the phosphors in a large industrial scale. A conventional method for producing the alloy has the following problems: a problem that the alloy contains impurities, a problem that it is difficult to produce the alloy such that the alloy has a designed composition because the alkaline-earth metal has a low boiling point and therefore is readily vaporized, and a problem that the composition of the alloy obtained is nonuniform.

For the production of the phosphor, the presence of impurities in the phosphor impairs luminescent properties of the phosphor even if the amount of the impurities very small. In order to allow the phosphor to have desired luminescent properties, it is essential that, for example, an activating element is uniformly distributed in the phosphor and that the composition of the phosphor is as designed. Therefore, the following method is necessary: a method for producing an alloy for a phosphor precursor in a large industrial scale such that this alloy contains no impurities and the composition of this alloy is as designed and is uniform.

Even if this alloy is obtained, a cast ingot of this alloy is inactive to produce a phosphor. Further investigation is required in order to carry out a desired reaction to convert the alloy into a phosphor.

Patent Document 1: PCT Japanese Translation Patent Publication No. 2003-515665

Patent Document 2: Japanese Unexamined Patent Application Publication No. 2003-206481

Patent Document 3: Japanese Unexamined Patent Application Publication No. 2005-54182

Non-patent Document 1: M. Imai, Applied Physics Letters, 80 (2002), 1019-1021

Non-patent Document 2: M. Imai, Physics Review B, 68, (2003), 064512

Patent Document 4: Japanese Unexamined Patent Application Publication No. 2002-363554

DISCLOSURE OF INVENTION

It is an object of a first aspect of the present invention to provide a powder of an alloy for an inorganic functional material precursor. The alloy is a material for producing inorganic functional materials such as phosphors. The alloy powder is useful in producing a high-performance inorganic functional material because the use of the alloy powder allows a reaction for producing the inorganic functional material to proceed efficiently and uniformly.

The first aspect provides a powder of an alloy for an inorganic functional material precursor. The alloy contains at least one metal element and at least one activating element $M^1$. The alloy powder has a weight-average median diameter $D_{50}$ of 5 μm to 40 μm.

The alloy powder can be produced through a step of milling the alloy in a nitrogen-containing atmosphere.

It is an object of a second aspect of the present invention to provide a method for producing a phosphor, which is uniform in chemical composition, at low cost. In the method, the following step or furnace is not necessary: a compression molding step for promoting the solid state reaction of a nitride precursor, a step of milling the fired nitride precursor for a long time with strong force, or a high-temperature, high-pressure furnace, which is expensive. In particular, it is an object of the second aspect to provide an industrially advantageous method for producing a phosphor made of a nitride, an oxynitride, or an oxide.

A method for producing a phosphor according to the second aspect includes a step of heating an alloy, containing two or more metal elements for forming the phosphor, in a nitrogen-containing atmosphere.

It is an object of a third aspect of the present invention to provide a simple technique for increasing the brightness of a phosphor.

A phosphor according to the third aspect is made of a nitride or an oxynitride. The phosphor is dispersed in a tenfold weight of water and the electric conductivity of a supernatant liquid obtained by allowing the dispersion to stand for one hour is 50 mS/m or less.

It is an object of a fourth aspect of the present invention to provide a phosphor having high brightness and luminous efficiency. The phosphor emits yellow to orange light or orange to red light when the phosphor is excited with light with a near ultraviolet to blue range of wavelengths.

A phosphor according to the fourth aspect has an X-ray powder diffraction pattern having Regions 1 to 6 having peaks with an intensity ratio I of 8% or less. The X-ray powder diffraction pattern is measured in the 2θ range from 10° to 60° using a CuKα line (1.54184 Å). Region 1 is the range from 10° to 17°. Region 2 is the 2θ range from 18.3° to 24°, Region 3 is the 2θ range from 25.3° to 30.7°. Region 4 is the 2θ range from 32° to 34.3°. Region 5 is the 2θ range from 37° to 40°. Region 6 is the 2θ range from 41.5° to 47°. The intensity of each peak is a value obtained by background correction. The intensity ratio I is defined by the formula $(I_p \times 100)/I_{max}$ (%), where $I_{max}$ represents the height of the most intense peak present in the 2θ range from 34° to 37° and $I_p$ represents the height of each peak.

It is an object of a fifth aspect of the present invention to provide a phosphor having high brightness and luminous efficiency. The phosphor emits yellow to orange light or orange to red light when the phosphor is excited with light with a near ultraviolet to blue range of wavelengths.

A phosphor according to the fifth aspect is made of a nitride or an oxynitride and contains an activating element $M^1$. In the phosphor, 85 mole percent or more of the activating element $M^1$ has a valence less than its maximum oxidation number.

BRIEF DESCRIPTION OF THE DRAWINGS

FIG. 12 is a chart showing the EXAFS spectrum of an Eu—K absorption edge.

FIG. 13 is a chart showing the XANES spectrum of an Eu-$L_3$ absorption edge.

DETAILED DESCRIPTION

Detailed Description of First Aspect

Figure 1:
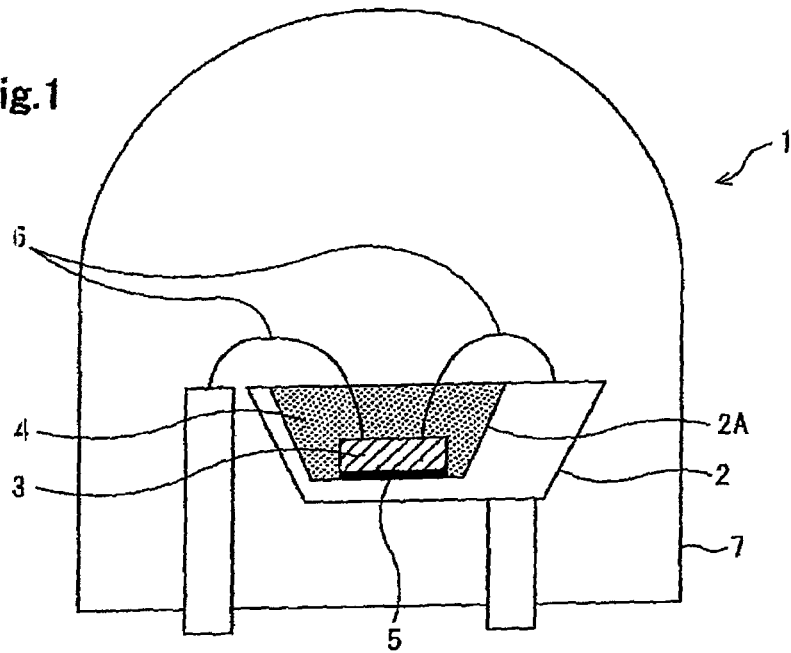
FIG. 1 is a schematic sectional view of an example of a light-emitting device according to the present invention.

The inventors have found that an inorganic functional material for illuminants having high brightness and luminous efficiency can be obtained by the use of a powder of an alloy having a weight-average median diameter $D_{50}$ within a specific range and a specific particle size distribution. Furthermore, the inventors have found that the content of oxygen, carbon, or the like in the alloy has a significant influence on the activity of the alloy and properties of a phosphor prepared from the alloy.

In order to produce the phosphor using the alloy, which is one of raw materials, the alloy needs to be nitridated, oxidized, or sulfurated. In this operation, it is critical to control the activity of the alloy powder.

One of the most effective ways to control the activity of the alloy powder is to adjust the particle size of the alloy powder. When the weight-average median diameter $D_{50}$ of the alloy powder is extremely large, inner portions of the particles do not react sufficiently with any reactant because of low activity. When the weight-average median diameter $D_{50}$ thereof is extremely small, it is difficult to control a chemical reaction because of extremely high activity; hence, a target material with high purity cannot be obtained.

A first aspect of the present invention has been achieved on the basis of the above findings.

The first aspect provides a powder of an alloy for an inorganic functional material precursor. The alloy powder is a material for producing an inorganic functional material. The alloy contains at least one metal element and at least one activating element $M^1$ and the powder has a weight-average median diameter $D_{50}$ of 5 μm-40 μm.

It is preferable that the percentage of alloy particles having a size of 10 μm or less in the alloy powder be 80 weight percent or less, the percentage of alloy particles having a size of 45 μm or more in the alloy powder be 40 weight percent or less, QD be 0.59 or less, and the content of iron in the alloy powder be 500 ppm or less.

The content of oxygen in the alloy powder is preferably 0.5 weight percent or less.

In particular, the content of carbon in the alloy powder is preferably 0.06 weight percent or less.

The inorganic functional material precursor-use alloy powder may contain a tetravalent metal element $M^4$ including Si and one or more types of metal elements other than Si.

The inorganic functional material precursor-use alloy powder may contain a divalent metal element $M^2$ in addition to the activating element $M^1$ and the tetravalent metal element $M^4$, which includes Si.

In the inorganic functional material precursor-use alloy powder, the divalent metal element $M^2$ may be an alkaline-earth metal.

The inorganic functional material precursor-use alloy powder may further contain a trivalent metal element $M^3$.

The activating element $M^1$ is preferably at least one selected from the group consisting of Cr, Mn, Fe, Ce, Pr, Nd, Sm, Eu, Tb, Dy, Ho, Er, Tm, and Yb.

The divalent metal element $M^2$ is preferably at least one selected from the group consisting of Mg, Ca, Sr, Ba, and Zn. The trivalent metal element $M^3$ is preferably at least one selected from the group consisting of Al, Ga, In, and Sc. The tetravalent metal element $M^4$ is preferably at least one selected from the group consisting of Si, Ge, Sn, Ti, Zr, and Hf.

Fifty mole percent or more of the divalent metal element $M^2$ is preferably Ca and/or Sr. Fifty mole percent or more of the trivalent metal element $M^3$ is preferably Al. Fifty mole percent or more of the tetravalent metal element $M^4$ is preferably Si.

The activating element $M^1$ contains preferably Eu and/or Ce. The divalent metal element $M^2$ contains preferably Ca and/or Sr. The trivalent metal element $M^3$ contains preferably Al. The tetravalent metal element $M^4$ contains preferably Si.

The inorganic functional material precursor-use alloy powder is suitable for producing phosphors.

The inorganic functional material precursor-use alloy powder can be produced through a step of milling the alloy in a nitrogen-containing atmosphere.

A classifying step is preferably subsequent to the milling step.

According to the first aspect, a high-performance inorganic functional material can be obtained by controlling the weight-average median diameter $D_{50}$ and particle size distribution of the alloy powder and the amount of a trace element contained in the alloy.

The inorganic functional material precursor-use alloy powder according to the first aspect of the present invention is particularly suitable for producing a phosphor having excellent luminescent properties such as brightness and luminous efficiency. The phosphor can be produced at low cost.

The first aspect of the present invention will now be further described in detail. The first aspect is not limited to descriptions below. Various modifications may be made within the scope of the present invention.

In the description of the first aspect, a numerical range expressed with the symbol "-" includes values which are each placed on the left or right of the symbol "-" and which each corresponds to a lower limit or an upper limit.

Although the inorganic functional material precursor-use alloy powder of the first aspect is described principally for phosphor use, the inorganic functional material precursor-use alloy powder of the first aspect is useful in producing other inorganic functional materials in addition to the phosphor.

The term "alloy powder" herein means the aggregation of the alloy particles.

[Composition of Alloy Powder for Inorganic Functional Material Precursor]

The composition of the inorganic functional material precursor-use alloy powder of the first aspect will now be described. The inorganic functional material precursor-use alloy powder of the first aspect contains at least one type of metal element and at least one type of activating element $M^1$. The activating element $M^1$ is necessary to allow the inorganic functional material to have a desired function or necessary to impart such a function to the inorganic functional material. A trace amount of the activating element $M^1$ is present in the host crystal of the inorganic functional material.

The alloy of the alloy powder of the first aspect contains the tetravalent metal element $M^4$, which includes Si, and one or more types of metal elements other than Si. In particular, the alloy contains the activating element $M^1$, the divalent metal element $M^2$, and the tetravalent metal element $M^4$, which includes Si. The divalent metal element $M^2$ is preferably an alkaline-earth metal. When the alloy contains such a component, the alloy is a useful precursor for producing phosphors, such as $(Sr, Ca)_2Si_5N_8$:Eu, Ce and $CaAlSiN_3$:Eu, Ce, containing Si and the alkaline-earth metal. Such phosphors emit yellow, orange, or red light which is industrially useful.

The alloy, which contains the activating element $M^1$, the divalent metal element $M^2$, the trivalent metal element $M^3$, and the tetravalent metal element $M^4$ including Si, is preferably represented by Formula (1) below and the inorganic functional material precursor-use alloy powder is particularly suitable for producing a phosphor made of a nitride or oxynitride represented by Formula (2) below:

  (1)

  (2)

wherein a, b, c, d, e, and f satisfy the following formulas:

$0.00001 \leq a \leq 0.15$, $a+b=1$, $0.5 \leq c \leq 1.5$, $0.5 \leq d \leq 1.5$, $2.5 \leq e \leq 3.5$, and $0 \leq f \leq 0.5$.

The activating element $M^1$ may be one of elements forming various luminescent ions which may be present in a crystal matrix for forming the phosphor made of the nitride or the oxynitride. The activating element $M^1$ is preferably at least one selected from the group consisting of Cr, Mn, Fe, Ce, Pr, Nd, Sm, Eu, Tb, Dy, Ho, Er, Tm, and Yb because the phosphor has high luminescent properties. In particular, the activating element $M^1$ is preferably one or more of Mn, Ce, Pr, and Eu and more preferably Ce and/or Eu because phosphors emitting bright red light can be obtained. In order to enhance the brightness and in order to achieve various functions such as a light-storing function, the activating element $M^1$ may be used in combination with one or more co-activating elements other than Ce and/or Eu.

Various metal elements, such as divalent, trivalent, and tetravalent metal elements, other than the activating element $M^1$ can be used. The divalent metal element $M^2$ is preferably at least one selected from the group consisting of Mg, Ca, Sr, Ba, and Zn. The trivalent metal element $M^3$ is preferably at least one selected from the group consisting of Al, Ga, In, and Sc. The tetravalent metal element $M^4$ is preferably at least one selected from the group consisting of Si, Ge, Sn, Ti, Zr, and Hf. This is because the phosphor has high luminescent properties.

The composition is preferably adjusted such that 50 mole percent or more of the divalent metal element $M^2$ is Ca and/or Sr, because the phosphor has high luminescent properties. Eighty mole percent or more of the divalent metal element $M^2$ is more preferably Ca and/or Sr. Ninety mole percent or more of the divalent metal element $M^2$ is further more preferably Ca and/or Sr. The whole of the divalent metal element $M^2$ is most preferably Ca and/or Sr.

The composition is preferably adjusted such that 50 mole percent or more of the trivalent metal element $M^3$ is Al, because the phosphor has high luminescent properties. Eighty mole percent or more of the trivalent metal element $M^3$ is more preferably Al. Ninety mole percent or more of the trivalent metal element $M^3$ is further more preferably Al. The whole of the trivalent metal element $M^3$ is most preferably Al.

The composition is preferably adjusted such that 50 mole percent or more of the tetravalent metal element $M^4$ including Si is Si, because the phosphor has high luminescent properties. Eighty mole percent or more of the tetravalent metal element $M^4$ is more preferably Si. Ninety mole percent or more of the tetravalent metal element $M^4$ is further more preferably Si. The whole of the tetravalent metal element $M^4$ is most preferably Si.

It is particularly preferable that 50 mole percent or more of the divalent metal element $M^2$ be Ca and/or Sr, 50 mole percent or more of the trivalent metal element $M^3$ be Al, and 50 mole percent or more of the tetravalent metal element $M^4$ be Si, because the phosphor has high luminescent properties.

The reasons why a to f in Formulas (1) and (2) are preferably within the above ranges are as described below.

When a is less than 0.00001, sufficient emission intensity cannot be achieved. When a is greater than 0.15, concentration quenching is likely to be high and emission intensity is likely to be low. Therefore, raw materials are mixed such that a satisfies the inequality $0.00001 \leq a \leq 0.15$. Because of the same reason as described above, a preferably satisfies the inequality $0.0001 \leq a \leq 0.1$, more preferably $0.001 \leq a \leq 0.05$, further more preferably $0.002 \leq a \leq 0.04$, and most preferably $0.004 \leq a \leq 0.02$.

In the host crystal of the phosphor, atoms of the activating element $M^1$ substitute for atoms of the divalent metal element $M^2$; hence, the composition of a mixture of the raw materials is adjusted such that the sum of a and b is equal to one.

When c is less than 0.5 or greater than 1.5, a heterogeneous phase is formed during production and therefore the yield of the phosphor is likely to be low. Thus, the raw materials are mixed together such that c satisfies the inequality $0.5 \leq c \leq 1.5$. In view of the emission intensity of the phosphor, c preferably satisfies the inequality $0.5 \leq c \leq 1.5$, more preferably $0.6 \leq c \leq 1.4$, and most preferably $0.8 \leq c \leq 1.2$.

When d is less than 0.5 or greater than 1.5, such a heterogeneous phase is formed during production and therefore the yield of the phosphor is likely to be low. Thus, the raw materials are mixed together such that d satisfies the inequality $0.5 \leq d \leq 1.5$. In view of the emission intensity of the phosphor, d preferably satisfies the inequality $0.5 \leq d \leq 1.5$, more preferably $0.6 \leq d \leq 1.4$, and most preferably $0.8 \leq d \leq 1.2$.

Herein, e is a coefficient representing the content of nitrogen and satisfies the equation $e = 2/3 + c + (4/3)d$. From this equation and the inequalities $0.5 \leq c \leq 1.5$ and $0.5 \leq d \leq 1.5$, the range of e is given by the inequality $1.84 \leq e \leq 4.17$. In the composition of the phosphor, which is represented by Formula (2), when e, which represents the content of nitrogen, is less than 2.5, the yield of the phosphor is likely to be low. When e exceeds 3.5, the yield of the phosphor is also likely to be low. Hence, e usually satisfies the inequality $2.5 \leq e \leq 3.5$.

Oxygen in the phosphor, which is represented by Formula (2), is an impurity contained in source metals or probably contaminates the source metals in production steps such as a milling step and a nitridation step. Herein, f represents the percentage of oxygen in the phosphor, is within such a range that reductions in luminescent properties of the phosphor are acceptable, and preferably satisfies the inequality $0 \leq f \leq 0.5$.

Examples of the alloy include EuSrCaAlSi alloys, EuSrAlSi alloys, EuCaAlSi alloys, EuSrMgAlSi alloys, EuCaMgAlSi alloys, EuCaSi alloys, EuSrCaSi alloys, and EuSrSi alloys. In particular, these examples include $Eu_{0.008}Sr_{0.792}Ca_{0.2}AlSi$, $Eu_{0.008}Sr_{0.892}Ca_{0.1}AlSi$, $Eu_{0.008}Sr_{0.692}Ca_{0.3}AlSi$, and $Eu_{0.008}Sr_{0.892}Mg_{0.1}AlSi$.

Examples of the phosphor include $(Sr, Ca, Mg)AlSiN_3:Eu$, $(Sr, Ca, Mg)AlSiN_3:Ce$, $(Sr, Ca)_2Si_5N_8:Eu$, and $(Sr, Ca)_2Si_5N_8:Ce$.

The inorganic functional material precursor-use alloy powder of the first aspect is not limited to a precursor for the phosphor, which is made of the nitride or the oxynitride, and can be used as a precursor for phosphors made of an oxide, a sulfide, an oxysulfide, or a carbide. Furthermore, the alloy powder can be used as a precursor for various inorganic functional materials other than these phosphors.

(Impurities in Alloy Powder for Inorganic Functional Material Precursor)

The content of oxygen, serving as an impurity, in the inorganic functional material precursor-use alloy powder of the first aspect is preferably 0.5 weight percent or less. When the oxygen content is greater than 0.5 weight percent, the brightness of the nitride phosphor may be decreased. The oxygen content is preferably 0.4 weight percent or less and more preferably 0.3 weight percent or less.

In order to obtain phosphors having high brightness, the content of carbon in the alloy powder is preferably 0.06 weight percent or less and the content of iron therein is preferably 500 ppm or less. The iron content is more preferably 300 ppm or less and further more preferably 100 ppm or lees.

It is preferable that the iron content, the oxygen content, and the carbon content be small. The lower limits of the iron content, the oxygen content, and the carbon content are not particularly limited. In usual, the lower limit of the iron content is about 1 ppm, that of the oxygen content is about 0.01 weight percent, and that of the carbon content is about 0.1 weight percent because of the limitations of industrial techniques such as the purification of the raw materials and the prevention of impurity contamination.

In a method, described below, for producing the inorganic functional material precursor-use alloy powder, the following attempts are preferably made to control the iron content, oxygen content, carbon content of the inorganic functional material precursor-use alloy powder to be less than or equal to the above corresponding upper limits: an attempt to use high-purity metal materials, an attempt to properly select the relationship between the material of a mill and a material to be milled, an attempt to properly select an atmosphere used in a melting, casting, or milling step, and other attempts.

(Particle Size of Alloy Powder)

In the first aspect, a weight-average median diameter is a value determined from a weight-based particle size distribution curve. The weight-based particle size distribution curve is obtained in such a manner that the distribution of particle sizes is determined by a laser diffraction/scattering method. For example, in a 25° C. atmosphere with a humidity of 70%, a substance is dispersed in ethylene glycol and the dispersion is analyzed with a laser diffraction particle size distribution analyzer (LA-300, manufactured by Horiba Ltd.) in the particle size range from 0.1 μm to 600 μm. The particle size corresponding to an integrated value of 50% in the weight-based particle size distribution is defined as a weight-average median diameter $D_{50}$. Furthermore, the particle size corresponding to an integrated value of 25% or 75% therein is defined as a weight-average median diameter $D_{25}$ or $D_{75}$, respectively. The following equation stands: $QD = (D_{75} - D_{25})/(D_{75} + D_{25})$. A reduction in QD means that the particle size distribution is narrow.

The particle size of the inorganic functional material precursor-use alloy powder of the first aspect needs to be adjusted depending on the activity of the metal elements contained in the alloy powder. The weight-average median diameter $D_{50}$ of the alloy powder is usually 5 μm-40 μm. It is preferable that the percentage of the alloy particles having a size of 10 μm or less in the alloy powder be 80 weight percent or less, that the percentage of alloy particles having a size of 45 μm or more in the alloy powder be 40 weight percent or less, and that QD be 0.59 or less.

The lower limit of the weight-average median diameter $D_{50}$ of the inorganic functional material precursor-use alloy powder of the first aspect is usually 5 μm or more, preferably 8 μm or more, more preferably 10 μm or more, and further more preferably 13 μm or more. The upper limit thereof is usually 40 μm or less, preferably 35 μm or less, more preferably 32 μm or less, and further more preferably 25 μm or less. When the weight-average median diameter $D_{50}$ thereof is less than 5 μm, the heat generation rate of the alloy powder is large during a reaction such as nitridation and therefore the control of the reaction may be difficult. When the weight-average median diameter $D_{50}$ thereof is greater than 40 µm, inner portions of the particles may be insufficiently nitridated.

When the percentage of fine particles, that is, the alloy particles having a size of 10 µm or less, in the alloy powder is greater than 80 weight percent, the heat generation rate of the alloy powder is large during a reaction such as nitridation and therefore the control of the reaction is likely to be difficult. The percentage of the alloy particles having a size of 10 µm or less in the alloy powder is preferably 60 weight percent or less, more preferably 50 weight percent or less, and further more preferably 30 weight percent or less. When the percentage of coarse particles, that is, the alloy particles having a size of 45 µm or more, in the alloy powder is greater than 40 weight percent, inner portions of much of the particles are insufficiently nitridated and therefore the phosphor produced is likely to have low luminescent properties. The percentage of the alloy particles having a size of 45 µm or more in the alloy powder is more preferably 30 weight percent or less.

When QD is greater than 0.59, products obtained by nitridation or the like are likely to be nonuniform. Therefore, QD is preferably 0.55 or less and more preferably 0.5 or less.

[Method for Producing Alloy Powder for Inorganic Functional Material Precursor]

In order to produce the inorganic functional material precursor-use alloy powder of the first aspect, one or more types of metal elements and the activating element $M^1$ are weighed. In particular, metals used as raw materials or alloys thereof are weighed such that a composition represented by Formula (1) is obtained. The metals or alloys are then melted into an alloy, which is milled. The powder obtained by milling this alloy is classified. In the case where an alloy containing Si and an alkaline-earth metal is produced, after Si, which has a high melting point (a high boiling point), and/or a Si-containing alloy is melted, the alkaline-earth metal, which has a low melting point (a low boiling point), is preferably melted. If a metal element used is vaporized during melting or is consumed because of the reaction with the material of a crucible, the amount of the metal element may be excessive as required.

(Purity of Source Metals)

For the purity of metals used to produce the alloy, in view of luminescent properties of the phosphor synthesized from the alloy, a source metal for the activating element $M^1$ is preferably purified so as to have an impurity content of 0.1 mole percent or less and more preferably 0.01 mole percent or less. When the activating element $M^1$ is Eu, an Eu source used is preferably metallic Eu. Raw materials containing elements other than the activating element $M^1$ are various metals such as divalent metals, trivalent metals, and tetravalent metals. From the same reason as the above, high-purity source metals are preferably used because the phosphor has high luminescent properties. The high-purity source metals preferably have an impurity content of 0.1 mole percent or less and more preferably 0.01 mole percent or less.

(Form of Source Metals)

The form of source metals is not particularly limited. The source metals are usually used in the form of particles with a diameter of several to several ten millimeters or in the form of agglomerates.

When the divalent metal element $M^2$ is an alkaline-earth metal, the form of a source of the alkaline-earth metal is not particularly limited and the source may be in the form of particles or agglomerates. The form of the source is preferably selected properly depending on chemical properties of the source. For example, Ca is stable in air and therefore a source of Ca can be used in the form of particles or agglomerates. However, Sr is chemically active and therefore a source of Sr is preferably used in the form of agglomerates.

(Fusion of Source Metals)

When the source metals are fused, that is, when the alloy, containing Si and an alkaline-earth metal that is the divalent metal element $M^2$, for a phosphor precursor is produced, there is a problem below.

The melting point of Si is 1410° C. and is close to the boiling point of the alkaline-earth metal (for example, the boiling point of Ca is 1494° C., that of Sr is 1350° C., and that of Ba is 1537° C.). In particular, the boiling point of Sr is lower than the melting point of Si; hence, it is extremely difficult to fuse Sr and Si in one step.

Therefore, in the first aspect, a mother alloy is prepared by melting metallic Si, and then the alkaline-earth metal is melted, whereby this problem is solved.

Since metallic Si is melted and the alkaline-earth metal is then melted, the following advantages can be achieved: an advantage that the alloy has high purity and an advantage that the phosphor produced from the alloy has excellent properties.

A method for melting the source metals of the first aspect is not particularly limited. The following method can be used: an arc melting method, a high-frequency dielectric heating method (hereinafter referred to as a high-frequency melting method), a resistive heating method, or an electron beam melting method. In particular, the arc melting method and the high-frequency melting method are preferable. The high-frequency melting method is more preferable.

The following cases are described in detail below: (1) the case of the arc or electron beam melting method and (2) the case of the high-frequency melting method.

(1) The Case of the Arc or Electron Beam Melting Method

In the case of the arc or electron beam melting method, fusion is performed by the following procedure:

(i) metallic Si or a Si-containing alloy is melted by the arc or electron beam melting method, and (ii) the alkaline-earth metal is then melted by indirect heating such that the alloy containing Si and the alkaline-earth metal is obtained.

In this case, after the molten alkaline-earth metal is mixed with the molten Si-containing alloy, the mixing of the alkaline-earth metal and the Si-containing alloy may be promoted in such a manner that the mixture is agitated and heated with an electron beam or by arc discharge.

(2) The Case of the High-Frequency Melting Method

Since alloys containing the alkaline-earth metal are reactive with oxygen, the alloys should not be melted in air but needs to be melted in a vacuum or an inert gas atmosphere. For such conditions, the high-frequency melting method is preferable. However, it is difficult to melt Si by dielectric heating using a high-frequency wave because Si is a semiconductor. For example, aluminum has a resistivity of $2.8 \times 10^{-8}$ Ω·m and polycrystalline Si for semiconductor devices has a resistivity of $10^5$ Ω·m or more at 20° C. Si, which has such a large resistivity, cannot be directly melted by the high-frequency melting method but is usually melted in such a manner that a conductive susceptor is used and heat is transferred to Si by conduction or radiation. The susceptor may be disk-shaped or tube-shaped and is preferably used in the form of a crucible. The susceptor is usually made of one of graphite, molybdenum, silicon nitride, and the like. There is a problem in that these materials are reactive with the alkaline-earth metal. On the other hand, a crucible (made of alumina or calcia) useful in melting the alkaline-earth metal is insulative and therefore cannot be used as the susceptor. Therefore, if the alkaline-earth metal and Si are placed in a known conductive crucible (made of graphite or the like) serving as a susceptor and are then attempted to be melted by the high-frequency melting method, the alkaline-earth metal and Si cannot be melted together by indirect heating. This problem can be solved by melting the alkaline-earth metal and Si by the following procedure:

(i) metallic Si is melted in a conductive crucible by indirect heating, and (ii) the alkaline-earth metal is then melted in an insulating crucible such that the alloy containing Si and the alkaline-earth metal is obtained.

Metallic Si may be cooled between above steps (i) and (ii) and the alkaline-earth metal may be melted without cooling metallic Si. If the alkaline-earth metal is melted without cooling metallic Si, the following crucible may be used: a crucible prepared by coating a conductive vessel with calcia or alumina, which is suitable for melting the alkaline-earth metal.

In particular, the procedure is as follows:

(i) metallic Si and a metal M (for example, Al or Ga) are melted in the conductive crucible by indirect heating, that is, the high-frequency melting method such that a conductive alloy (a mother alloy) is obtained; and (ii) the mother alloy obtained in step (i) is melted and the alkaline-earth metal is then melted in an alkaline-earth metal-resistant crucible such that the alloy containing Si and the alkaline-earth metal.

Examples of the procedure in which metallic Si or the mother alloy containing Si is primarily melted and the alkaline-earth metal is then melted include a procedure in which metallic Si or the mother alloy containing Si is primarily melted and the alkaline-earth metal is added to molten metallic Si or the molten mother alloy and other procedures.

Si and the metal M other than the divalent metal element $M^2$ may be fused into a conductive alloy. This alloy preferably has a melting point lower than that of Si. A Si—Al alloy is particularly preferable because the melting point of the Si—Al alloy is close to 1010° C., that is, the melting point thereof is lower than the boiling point of the alkaline-earth metal.

When the mother alloy, which contains Si and the metal M other than the divalent metal element $M^2$, is used, the mother alloy is preferably conductive although the composition of the mother alloy is not particularly limited. The molar ratio of Si to the metal M preferably ranges from 1:0.01 to 1:5. The mother alloy preferably has a melting point lower than the boiling point of the alkaline-earth metal.

Metallic Si may be added to the mother alloy, which contains Si.

In the first aspect, there is no limitation in melting the source metals except that metallic Si and the alkaline-earth metal are melted in that order. One of the source metals that is abundantly used or has a high melting point is primarily melted.

In order to uniformly disperse the activating element $M^1$, the activating element $M^1$ is preferably melted subsequently to Si because the amount of the activating element $M^1$ used is small.

In order to produce the alloy which is represented by Formula (1), which contains Si that is the tetravalent metal element $M^4$ and Sr that is the divalent metal element $M^2$, and which is suitable for a phosphor precursor, the source metals are preferably melted by the following procedure:

(1) a mother alloy containing Si and the trivalent metal element $M^3$ is produced in such a manner that Si and the trivalent metal element $M^3$ are fused at the ratio of Si to $M^3$ shown in Formula (1), (2) the mother alloy obtained step (1) and Sr are melted in that order, and (3) a divalent metal element other than Sr and the activating element $M^1$ are then melted.

These source metals are preferably melted in an inert atmosphere and more preferably an Ar atmosphere.

In usual, the pressure is preferably $1 \times 10^3$ to $1 \times 10^5$ Pa. In view of safety, the pressure is greater than or equal to atmospheric pressure.

(Casting of Molten Alloy)

There are many technical issues in directly producing the phosphor from the molten alloy prepared by fusing the source metals. Therefore, the solid alloy is obtained through a casting step of pouring the molten alloy, prepared by fusing the source metals, into a mold. In the casting step, the molten metals are segregated depending on the cooling rate thereof; hence, the composition of the solid alloy can be nonuniform although the composition of the molten alloy is uniform. Therefore, the cooling rate thereof is preferably large. The mold is preferably made of a heat-conductive material such as copper and preferably has a shape suitable for dissipating heat. The mold may be cooled with water or another cooling medium as required.

The mold preferably has such a large bottom area relative to its thickness that the molten alloy can be solidified immediately after the molten alloy is poured into the mold.

The degree of segregation varies depending on the composition of the alloy. Therefore, the cooling rate necessary to prevent segregation is preferably determined in such a manner that samples are taken from the solidified alloy and then analyzed for composition by, for example, ICP atomic emission spectrometry.

The casting step is preferably performed in an inert atmosphere and more preferably an Ar atmosphere.

(Milling of Cast Ingot)

An ingot of the alloy prepared in the casting step may be milled into the alloy powder such that the alloy powder has a desired particle size and a desired particle size distribution. The alloy ingot can be milled by a dry process or a wet process using an organic solvent such as ethylene glycol, hexane, or acetone. The dry process is described in detail below.

The step of milling the alloy ingot may include a plurality of sub-steps such as a coarse milling sub-step, a medium milling sub-step, and a fine milling sub-step. In this case the same apparatus may be used in all the sub-steps or different apparatuses may be used in the sub-steps.

In the coarse milling sub-step, the alloy ingot is milled into coarse particles with a diameter of about 1 cm and the following milling apparatus may be used: a jaw crusher, a gyratory crusher, a crushing roll, or an impact crusher. In the medium milling sub-step, the coarse particles are milled into medium particles with a diameter of about 1 mm and the following milling apparatus may be used: a cone crusher, a crushing roll, a hammer mill, or a disc mill. In the fine milling sub-step, the following milling apparatus may be used: a ball mill, a tube mill, a rod mill, a roller mill, a stamp mill, an edge runner, a vibration mill, or a jet mill.

In particular, the jet mill is preferably used in the fine milling sub-step in view of the prevention of impurity contamination. In order to use the jet mill, the alloy ingot needs to be milled into particles with a size of several millimeters (for example, 50 μm to 5 mm) in advance. In the jet mill, these particles are milled by making use of the expansion energy of a fluid discharged from a nozzle into the atmosphere; hence, the particle size can be controlled by varying the milling pressure and impurity contamination can be prevented. The milling pressure, which varies depending on apparatuses, is usually 0.01 MPa-2 MPa, preferably 0.05 MPa or more and less than 0.4 MPa and more preferably 0.1 MPa-0.3 MPa on a gauge basis.

The relationship between the material of each milling apparatus and the particles to be milled needs to be properly selected such that the particles can be prevented from being contaminated with impurities such as iron in each milling sub-step. For example, a particle contact zone is preferably lined with a ceramic material. The ceramic material is preferably alumina, tungsten carbide, zirconia, or the like.

In order to prevent the oxidation of the alloy powder, milling is preferably performed in an inert gas atmosphere. The content of oxygen in the inert gas atmosphere is preferably 10% or less and more preferably 5% or less. The lower limit of the oxygen content is usually about 10 ppm. Since the oxygen content is controlled to be within a specific range, oxide films are formed on the alloy particles during milling. This probably stabilizes the alloy particles. If the milling step is performed in an atmosphere with an oxygen content greater than 5%, a device for preventing the creation of dust is necessary because the dust can generate heat or burn during milling. The inert gas atmosphere is not particularly limited and may contain one or more of inert gases such as nitrogen, argon, and helium. In view of cost, nitrogen is preferable.

The alloy powder may be cooled during milling such that the temperature thereof is prevented from being increased.

(Classification of Alloy Powder)

The alloy powder obtained through the milling step is classified with a sieving machine including a screen such as a vibrating screen or shifter, an inertial classifier such as an air separator, a centrifugal separator such as a cyclone separator so as to have a desired weight-average median diameter $D_{50}$ and particle size distribution as described above.

The classifying step is preferably performed in an inert gas atmosphere. The content of oxygen in this inert gas atmosphere is preferably 10% or less and more preferably 5% or less. This inert gas atmosphere is not particularly limited and may contain one or more of inert gases such as nitrogen, argon, and helium. In view of cost, nitrogen is preferable.

[Production of Phosphor]

A method for producing the phosphor from the inorganic functional material precursor-use alloy powder of the first aspect is not particularly limited. Reaction conditions are set depending on the type of the phosphor, which may be made of an oxide, a sulfide, or a nitride. The nitridation of the alloy powder is exemplified below.

((Nitridation of Alloy))

The alloy powder is nitridated as described below.

The alloy powder to be nitridated is loaded in a crucible or loaded on a tray. The crucible or tray used herein may be made of boron nitride, silicon nitride, aluminum nitride, or tungsten and is preferably made of boron nitride because boron nitride is resistant to corrosion.

After the crucible or tray carrying the alloy powder is placed in a furnace in which the atmosphere is controllable, a nitrogen-containing gas is fed through the furnace such that the furnace is filled with the nitrogen-containing gas. The furnace may be evacuated and then fed with the nitrogen-containing gas as required.

Examples of the nitrogen-containing gas used for nitridation include gaseous nitrogen, $NH_3$, and a gas mixture of nitrogen and hydrogen. The concentration of oxygen in the furnace atmosphere affects the oxygen content of the phosphor to be produced. Since the oxygen content of the phosphor is extremely high, the phosphor does not emit bright light. The oxygen concentration of the nitridation atmosphere is preferably low and usually 1000 ppm or less. The oxygen concentration thereof is preferably 100 ppm or less and more preferably 10 ppm or less. The oxygen concentration thereof may be reduced as required in such a manner that an oxygen getter such as carbon or molybdenum is placed in a heating section of the furnace.

The alloy powder is nitridated in such a manner that the alloy powder is heated in such a state that the furnace is filled with the nitrogen-containing gas or the nitrogen-containing gas is being fed through the furnace. The pressure in the furnace may be slightly lower than, higher than, or equal to atmospheric pressure. In order to prevent oxygen in air from entering the furnace, the furnace pressure is preferably higher than atmospheric pressure. When the furnace pressure is lower than atmospheric pressure, a large amount of oxygen enters the furnace if the furnace is not hermetically sealed; hence, no phosphor having high performance can be obtained. The pressure of the nitrogen-containing gas is preferably 0.2 MPa or more and more preferably ranges from 10 MPa to 200 MPa on a gauge basis.

The alloy powder is usually heated at a temperature of not lower than 800° C. particularly not lower than 1000° C. especially not lower than 1200° C. and not higher than 2200° C. particularly not higher than 2100° C. especially not higher than 2000° C. When the heating temperature of the alloy powder is lower than 800° C., the time taken to nitridate the alloy powder is extremely long. This is not preferable. In contrast, the heating temperature thereof is higher than 2200° C., a nitride obtained is vaporized or decomposed and therefore the composition of the nitride phosphor obtained is shifted; hence, the phosphor cannot have high performance and the reproducibility of the phosphor may be low.

The heating time (the retention time at the maximum temperature) during nitridation may be equal to the time required for the reaction between the alloy powder and nitrogen. The heating time is usually one minute or more, preferably, ten minutes or more, more preferably 30 minutes or more, and further more preferably 60 minutes or more. When the heating time is less than one minute, the nitridation of the alloy powder is not completed; hence, no phosphor having properties can be obtained. The upper limit of the heating time depends on production efficiency and is usually 24 hours or less.

The first aspect will now be further described in detail with reference to examples. The present invention is not limited to the examples within the scope of the present invention (Source Metals)

The source metals used to produce the alloy are high-purity materials having an impurity content of 0.01 mole percent or less. Sr, which is one of the source metals, is used in the form of agglomerates and the other source metals are used in the form of particles.

Example 1-1

Production of Mother Alloy

Source metals were weighed such that the ratio (molar ratio) of Al to Si was 1:1. The source metals were melted in an argon atmosphere using a graphite crucible and a high-frequency induction melting furnace. The molten metal mixture was poured into a mold and then solidified, whereby an alloy (a mother alloy) with an Al-to-Si ratio of 1:1 was obtained.
(Production of Phosphor Precursor)

The mother alloy and other source metals were weighed such that the ratio (molar ratio) of Eu to Sr to Ca to Al to Si was 0.008:0.792:0.2:1:1. After the furnace was evacuated to $5 \times 10^{-2}$ Pa, the evacuation of the furnace was stopped and argon was then introduced into the furnace until the pressure in the furnace reached a predetermined value. The mother alloy and Sr were melted in a calcia crucible in that order. Eu and Ca were added to the molten metals. After all these components were fused into a molten alloy and the molten alloy was observed to be agitated by an induction current, the molten alloy was poured into a mold from the crucible and then solidified.

The obtained alloy was analyzed for composition by ICP atomic emission spectrometry (inductively coupled plasma-atomic emission spectrometry, which may be hereinafter referred to as an ICP technique) in such a manner that the alloy was subjected to alkali fusion and then dissolved in dilute hydrochloric acid. The analysis showed that a center potion of the alloy had an Eu-to-Sr-to-Ca-to-Al-to-Si ratio of 0.009:0.782:0.212:1:0.986 and a surface portion thereof had an Eu-to-Sr-to-Ca-to-Al-to-Si ratio of 0.009:0.756:0.210:1:0.962. This confirmed that the alloy was uniform within the scope of analytical precision.

The obtained alloy had an X-ray powder diffraction pattern similar to that of $Sr(Si_{0.5}Al_{0.5})_2$ and therefore was determined to be an $AlB_2$-type intermetallic compound referred to as an alkaline-earth silicide.
(Milling of Alloy for Phosphor Precursor)

The obtained alloy was milled for ten minutes in a nitrogen atmosphere (an oxygen concentration of 4%) using an alumina mortar. Undersize particles of the alloy that passed through a sieve with 53 μm openings were separated from oversize particles other than the undersize particles. The oversize particles were further milled for ten minutes. This procedure was repeated, whereby a powder of the alloy was obtained. The particle size distribution and element analysis results of the alloy powder were shown in Table 1. The element analysis of the alloy powder was as follows: the oxygen content of the alloy powder was determined with an oxygen-nitrogen analyzer (manufactured by Leco Corporation), the carbon content thereof was determined with a carbon-sulfur analyzer (manufactured by Horiba Ltd.), and the iron content thereof was determined with an ICP chemical analyzer.

The particle size distribution and weight-average median diameter $D_{50}$ of the alloy powder were determined from a weight-based particle size distribution that was obtained in such a manner that in a 25° C. atmosphere with a humidity of 70%, a phosphor was dispersed in ethylene glycol, the dispersion was characterized with a laser diffraction particle size distribution analyzer (LA-300, manufactured by Horiba Ltd.) within the particle size range from 0.1 μm to 600 μm. The particle size corresponding to an integrated value of 50% was defined as a weight-average median diameter $D_{50}$. QD was calculated from the equation $QD=(D_{75}-D_{25})/(D_{75}+D_{25})$, wherein $D_{25}$ was the particle size corresponding to an integrated value of 25% and $D_{75}$ was the particle size corresponding to an integrated value of 75%.

Reference Example 1-1

Into a boron nitride crucible (an inner diameter of 55 mm), 10 g of the alloy powder prepared in Example 1-1 was placed. The boron nitride crucible was set in a hot isostatic press (HIP). The press was evacuated to $5 \times 10^{-1}$ Pa, heated to 300° C., and then further evacuated at 300° C. for one hour. Nitrogen was introduced into the press such that the pressure in the press was increased to 1 MPa. After the press was cooled, the pressure in the press was reduced to 0.1 MPa. Nitrogen was introduced into the press again such that the pressure in the press was increased to 1 MPa. This procedure was repeated twice. Before the press was heated, nitrogen was introduced into the press such that the pressure in the press was increased to 50 MPa. The sample was heated to 1900° C. at a heating rate of about 600° C./hr. The pressure in the press was increased to 135 MPa at a rate of about 50 MPa/hr by the heating process. The pressure in the press was increased to 190 MPa. The sample was maintained at 1900° C. and 190 MPa for one hour, whereby a phosphor was obtained.

The characterization of the phosphor by X-ray powder diffraction showed the presence of an orthorhombic crystal isomorphic to $CaAlSiN_3$. Luminescent properties of the phosphor were measured with a fluorescence spectrophotometer by 465-nm excitation. The relative brightness of the phosphor was determined on the basis that the brightness of a phosphor prepared in Reference Example 1-2 described below was 100%. The analysis results were shown in Table 1.

Example 1-2

An alloy powder was prepared in substantially the same manner as that described in Example 1-1 except that an alumina mortar was used and the milling time was five minutes. The particle size distribution and element analysis results of the alloy powder were shown in Table 1. The alloy powder was nitridated in the same manner as that described in Reference Example 1-1, whereby a phosphor was obtained. Luminescent properties of the phosphor were measured. The measurement results were shown in Table 1.

Example 1-3

An alloy was prepared in the same manner as that described in Example 1-1 and then milled in a nitrogen atmosphere using an aluminum mortar, whereby a coarse powder with a particle size of about 1 mm was obtained. An alloy powder was prepared in such a manner that the coarse powder was milled in a nitrogen atmosphere (an oxygen content of 2%) using a supersonic jet mill (PJM-80SP, manufactured by Nippon Pneumatic manufacturing Co., Ltd.) under the following conditions: a milling pressure of 0.15 MPa and a feed rate of 0.8 kg/hr. The particle size distribution and element analysis results of the alloy powder were shown in Table 1. The alloy powder was nitridated in the same manner as that described in Example 1-1, whereby a phosphor was obtained. Luminescent properties of the phosphor were measured. The measurement results were shown in Table 1.

Example 1-4

An alloy powder was prepared in substantially the same manner as that described in Example 1-3 except that the milling pressure of the supersonic jet mill was 0.1 MPa. The particle size distribution and element analysis results of the alloy powder were shown in Table 1. The alloy powder was nitridated in the same manner as that described in Reference Example 1-1, whereby a phosphor was obtained. Luminescent properties of the phosphor were measured. The measurement results were shown in Table 1.

Comparative Example 1-1

An alloy powder was prepared in substantially the same manner as that described in Example 1-3 except that the milling pressure of the supersonic jet mill was 0.4 MPa and the feed rate was 0.7 kg/hr. The particle size distribution and element analysis results of the alloy powder were shown in Table 1. The alloy powder was nitridated in the same manner as that described in Reference Example 1-1, whereby a phosphor was obtained. Luminescent properties of the phosphor were measured. The measurement results were shown in Table 1.

Reference Example 1-2

$Eu_2O_3$, $Ca_3N_2$, AlN, and $Si_3N_4$ were weighed in an argon atmosphere such that the ratio of Eu to Ca to Al to Si was 0.008:0.992:1:1. These compounds were mixed together with a kneader. The mixture was placed into a boron nitride crucible, which was then set in an atmosphere furnace. The furnace was evacuated to $1 \times 10^{-2}$ Pa, the evacuation of the furnace was stopped, nitrogen was introduced into the furnace such that the pressure in the furnace was increased to 0.1 MPa, and the mixture was then heated at 1600° C. for five hours, whereby a target phosphor was obtained.

Luminescent properties of the phosphor were measured with a fluorescence spectrophotometer by 465-nm excitation. This showed that the light emitted from the phosphor had a wavelength of 648 nm.

Reference Example 1-3

An alloy powder was prepared in substantially the same manner as that described in Example 1-1 except that the milling time was five hours and no classification was performed. The particle size distribution and element analysis results of the alloy powder were shown in Table 1. The alloy powder was nitridated in the same manner as that described in Reference Example 1-1, whereby a black solid was obtained. The black solid emitted no light.

Reference Example 1-4

An alloy prepared in the same manner as that described in Example 1-1 was milled in the same manner as that described in Example 1-3, whereby a coarse powder was obtained. The coarse powder was milled in a nitrogen atmosphere using a mechanical mill made of stainless steel, whereby an alloy powder was obtained. The particle size distribution and element analysis results of the alloy powder were shown in Table 1. The alloy powder was nitridated in the same manner as that described in Reference Example 1-1, whereby a phosphor was obtained. Luminescent properties of the phosphor were measured. The measurement results were shown in Table 1.

TABLE 1

Particle size distribution and element analysis results of alloy powders

| | Weight-average median diameter $D_{50}$ (μm) | QD | 10 μm or less (%) (*1) | 45 μm or more (%) (*2) | Oxygen content (weight percent) | Carbon content (weight percent) | Iron content (ppm) | Luminescent properties of phosphors Brightness (%) | Emission peak wavelength (nm) |
|---|---|---|---|---|---|---|---|---|---|
| Example 1-1 | 27.2 | 0.50 | 17.6 | 23.7 | 0.2 | 0.03 or less | 100 or less | 172 | 629 |
| Example 1-2 | 31.2 | 0.40 | 10.0 | 27.7 | 0.2 | 0.03 or less | 100 or less | 170 | 626 |
| Example 1-3 | 14.2 | 0.38 | 28.6 | 2.9 | 0.3 | 0.03 or less | 100 or less | 188 | 627 |
| Example 1-4 | 20.6 | 0.50 | 18.7 | 19.2 | 0.3 | 0.03 or less | 100 or less | 184 | 626 |
| Comparative Example 1-1 | 4.0 | 0.30 | 96.9 | 0.0 | 0.3 | 0.03 or less | 100 or less | 113 | 627 |
| Reference Example 1-3 | 11.2 | 0.64 | 42.2 | 1.5 | 0.2 | 0.03 or less | 100 or less | No emission | — |
| Reference Example 1-4 | 21.6 | 0.36 | 9.4 | 5.0 | 0.3 | 0.03 or less | 618.0 | 79 | 628 |

(*1): The percentage of alloy particles with a size of 10 μm or less.
(*2): The percentage of alloy particles with a size of 45 μm or more.

As is clear from the above results, of the first aspect, a phosphor with high brightness can be produced.

Detailed Description of Second Aspect

The inventors have found that an object of a second aspect can be achieved in such a manner that an alloy containing two or more metal elements for forming a phosphor is heated in a nitrogen-containing atmosphere.

A method for producing the phosphor according to the second aspect includes a step of heating the alloy, which contains the two or more metal elements for forming the phosphor, in the nitrogen-containing atmosphere.

The alloy preferably has a median diameter $D_{50}$ of 100 μm or less.

The phosphor preferably contains a tetravalent metal element $M^4$ including Si and one or more metal elements other than Si.

The phosphor preferably contains an activating element $M^1$ and a divalent metal element $M^2$ in addition to the tetravalent metal element $M^4$.

In the phosphor, the divalent metal element $M^2$ is preferably an alkaline-earth metal.

The phosphor may further contain a trivalent metal element $M^3$.

The activating element $M^1$ is preferably at least one selected from the group consisting of Cr, Mn, Fe, Ce, Pr, Nd, Sm, Eu, Tb, Dy, Ho, Er, Tm, and Yb. The divalent metal element $M^2$ is preferably at least one selected from the group consisting of Mg, Ca, Sr, Ba, and Zn. The trivalent metal element $M^3$ is preferably at least one selected from the group consisting of Al, Ga, In, and Sc. The tetravalent metal element $M^4$ is preferably at least one selected from the group consisting of Si, Ge, Sn, Ti, Zr, and Hf.

In the phosphor, the activating element $M^1$ may be Eu and/or Ce.

Fifty mole percent or more of the divalent metal element $M^2$ may be Ca and/or Sr. Fifty mole percent or more of the trivalent metal element $M^3$ may be Al. Fifty mole percent or more of the tetravalent metal element $M^4$ may be Si.

The phosphor is preferably made of a nitride or an oxynitride.

In the phosphor-producing method according to the second aspect, the phosphor obtained by heating the alloy in the nitrogen-containing atmosphere may be reheated.

The second aspect provides a phosphor-containing composition containing the phosphor, which is produced by the phosphor-producing method according to the second aspect, and a liquid medium.

The second aspect further provides a light-emitting device including an excitation light source and a phosphorescent body for converting the wavelength of a portion of the light emitted from the excitation light source. The phosphorescent body contains the phosphor, which is produced by the phosphor-producing method according to the second aspect.

The second aspect provides a display including the light-emitting device.

The second aspect provides a lighting system including the light-emitting device.

According to the phosphor-producing method of the second aspect, the phosphor, which emits bright light and is prevented from deteriorating with time, can be produced at low cost.

The phosphor-producing method according to the second aspect is useful in producing a nitride-, oxynitride-, oxide-, sulfide-, oxysulfide-, or carbide-based phosphor.

The phosphor, which is produced by the phosphor-producing method according to the second aspect, emits brighter Light as compared to conventional sialon phosphors. In particular, when the activating element is Eu, the phosphor emits bright orange or red light with a long wavelength. Even if the phosphor is exposed to an excitation source for a long time, the phosphor is hardly reduced in brightness. The phosphor is suitable for use in fluorescent tubes, vacuum fluorescent displays (VFD), field emission displays (FED), plasma display panels (PDP), cathode ray tubes (CRT), white light-emitting diodes (LED), and the like.

The second aspect will now be further described in detail. The second aspect is not limited to descriptions below. Various modifications may be made within the scope of the present invention.

In the description of the second aspect, a numerical range expressed with the symbol "-" includes values which are each placed on the left or right of the symbol "-" and which each corresponds to a lower limit or an upper limit.

[Composition of Phosphor]

The composition of the phosphor produced according to the second aspect is not particularly limited and is as exemplified below.

The phosphor produced according to the second aspect (hereinafter referred to as the phosphor of the present invention) preferably contains the activating element $M^1$, the tetravalent metal element $M^4$ including Si, and one or more metal elements other than Si. In particular, the phosphor of the present invention contains the activating element $M^1$, the divalent metal element $M^2$, and the tetravalent metal element $M^4$. An example of the phosphor of the present invention is $Sr_2Si_5N_8$:Eu, Ce or the like. The divalent metal element $M^2$ is preferably an alkaline-earth metal.

The phosphor according to the second aspect may contain the activating element $M^1$, the divalent metal element $M^2$, the trivalent metal element $M^3$, and the tetravalent metal element $M^4$ and is preferably made of a nitride or oxynitride represented by the following formula:

$$M^1{}_a M^2{}_b M^3{}_c M^4{}_d N_e O_f \qquad (2)$$

wherein a, b, c, d, e, and f satisfy the following formulas:

$$0.00001 \leq a \leq 0.15,$$

$$a+b=1,$$

$$0.5 \leq c \leq 1.5,$$

$$0.5 \leq d \leq 1.5,$$

$$2.5 \leq e \leq 3.5, \text{ and}$$

$$0 \leq f \leq 0.5.$$

The activating element $M^1$ may be one of elements forming various luminescent ions which may be present in a crystal matrix for forming the phosphor made of the nitride or the oxynitride. The activating element $M^1$ is preferably at least one selected from the group consisting of Cr, Mn, Fe, Ce, Pr, Nd, Sm, Eu, Tb, Dy, Ho, Er, Tm, and Yb because the phosphor has high luminescent properties. In particular, the activating element $M^1$ is preferably one or more of Mn, Ce, Pr, and Eu and more preferably Ce and/or Eu because phosphors emitting bright red light can be obtained. In order to enhance the brightness and in order to achieve various functions such as a light-storing function, the activating element $M^1$ may be used in combination with one or more co-activating elements other than Ce and/or Eu.

Various metal elements, such as divalent, trivalent, and tetravalent metal elements, other than the activating element $M^1$ can be used. The divalent metal element $M^2$ is preferably at least one selected from the group consisting of Mg, Ca, Sr, Ba, and Zn. The trivalent metal element $M^3$ is preferably at least one selected from the group consisting of Al, Ga, In, and Sc. The tetravalent metal element $M^4$ is preferably at least one selected from the group consisting of Si, Ge, Sn, Ti, Zr, and Hf. This is because the phosphor has high luminescent properties.

The composition is preferably adjusted such that 50 mole percent or more of the divalent metal element $M^2$ is Ca and/or Sr, because the phosphor has high luminescent properties. Eighty mole percent or more of the divalent metal element $M^2$ is more preferably Ca and/or Sr. Ninety mole percent or more of the divalent metal element $M^2$ is further more preferably Ca and/or Sr. The whole of the divalent metal element $M^2$ is most preferably Ca and/or Sr.

The composition is preferably adjusted such that 50 mole percent or more of the trivalent metal element $M^3$ is Al, because the phosphor has high luminescent properties. Eighty mole percent or more of the trivalent metal element $M^3$ is more preferably Al. Ninety mole percent or more of the trivalent metal element $M^3$ is further more preferably Al. The whole of the trivalent metal element $M^3$ is most preferably Al.

The composition is preferably adjusted such that 50 mole percent or more of the tetravalent metal element $M^4$ is Si, because the phosphor has high luminescent properties. Eighty mole percent or more of the tetravalent metal element $M^4$ is more preferably Si. Ninety mole percent or more of the tetravalent metal element $M^4$ is further more preferably Si. The whole of the tetravalent metal element $M^4$ is most preferably Si.

It is particularly preferable that 50 mole percent or more of the divalent metal element $M^2$ be Ca and/or Sr, 50 mole percent or more of the trivalent metal element $M^3$ be Al, and 50 mole percent or more of the tetravalent metal element $M^4$ be Si, because the phosphor has high luminescent properties.

The reasons why a to f in Formula (2) are preferably within the above ranges are as described below.

When a is less than 0.00001, sufficient emission intensity cannot be achieved. When a is greater than 0.15, concentration quenching is likely to be high and emission intensity is likely to be low. Therefore, raw materials are mixed such that a satisfies the inequality $0.00001 \leq a \leq 0.15$. Because of the same reason as described above, a preferably satisfies the inequality $0.0001 \leq a \leq 0.1$, more preferably $0.001 \leq a \leq 0.05$, further more preferably $0.002 \leq a \leq 0.04$, and most preferably $0.004 \leq a \leq 0.02$.

In the host crystal of the phosphor, atoms of the activating element $M^1$ substitute for atoms of the divalent metal element $M^2$; hence, the composition of a mixture of the raw materials is adjusted such that the sum of a and b is equal to one.

When c is less than 0.5 or greater than 1.5, a heterogeneous phase is formed during production and therefore the yield of the phosphor is likely to be low. Thus, the raw materials are mixed together such that c satisfies the inequality $0.5 \leq c \leq 1.5$. In view of the emission intensity of the phosphor, c preferably satisfies the inequality $0.5 \leq c \leq 1.5$, more preferably $0.6 \leq c \leq 1.4$, and most preferably $0.8 \leq c \leq 1.2$.

When d is less than 0.5 or greater than 1.5, a heterogeneous phase is formed during production and therefore the yield of the phosphor is likely to be low. Thus, the raw materials are mixed together such that d satisfies the inequality $0.5 \leq d \leq 1.5$. In view of the emission intensity of the phosphor, d preferably satisfies the inequality $0.5 \leq d \leq 1.5$, more preferably $0.6 \leq d \leq 1.4$, and most preferably $0.8 \leq d \leq 1.2$.

Herein, e is a coefficient representing the content of nitrogen and satisfies the equation $e=2/3+c+(4/3)d$. From this equation and the inequalities $0.5 \leq c \leq 1.5$ and $0.5 \leq d \leq 1.5$, the range of e is given by the inequality $1.84 \leq e \leq 4.17$. In the composition of the phosphor, which is represented by Formula (2), when e, which represents the content of nitrogen, is less than 2.5, the yield of the phosphor is likely to be low. When e exceeds 3.5, the yield of the phosphor is also likely to be low. Hence, e usually satisfies the inequality $2.5 \leq e \leq 3.5$.

Oxygen in the phosphor, which is represented by Formula (2), is an impurity contained in source metals or probably contaminates the source metals in production steps such as a milling step and a nitridation step. Herein, f represents the percentage of oxygen in the phosphor, is within such a range that reductions in luminescent properties of the phosphor are acceptable, and preferably satisfies the inequality $0 \leq f \leq 0.5$.

The phosphor is represented by Formula (2) as described above. Alternatively, the phosphor may be represented by the following formula:

$$M^{1'}{}_{a'}Sr_{b'}Ca_{c'}M^{2'}{}_{d'}Al_{e'}Si_{f'}N_{g'} \quad (3)$$

wherein a', b', c', d', e', f', and g' satisfy the following formulas:

$0.00001 \leq a' \leq 0.15,$ $0.1 \leq b' \leq 0.99999,$ $0 \leq c' \leq 1,$ $0 \leq d' \leq 1,$ $a'+b'+c'+d'=1,$ $0.5 \leq e' \leq 1.5,$ $0.5 \leq f' \leq 1.5,$ and $0.8 \times (2/3+e'+4/3 \times f') \leq g' \leq 1.2 \times (2/3+e'+4/3 \times f')).$ $M^{1'}$ as well as $M^1$ in Formula (2) represents an activating element selected from the group consisting of Cr, Mn, Fe, Ce, Pr, Nd, Sm, Eu, Tb, Dy, Ho, Er, Tm, and Yb. The activating element $M^{1'}$ is preferably one or more of Mn, Ce, Pr, and Eu and more preferably Eu and/or Ce.

$M^{2'}$ represents Mg or Ba and preferably Mg. When the phosphor contains Mg, the phosphor emits light with a long wavelength.

The range of a' is usually represented by the inequality $0.00001 \leq a' \leq 0.15$, preferably $0.001 \leq a' \leq 0.05$, more preferably $0.002 \leq a' \leq 0.01$.

The range of b' is usually represented by the inequality $0.1 \leq b' \leq 0.99999$, preferably $0.6 \leq b' \leq 0.99999$, more preferably $0.7 \leq b' \leq 0.99999$.

The range of c' is usually represented by the inequality $0 \leq c' \leq 1$, preferably $0 \leq c' \leq 0.5$, more preferably $0 \leq c' \leq 0.3$.

The range of d' is usually represented by the inequality $0 \leq d' \leq 1$, preferably $0 \leq d' \leq 0.5$, more preferably $0 \leq d' \leq 0.2$.

The relationship between a', b', c', and d' usually satisfies the following equation:

$$a'+b'+c'+d'=1$$

The range of e' is usually represented by the inequality $0.5 \leq e' \leq 1.5$, preferably $0.8 \leq e' \leq 1.2$, more preferably $0.9 \leq e' \leq 1.1$.

The range of f' is usually represented by the inequality $0.5 \leq f' \leq 1.5$, preferably $0.8 \leq f' \leq 1.2$, more preferably $0.9 \leq f' \leq 1.1$.

The range of g' is usually represented by the inequality $0.8 \times (2/3+e'+4/3 \times f') \leq g' \leq 1.2 \times (2/3+e'+4/3 \times f')$, preferably $0.9 \times (2/3+e'+4/3 \times f') \leq g' \leq 1.1 \times (2/3+e'+4/3 \times f')$, and more preferably $2.5 \leq g' \leq 3.5$.

A phosphor in which the range of b' in Formula (3) is represented by the inequality $0.6 \leq f' \leq 0.99999$ and d' is equal to 0, that is, a phosphor in which the content of Sr is large is hereinafter referred to as an SCASN phosphor.

Oxygen contained in the phosphor of the present invention is an impurity contained in source metals or probably contaminates the source metals in production steps such as a milling step and a nitridation step.

The content of oxygen in the phosphor is within such a range reductions in luminescent properties of the phosphor are acceptable. The oxygen content is usually five weight percent or less, preferably two weight percent or less, and more preferably one weight percent or less.

Examples of the phosphor include (Sr, Ca, Mg)AlSiN$_3$:Eu, (Sr, Ca, Mg)AlSiN$_3$:Ce, (Sr, Ca)$_2$Si$_5$N$_8$:Eu, and (Sr, Ca)$_2$Si$_5$N$_8$:Ce.

[Method for Producing Phosphor]

In order to produce the phosphor of the present invention, the source metals or alloys thereof are weighed such that a composition represented by, for example, the following formula is obtained; the composition is melted into an alloy for a phosphor precursor; the alloy is milled into a powder; and the alloy powder is then heated in a nitrogen-containing atmosphere so as to be nitridated:

$$M^1_a M^2_b M^3_c M^4_d \quad (1)$$

wherein $M^1$, $M^2$, $M^3$, $M^4$, a, b, c, and d are the same as the above. When the alloy contains Si and the alkaline-earth metal, it is preferable that metallic Si and/or a Si-containing alloy, which has a high melting point (a high boiling point), be primarily melted and the alkaline-earth metal, which has a low melting point (a low boiling point), be then melted. For a metal element that is vaporized during melting or is consumed due to the reaction with the material of a crucible, an excessive amount of the metal element may be added to the alloy as required.

(Purity of Source Metals)

The purity of the source metals, which are used to produce the alloy of this aspect, is the same as that described in the first aspect. The description made in the first aspect is applied to the purity thereof.

(Form of Source Metals)

The form of the source metals is the same as that described in the first aspect. The description made in the first aspect is applied to the form thereof.

(Fusion of Source Metals)

The fusion of the source metals is the same as that described in the first aspect. The description made in the first aspect is applied to the fusion thereof.

(Casting of Molten Alloy)

The casting of the molten alloy is the same as that described in the first aspect. The description made in the first aspect is applied to the casting thereof.

(Milling of Cast Ingot)

The milling of an ingot of the alloy is the same as that described in the first aspect. The description made in the first aspect is applied to the milling thereof.

(Classification of Alloy Powder)

A powder of the alloy is obtained through a milling step and is then classified with a sieving machine including a screen such as a vibrating screen or shifter, an inertial classifier such as an air separator, a centrifugal separator such as a cyclone separator so as to have a desired weight-average median diameter $D_{50}$ and particle size distribution. The classifying step is preferably performed in an inert gas atmosphere. The content of oxygen in the inert gas atmosphere is preferably 10% or less and more preferably 5% or less. The type of an inert gas in the inert gas atmosphere is not particularly limited and may contain one or more of inert gases such as nitrogen, argon, and helium. In view of cost, nitrogen is preferable.

The particle size of the alloy powder needs to be adjusted Depending on the activity of the metal elements contained in the alloy before the alloy powder is heat-treated; hence, the weight-average median diameter $D_{50}$ of the unheated alloy powder is usually not larger than 100 μm particularly not larger than 80 μm especially not larger than 60 μm and not smaller than 0.1 μm particularly not smaller than 0.5 μm especially not smaller than 1 μm. When the alloy contains Sr, the weight-average median diameter $D_{50}$ thereof is preferably usually 5 μm or more, preferably 8 μm or more, and more preferably 10 μm or more, and further more preferably 13 μm or more because Sr has high reactivity with an atmosphere gas. When the weight-average median diameter $D_{50}$ thereof is less than the above range, the heat generation rate of the alloy powder subjected to a reaction such as nitridation is large and therefore it can be difficult to control the reaction. In contrast, when the weight-average median diameter $D_{50}$ thereof is greater than the above range, inner portions of the alloy particles may be insufficiently nitridated.

(Production of Phosphor)

A method for producing the phosphor from the alloy is not particularly limited. Reaction conditions are set depending on the type of the phosphor, which may be made of an oxide, a nitride, an oxynitride, a sulfide, an oxysulfide, or a carbide. The nitridation of the alloy is exemplified below.

((Nitridation of Alloy))

The nitridation of the alloy is the same as that described in the first aspect. The description made in the first aspect is applied to the nitridation thereof.

The phosphor, which may be made of a nitride or an oxynitride, can be obtained by nitrating the alloy. The obtained phosphor may be reheated such that particles of the phosphor are grown, because high luminescent properties can be achieved.

The reheating temperature of the phosphor is preferably 1200° C.-2200° C. When the reheating temperature thereof is lower than 1200° C., an advantage in growing the phosphor particles is small. In contrast, when the reheating temperature thereof is higher than 2200° C., not only heating energy is wasted but also the phosphor is decomposed; hence, no desired phosphor can be produced unless the pressure of nitrogen, which is an atmosphere gas, is greatly increased. Therefore, the reheating temperature thereof is preferably not lower than 1300° C. and not higher than 2100° C., more preferably not lower than 1400° C. and not higher than 2000° C., and most preferably not lower than 1500° C. and not higher than 1900° C.

The phosphor is preferably reheated in an atmosphere, such as an inert gas or a reducing atmosphere, containing nitrogen. The concentration of oxygen in the atmosphere is usually 1000 ppm or less, preferably 100 ppm or less, and more preferably 10 ppm or less. If the phosphor is reheated in air or an oxygen-containing atmosphere having an oxygen concentration of higher than 1000 ppm, the phosphor is oxidized and therefore do not have desired properties. The atmosphere preferably contains a trace amount of oxygen, for example, 0.1 ppm-10 ppm of oxygen, because the phosphor can be synthesized at relative low temperature.

The phosphor is preferably reheated at a pressure higher than atmospheric pressure because the contamination of oxygen in air can be prevented. If a furnace used for reheating and used in a heating step for nitridation is insufficiently sealed and the pressure in the furnace is lower than atmosphere pressure, the phosphor is contaminated with a large amount of oxygen and therefore cannot have high performance.

The reheating time (the retention time at the maximum temperature) of the phosphor is usually one minute or more and 100 hours or less. When the retention time is extremely short, the phosphor particles cannot be sufficiently grown. In contrast, when the retention time is extremely long, not only heating energy is wasted but also nitrogen is removed from a surface portion of the phosphor; hence, luminescent properties of the phosphor are likely to be deteriorated. Therefore, the retention time is preferably not shorter than ten minutes more preferably not shorter than 30 and not longer than 24 hours and more preferably not longer than 12 hours.

[Properties of Phosphor]

The phosphor, which is produced by the method of this aspect, has properties below.

Emission Spectrum

The SCASN phosphor, which is produced by the method of this aspect and is activated with Eu, preferably has a characteristic emission spectrum below when the SCASN phosphor is excited with light having a wavelength of 465 nm.

The emission spectrum of the phosphor (hereinafter referred to as the phosphor of the present invention), which is produced by the method of this aspect, usually has a peak wavelength $\lambda p$ of not shorter than 590 nm particularly not shorter than 600 nm and not longer than 650 nm particularly not longer than 640 nm. When the peak wavelength $\lambda p$ is extremely small, the light emitted from the phosphor is likely to be yellow. In contrast, when the peak wavelength $\lambda p$ is extremely large, the light emitted therefrom is likely to be dark red. That is, it is not preferable that the peak wavelength $\lambda p$ be extremely small or large, because the light emitted therefrom is not orange or red.

The phosphor of this aspect usually has an emission peak with a full width at half maximum (hereinafter referred to as FWHM) greater than 50 nm particularly greater than 70 nm especially greater than 75 nm, and less than 120 nm particularly less than 100 nm especially less than 90 nm. When the FWHM is extremely small, the emission intensity of the phosphor may be low. In contrast, when the FWHM is extremely large, the color purity of the light emitted from the phosphor may be low. Both cases are not preferable.

For example, a GaN-based light-emitting diode can be used to excite the phosphor of this aspect with light having a wavelength of 465 nm. For example, a spectrofluorometer manufactured by JASCO Corporation can be used to measure the emission spectrum and emission peak wavelength of the phosphor of the present invention and used to calculate the relative intensity and full width at half maximum of the emission peak.

Weight-Average Median Diameter $D_{50}$

The phosphor of this aspect usually has a weight-average median diameter $D_{50}$ of not smaller than 3 μm particularly not smaller than 5 μm and not larger than 30 μm particularly not larger than 20 μm. When the weight-average median diameter $D_{50}$ of the phosphor is extremely small, the brightness of the phosphor is low and the phosphor particles are likely to agglomerate. This is not preferable. In contrast, when the weight-average median diameter $D_{50}$ of the phosphor is extremely large, a coating of the phosphor is likely to be nonuniform or a dispenser is likely to be blocked. This is not preferable.

The weight-average median diameter $D_{50}$ of the phosphor of this aspect can be measured with, for example, laser diffraction-scattering particle size distribution analyzer.

Other Properties

The phosphor of this aspect preferably has high internal quantum efficiency. The internal quantum efficiency thereof is usually 0.5 or more, preferably 0.6 or more, and more preferably 0.7 or more. When the internal quantum efficiency is low, the luminous efficiency is likely to be low. This is not preferable.

The phosphor of this aspect preferably has high absorption efficiency. The absorption efficiency thereof is usually 0.5 or more, preferably 0.6 or more, and more preferably 0.7 or more. When the absorption efficiency is low, the luminous efficiency is likely to be low. This is not preferable.

[Uses of Phosphor]

The phosphor of this aspect has advantages such as high brightness and color rendering properties and therefore is suitable for various light-emitting devices. When the phosphor of the present invention is an orange or red phosphor, a white light-emitting device with high color rendering properties can be achieved in such a manner that the phosphor of the present invention is combined with a green phosphor, a blue phosphor, and the like. The light-emitting device can be used as a lighting system or a light-emitting section (in particular, a backlight for liquid crystal devices) of a display.

[Phosphor-Containing Composition]

When the phosphor of this aspect is used for light-emitting devices, the phosphor of this aspect is preferably in the form of a dispersion prepared by dispersing the phosphor of this aspect in a liquid medium. The dispersion, which is prepared by dispersing the phosphor of this aspect in the liquid medium, is hereinafter referred to as a phosphor-containing composition of this aspect.

The liquid medium, which is used to prepared the phosphor-containing composition of this aspect, can be selected depending on its uses and may be any one that is liquid under desired conditions, that is suitable for dispersing the phosphor of this aspect, and that does not cause any undesired reaction. Examples of the liquid medium include uncured thermosetting and photocurable resins such as addition-curable silicones, condensation-curable silicones, modified silicones, and epoxy resins. Alternatively, the following solution can be used: a solution prepared by hydrolytically polymerizing a solution containing an inorganic material such as a ceramic precursor polymer or a metal alkoxide. These liquid media can be used alone or in combination.

The amount of the liquid medium used may be appropriately adjusted depending on its uses and is usually not less than 3 weight % preferably not less than 5 weight % and not more than 30 weight % preferably not more than 15 weight % of the phosphor of the present invention.

The phosphor-containing composition may any other components depending on its uses in addition to the phosphor of the present invention and the liquid medium. Examples of such other components include diffusing agents, thickening agents, extenders, and buffers. In particular, a fine silica powder such as aerogel, alumina, or the like can be used.

[Light-Emitting Device]

A light-emitting device according to this aspect will now be described. The light-emitting device of this aspect includes a first illuminant serving as an excitation light source and a second illuminant that emits visible light when the second illuminant is irradiated with the light emitted from the First illuminant.

First Illuminant

The first illuminant emits light for exciting the second illuminant described below. The wavelength of the light emitted from the first illuminant is not particularly limited and may overlap with the wavelength of the light emitted from the second illuminant. Various illuminants emitting light with a wide range of wavelengths can be used. In usual, an illuminant emitting light with a near ultraviolet to blue range of wavelengths is used. In particular, the following illuminant is used: an illuminant that usually emits light with a peak wavelength of not smaller than 300 nm particularly not smaller than 330 nm and not larger than 500 nm particularly not larger than 480 nm. In general, the first illuminant is a semiconductor light-emitting element. In particular, the first illuminant is a light-emitting diode (hereinafter referred to as an LED) or a semiconductor laser diode (hereinafter referred to as an LD).

The first illuminant is particularly preferably a GaN-based LED or LD made of a GaN compound semiconductor. This is because the GaN-based LED or LD has extremely higher emission output and/or external quantum efficiency as compared to SiC-based LEDs emitting light with this range of wavelengths and therefore a combination of the GaN-based LED or LD can emit very bright light with low electric power. For a current load of, for example, 20 mA, the GaN-based LED or LD has emission intensity that is 100 times or more greater than that of the SiC-based LEDs. The GaN-based LED or LD preferably includes an $Al_xGa_yN$ light-emitting layer, a GaN light-emitting layer, or an $In_xGa_yN$ light-emitting layer. The GaN-based LED particularly preferably includes the $In_xGa_yN$ light-emitting layer because the $In_x$-$Ga_yN$ light-emitting Layer has very high emission intensity. The GaN-based LD particularly preferably includes an $In_x$-$Ga_yN$ or GaN light-emitting layer with a multi-quantum well structure because such an $In_xGa_yN$ or GaN light-emitting layer has very high emission intensity.

In the above light-emitting layers, the sum of x and y is usually 0.8-1.2. In the GaN-based LED, the light-emitting layers are preferably undoped or doped with Zn or Si because luminescent properties of the light-emitting layers can be readily adjusted.

The GaN-based LED principally includes the light-emitting layers, a p layer, an n layer, electrodes, and a substrate. The GaN-based LED preferably has a hetero-structure in which the light-emitting layers are sandwiched between $Al_x$-$Ga_yN$, GaN, or $In_xGa_yN$ layers each of which is an n- or p-type, because the GaN-based LED has high emission efficiency. The GaN-based LED more preferably has a multi-quantum well structure because the GaN-based LED has higher emission efficiency.

Second Illuminant

The second illuminant of the light-emitting device of this aspect emits visible light when the second illuminant is irradiated with the light emitted from the first illuminant. The second illuminant contains a first phosphor (an orange or red phosphor) described below. The second illuminant further contains a second phosphor (a green phosphor, a blue phosphor, or another phosphor) described below depending on its uses.

The composition of each phosphor is not particularly limited. The crystal matrix of the phosphor is a metal oxide such as $Y_2O_3$ or $Zn_2SiO_4$; a metal nitride such as $Sr_2Si_5N_8$; a phosphate such as $Ca_5(PO_4)_3Cl$; or a sulfide such as ZnS, SrS, or CaS, the metal oxide, the metal nitride, the phosphate or the sulfide being doped with ions of an activating or co-activating element such as an alkaline-earth metal represented by Ce, Pr, Nd, Pm, Sm, Eu, Tb, Dy, Ho, Er, Tin, or Yb or a metal represented by Ag, Cu, Au, Al, Mn, or Sb.

Preferable examples of the crystal matrix include sulfides such as (Zn, Cd)S, $SrGa_2S_4$, SrS, and ZnS; oxysulfides such as $Y_2O_2S$; aluminates such as (Y, $Gd)_3Al_5O_{12}$, $YAlO_3$, $BaMgAl_{10}O_{17}$, (Ba, Sr) (Mg, $Mn)Al_{10}O_{17}$, (Ba, Sr, Ca) (Mg, Zn, $Mn)Al_{10}O_{17}$, $BaAl_{12}O_{19}$, $CeMgAl_{11}O_{19}$, (Ba, Sr, $Mg)O.Al_2O_3$, $BaAl_2Si_2O_8$, $SrAl_2O_4$, $Sr_4Al_{14}O_{25}$, and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and (Y, $Gd)BO_3$; halophosphates such as $Ca_{10}(PO_4)_6(F, Cl)_2$ and (Sr, Ca, Ba, $Mg)_{10}(PO_4)_6Cl_2$; and phosphates such as $Sr_2P_2O_7$ and (La, $Ce)PO_4$.

An element of the crystal matrix and the activating or co-activating element may be replaced with a homologous element without depending on the composition of the phosphor. Any obtained phosphor that absorbs near-ultraviolet to visible light to emit visible light can be used.

Examples of the phosphor are as described below. These examples are for illustrative purposes only. The phosphor used herein is not limited to these examples. In these examples, phosphors having partly different structures are shown in an abbreviated form. For example, $Y_2SiO_5:Ce^{3+}$, $Y_2SiO_5:Tb^{3+}$, and $Y_2SiO_5:Ce^{3+},Tb^{3+}$ are collectively referred to as $Y_2SiO_5:Ce^{3+},Tb^{3+}$ and $La_2O_2S:Eu, Y_2O_2S:Eu$, and (La, $Y)_2O_2S:Eu$ are collectively referred to as (La, $Y)_2O_2S:Eu$. Abbreviated portions are punctuated.

<First Phosphor (Orange or Red Phosphor)>

The second illuminant of the light-emitting device of this aspect contains an orange or red phosphor (hereinafter referred to as a first phosphor) that is the same as the phosphor of the present invention. The phosphor of the present invention may be used alone or in combination with another phosphor. Furthermore, one or more of orange or red phosphors other than the phosphor of the present invention may be used in combination with the first phosphor.

A red fluorescent light-emitting phosphor (hereinafter referred to as a red phosphor) usually emits fluorescent light with a wavelength of 570 nm-700 nm and preferably 580 nm-680 nm.

Examples of the orange or red phosphors other than the phosphor of the present invention include europium-activated alkaline-earth silicon nitride phosphors which contain fractured particles having, for example, red fracture surfaces, which emit red light, and which are represented by the formula (Mg, Ca, Sr, $Ba)_2Si_5N_8:Eu$ and europium-activated rare-earth oxychalcogenide phosphors which contain epitaxially grown particles having substantially a spherical shape, which emit red light, and which are represented by the formula (Y, La, Gd, $Lu)_2O_2S:Eu$.

In this embodiment, the following phosphors can be used: a phosphor containing an oxynitride and/or oxysulfide containing at least one selected from the group consisting of Ti, Zr, Hf, Nb, Ta, W and Mo and a phosphor containing an oxynitride having an alpha-sialon structure in which an Al element is partially or entirely replaced with a Ga element. These phosphors are disclosed in Japanese Unexamined Patent Application Publication No. 2004-300247.

Examples of the red phosphor include Eu-activated oxysulfide phosphors such as (La, $Y)_2O_2S:Eu$; Eu-activated oxide phosphors such as Y(V, $P)O_4:Eu$ and $Y_2O_3:Eu$; Eu- and Mn-activated silicate phosphors such as (Ba, Sr, Ca, $Mg)_2SiO_4$:Eu,Mn and (Ba, $Mg)_2SiO_4$:Eu,Mn; Eu-activated sulfide phosphors such as (Ca, Sr)S:Eu; Eu-activated aluminate phosphors such as $YAlO_3$:Eu; Eu-activated silicate phosphors such as $LiY_9(SiO_4)_6O_2$:Eu, $Ca_2Y_8(SiO_4)_6O_2$:Eu, (Sr, Ba, $Ca)_3SiO_5$:Eu, $Sr_2BaSiO_5$:Eu; Ce-activated aluminate phosphors such as (Y, $Gd)_3Al_5O_{12}$:Ce and (Tb, $Gd)_3Al_5O_{12}$:Ce; Eu-activated nitride phosphors such as (Ca, Sr, $Ba)_2Si_5N_8$:Eu, (Mg, Ca, Sr, $Ba)SiN_2$:Eu, and (Mg, Ca, Sr, $Ba)AlSiN_3$:Eu; Ce-activated nitride phosphors such as (Mg, Ca, Sr, $Ba)AlSiN_3$:Ce; Eu- and Mn-activated halophosphate phosphors such as (Sr, Ca, Ba, $Mg)_{10}(PO_4)_6Cl_2$:Eu,Mn; Eu- and Mn-activated silicate phosphors such as $(Ba_3Mg)Si_2O_8$:Eu,Mn and (Ba, Sr, Ca, $Mg)_3(Zn, Mg)Si_2O_8$:Eu,Mn; Mn-activated germanate phosphors such as $3.5MgO.0.5MgF_2.GeO_2$:Mn; Eu-activated oxynitride phosphors such as Eu-activated α-sialons; Eu- and Bi-activated oxide phosphors such as (Gd, Y, Lu, $La)_2O_3$:Eu,Bi; Eu- and Bi-activated oxysulfide phosphors such as (Gd, Y, Lu, $La)_2O_2S$:Eu,Bi; Eu- and Bi-activated vanadate phosphors such as (Gd, Y, Lu, $La)VO_4$:Eu,Bi; Eu- and Ce-activated sulfide phosphors such as $SrY_2S_4$:Eu, Ce; Ce-activated sulfide phosphors such as $CaLa_2S_4$:Ce; Euand Mn-activated phosphate phosphors such as (Ba, Sr, Ca)$MgP_2O_7$:Eu,Mn and (Sr, Ca, Ba, Mg, Zn)$_2P_2O_7$:Eu,Mn; Eu- and Mo-activated tungstate phosphors such as (Y,Lu)$_2WO_6$:Eu,Mo; Eu- and Ce-activated nitride phosphors such as (Ba, Sr, Ca)$_xSi_yN_z$:Eu, Ce, wherein x, y, and z are integers greater than or equal to one; Eu- and Mn-activated halophosphate phosphors such as (Ca, Sr, Ba, Mg)$_{10}(PO_4)_6$(F, Cl, Br, OH):Eu,Mn; and Ce-activated silicate phosphors such as ((Y, Lu, Gd, Tb)$_{1-x}Sc_xCe_y)_2$(Ca, Mg)$_{1-r}$(Mg, Zn)$_{2+r}Si_{z-q}$Ge$_qO_{12+\delta}$.

Other examples of the red phosphor include red organic phosphors containing rare-earth ion complexes having ligands that are anions of β-diketonates, β-diketones, aromatic carboxylic acids, or Bronsted acids; perylene pigments (for example, dibenzo{[f,f']-4,4'7,7'-tetraphenyl}diindeno[1,2,3-cd:1',2',3'-lm] perylene); anthraquinone pigments; lake pigments; azo pigments; quinacridone pigments; anthracene pigments; isoindoline pigments; isoindolinone pigments; phthalocyanine pigments; triphenylmethane-based basic dyes; indanthrone pigments; indophenol pigments; cyanine pigments; and dioxadine pigments.

The following phosphor can be used as an orange phosphor: a red phosphor having a peak wavelength of not smaller than 580 nm particularly not smaller than 590 nm and not larger than 620 nm particularly not larger than 610 nm. Examples of the orange phosphor include (Sr, Ba)$_3SiO_5$:Eu and (Sr, Mg)$_3(PO_4)_2$:Sn$^{2+}$.

<Second Phosphor>

The second illuminant of the light-emitting device of this aspect may contain a phosphor (hereinafter referred to as a second phosphor) different in emission wavelength from the above first phosphor (the phosphor of the present invention) as required. The second phosphor may be used alone or in combination with two or more phosphors.

Examples of the second phosphor, which is used in combination with the first phosphor (the orange or red phosphor), include a phosphor (hereinafter referred to as a green phosphor) emitting green light and a phosphor (hereinafter referred to as a blue phosphor) emitting blue light.

{Green Phosphor}

The wavelength of the fluorescent light emitted from the phosphor (hereinafter referred to as a green phosphor) emitting green fluorescent light is usually not smaller than 490 nm particularly not smaller than 500 nm and not larger than 570 nm particularly not larger than 550 nm.

Examples of the green phosphor include europium-activated alkaline-earth silicon oxynitride phosphors which contain fractured particles having fracture surfaces, which emit green light, and which are represented by the formula (Mg, Ca, Sr, Ba)$Si_2O_2N_2$:Eu and europium-activated alkaline-earth silicate phosphors which contain fractured particles having fracture surfaces, which emit green light, and which are represented by the formula (Ba, Ca, Sr, Mg)$_2SiO_4$:Eu.

Other examples of the green phosphor include Eu-activated aluminate phosphors such as $Sr_4Al_{14}O_{25}$:Eu and (Ba, Sr, Ca)$Al_2O_4$:Eu; Eu-activated silicate phosphors such as (Sr, Ba)$Al_2Si_2O_8$:Eu, (Ba, Mg)$_2SiO_4$:Eu, (Ba, Sr, Ca, Mg)$_2SiO_4$:Eu, (Ba, Sr, Ca)$_2$(Mg, Zn)$Si_2O_7$:Eu, and (Ba, Ca, Sr, Mg)$_9$(Sc, Y, Lu, Gd)$_2$(Si, Ge)$_6O_{24}$:Eu; Ce- and Tb-activated silicate phosphors such as $Y_2SiO_5$:Ce,Tb; Eu-activated borate phosphate phosphors such as $Sr_2P_2O_7$—$Sr_2B_2O_5$:Eu; Eu-activated halosilicate phosphors such as $Sr_2Si_3O_8$-2$SrCl_2$:Eu; Mn-activated silicate phosphors such as $Zn_2SiO_4$:Mn; Tb-activated aluminate phosphors such as $CeMgAl_{11}O_{19}$:Tb and $Y_3Al_5O_{12}$:Tb; Tb-activated silicate phosphors such as $Ca_2Y_8(SiO_4)_6O_2$:Tb and $La_3Ga_5SiO_{14}$:Tb; Eu-, Tb-, or Sm-activated thiogallate phosphors such as (Sr, Ba, Ca)$Ga_2S_4$:Eu,Tb, Sm; Ce-activated aluminate phosphors such as $Y_3$(Al, Ga)$_5O_{12}$:Ce and (Y, Ga, Tb, La, Sm, Pr, Lu)$_3$(Al, Ga)$_5O_{12}$:Ce; Ce-activated silicate phosphors such as $Ca_3Sc_2Si_3O_{12}$:Ce and $Ca_8$(Sc, Mg, Na, Li)$_2Si_3O_{12}$:Ce; Ce-activated oxide phosphors such as $CaSc_2O_4$:Ce; Eu-activated β-sialons such as $SrSi_2O_2N_2$:Eu and (Sr, Ba, (a)$Si_2O_2N_2$:Eu; Eu-activated oxynitride phosphors such as Eu-activated α-sialons; Eu- and Mn-activated aluminate phosphors such as $BaMgAl_{10}O_{17}$:Eu,Mn; Eu-activated aluminate phosphors such as $SrAl_2O_4$:Eu; Tb-activated oxysulfide phosphors such as (La, Gd, Y)$_2O_2S$:Tb; Ce-, or Tb-activated phosphate phosphors such as $LaPO_4$:Ce,Tb; sulfide phosphors such as ZnS:Cu,Al and ZnS:Cu,Au,Al; Ce-, or Tb-activated borate phosphors such as (Y, Ga, Lu, Sc, La)$BO_3$:Ce,Tb and $Na_2Gd_2B_2O_7$:Ce,Tb, Eu or Mn-activated halosilicate phosphors such as $Ca_8Mg$(SiO$_4$)$_4Cl_2$:Eu,Mn; Eu-activated thioaluminate or thiogallate phosphors such as (Sr, Ca, Ba) (Al, Ga, In)$_2S_4$:Eu; and Eu- and Mn-activated halosilicate phosphors such as (Ca, Sr)$_8$(MG, Zn) (SiO$_4$)$_4Cl_2$:Eu,Mn.

Other examples of the green phosphor include pyridine-phthalimicle condensate derivatives; benzoxazinone-, quinazoline-, coumarin-, quinophthalone-, and naphthalic imide-based fluorescent dyes; and organic phosphors such as terbium complexes.

{Blue Phosphor}

The wavelength of the fluorescent light emitted from the phosphor (hereinafter referred to as a green phosphor) emitting green fluorescent light is usually not smaller than 420 nm particularly not smaller than 440 nm and not larger than 480 nm particularly not larger than 470 nm.

Examples of the green phosphor include europium-activated barium magnesium aluminate phosphors which contain epitaxially grown particles having substantially a hexagonal shape, which emit blue light, and which are represented by the formula $BaMgAl_{10}O_{17}$:Eu; europium-activated calcium halophosphate phosphors which contain epitaxially grown particles having substantially a spherical shape, which emit blue light, and which are represented by the formula (Ca, Sr, Ba)$_5(PO_4)_3Cl$:Eu; europium-activated alkaline-earth chloroborate phosphors which contain epitaxially grown particles having substantially a cubic shape, which emit blue light, and which are represented by the formula (Ca, Sr, Ba)$_2B_5O_9Cl$:Eu; and europium-activated alkaline-earth aluminate phosphors which contain fractured particles having fracture surfaces, which emit blue-green light, and which are represented by the formula (Sr, Ca, Ba)$Al_2O_4$:Eu or (Sr, Ca, Ba)$_4Al_{14}O_{25}$:Eu.

Other examples of the green phosphor include Sn-activated phosphate phosphors such as $Sr_2P_2O_7$:Sn; Eu-activated aluminate phosphors such as $Sr_4Al_{14}O_{25}$:Eu, $BaMgAl_{10}O_{17}$:Eu, and $BaAl_8O_{13}$:Eu; Ce-activated thiogallate phosphors such as $SrGa_2S_4$:Ce and $CaGa_2S_4$:Ce; Eu-activated aluminate phosphors such as (Ba, Sr, Ca)$MgAl_{10}O_{17}$:Eu and $BaMgAl_{10}O_{17}$:Eu,Tb,Sm; Eu- and Mn-activated aluminate phosphors such as (Ba, Sr, Ca)$MgAl_{10}O_{17}$:Eu,Mn; Eu-activated halophosphate phosphors such as (Sr, Ca, Ba, Mg)$_{10}(PO_4)_6Cl_2$:Eu and (Ba, Sr, Ca)$_5(PO_4)_3$(Cl, F, Br, OH):Eu,Mn, Sb; Eu-activated silicate phosphors such as $BaAl_2Si_2O_8$:Eu and (Sr, Ba)$_3MgSi_2O_8$:Eu; Eu-activated phosphate phosphors such as $Sr_2P_2O_7$:Eu; sulfide phosphors such as ZnS:Ag and ZnS:Ag,Al; Ce-activated silicate phosphors such as $Y_2SiO_5$:Ce; tungstate phosphors such as $CaWO_4$; and Eu-activated halosilicate phosphors such as $Sr_2Si_3O_8.2SrCl_2$:Eu.

Other examples of the green phosphor include naphthalic imide-, benzoxazole-, styryl-, coumarin-, pyrazoline-, and triazole-based fluorescent dyes and organic phosphors such as thorium complexes.

Those phosphors may be used alone or in combination.

Selection of Second Phosphor

In the light-emitting device of this aspect, the usage and type of the second phosphor (the red phosphor, the blue phosphor, or the green phosphor) may be selected depending on uses of the light-emitting device. In order to allow the light-emitting device of the present invention to emit orange or red light, the first phosphor (the orange or red phosphor) may be used alone and the second phosphor need not be usually used.

In order to allow the light-emitting device of this aspect to emit white light, the first illuminant, the first phosphor (the orange or red phosphor), and the second phosphor may be used in combination such that desired white light can be achieved. Examples of a combination of the first illuminant, the first phosphor, and the second phosphor, which are used to allow the light-emitting device of this aspect to emit white light, are as described in Items (i), (ii), and (iii) below.

(i) A blue illuminant (a blue LED or the like) is used as the first illuminant, a red phosphor (the phosphor of the present invention or the like) is used as the first phosphor, and a green phosphor is used as the second phosphor.

(ii) A near-ultraviolet illuminant (a near-ultraviolet LED or the like) is used as the first illuminant, a red phosphor (the phosphor of the present invention or the like) is used as the first phosphor, and a blue phosphor and a green phosphor are used to serve as the second phosphor.

(iii) A blue illuminant (a blue LED or the like) is used as the first illuminant, an orange phosphor (the phosphor of the present invention or the like) is used as the first phosphor, and a green phosphor is used as the second phosphor.

Properties of Second Phosphor

The second phosphor, which is used for the light-emitting device of the present invention, usually has a weight-average median diameter $D_{50}$ of not smaller than 10 μm particularly not smaller than 15 μm and not larger than 30 μm particularly not larger than 20 μm. When the weight-average median diameter $D_{50}$ thereof is extremely small, the second phosphor is likely to have low brightness and particles of the second phosphor are likely to agglomerate. This is not preferable. In contrast, when the weight-average median diameter $D_{50}$ thereof is extremely large, a coating of the second phosphor is likely to be nonuniform or a dispenser is likely to be blocked. This is not preferable.

Configuration of Light-Emitting Device

The light-emitting device of this aspect may include the first and second illuminants as described above. Other components of the light-emitting device are not particularly limited. The first and second illuminants are usually are arranged on an appropriate frame. The second illuminant emits light when the second illuminant is excited by the light emitted from the first illuminant. The light emitted from the first illuminant and/or the light emitted from the second illuminant is extracted outside. The red phosphor is not necessarily contained in a layer that contains the blue phosphor and the green phosphor. For example, a layer containing the red phosphor may be disposed on the layer containing the blue and green phosphors.

A sealing material is usually used in addition to the first and second illuminants and the frame. In particular, the sealing material is used to form the second illuminant by dispersing the first phosphor and/or the second phosphor or used to bond the first and second illuminants and the frame together.

Examples of the sealing material used include thermoplastic resins, thermosetting resins, and photocurable resins. Particular examples of the sealing material include methacrylic resins such as polymethylmethacrylate; styrene resins such as polystyrene and styrene-acrylonitrile copolymers; polycarbonates; polyesters; phenoxy resins; butyral resins; polyvinyl alcohols; cellulose resins such as ethyl cellulose, cellulose acetate, and cellulose acetate butyrate; epoxy resins; phenol resins; and silicones. Other examples of the sealing material include solutions prepared by hydrolytically polymerizing a solution containing an inorganic material such as a metal alkoxide or a ceramic precursor polymer or a metal alkoxide-containing solution by a sol-gel process and inorganic materials prepared by solidifying combinations of these compounds, for example, inorganic materials having siloxane bonds.

Example of Light-Emitting Device

The light-emitting device of this aspect will now be described in detail with reference to an example. The present invention is not limited to the example. Various modifications may be made within the scope of the present invention.

FIG. 1 is a schematic view of a light-emitting device according to an embodiment of this aspect. The light-emitting device 1 of this embodiment includes a frame 2, a blue LED (a first illuminant) 3 serving as a light source, and a phosphor-containing section (a second illuminant) 4 that absorbs a portion of the light emitted from the blue LED 3 to emit light having a wavelength different from that of the light emitted from the blue LED 3.

The frame 2 is a resin base for supporting the blue LED 3 and the phosphor-containing section 4. The upper face of the frame 2 has a recessed portion (a recess) 2A which faces upward in FIG. 1 and which has a trapezoidal shape in cross section. That is, the frame 2 has a cup shape. This allows the light extracted from the light-emitting device 1 to be directive; hence, the light extracted therefrom can be efficiently used. The wall of the recessed portion 2A of the frame 2 is plated with a metal such as silver and therefore efficiently reflects visible light. This allows the light applied to the wall of the recessed portion 2A of the frame 2 to be extracted from the light-emitting device 1 in a predetermined direction.

The blue LED 3, which serves as a light source, is disposed at the bottom of the recessed portion 2A of the frame 2. The blue LED 3 emits blue light when the blue LED 3 is supplied with electric power. A portion of the blue light emitted from the blue LED 3 is absorbed by luminescent substances (a first phosphor and a second phosphor) contained in the phosphor-containing section 4, whereby the luminescent substances are excited. Another of the blue light emitted from the blue LED 3 is extracted from the light-emitting device 1 in a predetermined direction.

The blue LED 3 is disposed at the bottom of the recessed portion 2A of the frame 2 as described above. The frame 2 and the blue LED 3 are bonded together with a silver paste (a mixture of an adhesive and silver particles) 5. This allows the blue LED 3 to be fixed on the frame 2. The silver paste 5 has a function of conducting the heat generated from the blue LED 3 to the frame 2.

The frame 2 is connected to a wire 6, made of gold, for supplying electric power to the blue LED 3. That is, the frame 2 is connected to an electrode (not shown) disposed on the upper face of the blue LED 3 with the wire 6 by wire bonding. Electric power is supplied to the blue LED 3 through the wire 6, whereby blue light is emitted from the blue LED 3. One or more wire may be used in combination with the wire 6 depending on the configuration of the blue LED 3.

The phosphor-containing section 4, which absorbs a portion of the light emitted from the blue LED 3 to emit light having a wavelength different from that of the light emitted from the blue LED 3, is disposed in the recessed portion 2A of the frame 2. The phosphor-containing section 4 contains a phosphor and a transparent resin. The phosphor is a substance that emits light with a wavelength greater than that of blue light when the substance is excited by the light emitted from the blue LED 3. The phosphor-containing section 4 may contain the phosphor alone or may further cannot another phosphor. Whether the phosphor-containing section 4 contains one type of phosphor or several types of phosphors may be determined such that a combination of the light emitted from the blue LED 3 and the light emitted from the phosphor-containing section 4 has a desired color. The color of the light combination is not only white but also yellow, orange, pink, violet, or blue-green. The color thereof may be an intermediate color between white and one of these colors. The transparent resin is used to seal the phosphor-containing section 4 and is the sealing material described above.

The blue LED 3, the phosphor-containing section 4, and the wire 6 are protected from outside by a mold section 7. The mold section 7 functions as a lens for controlling the distribution of light. The mold section 7 may be made of an epoxy resin.

Figure 2:
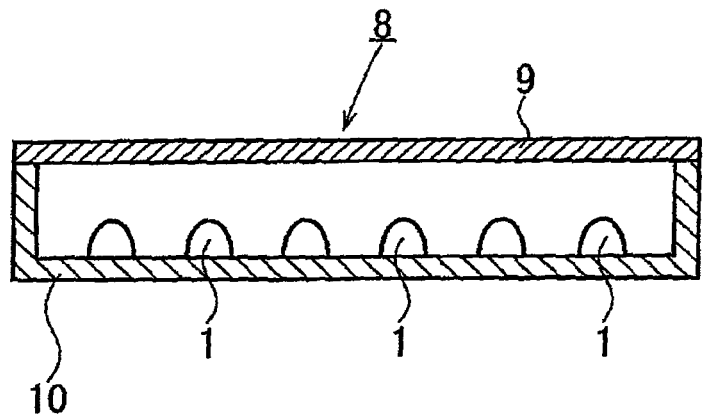
FIG. 2 is a schematic sectional view of an example of a surface-emitting lighting system including light-emitting devices according to the present invention.

FIG. 2 is a schematic sectional view of a surface-emitting Lighting system including light-emitting devices 1 that are the same as that shown in FIG. 1. With reference to FIG. 2, reference numeral 8 represents the surface-emitting Lighting system, reference numeral 9 represents a diffusion plate, and reference numeral 10 represents a support casing.

The support casing 10 is rectangular-shaped, has white smooth inner surfaces, and is not light-transmissive. In the surface-emitting lighting system 8, the light-emitting devices 1 are arranged at the bottom of the support casing 10. Furthermore, a power supply, circuit, and other components (not shown) for driving the light-emitting device 1 are arranged at the bottom of the support casing 10 so as to be located outside the light-emitting devices 1. The diffuser plate 9 is a translucent acrylic plate or the like and is fixed at a position corresponding to a lid portion of the support casing 10 such that light can be uniformly emitted through the diffusion plate 9.

When the surface-emitting lighting system 8 is operated, a voltage is applied to a blue LED 3 of each light-emitting device 1 such that the blue LED 3 emits blue light. In a phosphor-containing section 4 of the light-emitting device 1, the phosphor of the present invention that is material for converting the wavelength of light and another phosphor used as required absorb portions of the blue light emitted from the blue LED 3 to emit light with a longer wavelength. The light emitted from these phosphors is mixed with unabsorbed portions of the blue light, whereby light with high brightness is achieved. The high-brightness light passes through the diffusion plate 9 to travel upward in this figure; hence, uniform bright light can be achieved in the plane of the diffusion plate 9 on the support casing 10.

In a light-emitting device according to the present invention, when a surface-emitting excitation light source (a first illuminant) is used, a phosphor-containing section (a second illuminant) preferably has a film shape. A light beam emitted from the surface-emitting illuminant has a large cross-sectional area. Therefore, when this second illuminant extends in the cross-sectional direction of the light beam, the cross-sectional area of a phosphor irradiated with the light emitted from this first illuminant is large per phosphor. This increases the emission intensity of this phosphor.

When a first illuminant which is a surface-emitting type and a second illuminant which is film-shaped are used, this second illuminant is preferably in direct contact with a light-emitting surface of this first illuminant. The term "contact" used herein means that these first and second illuminants are tightly attached to each other with no air or gas present therebetween. This prevents light quantity loss that is caused in such a manner that the light emitted from this first illuminant is reflected by a surface of this second illuminant and then leaks outward. Hence, the emission efficiency of the entire system is high.

Figure 3:
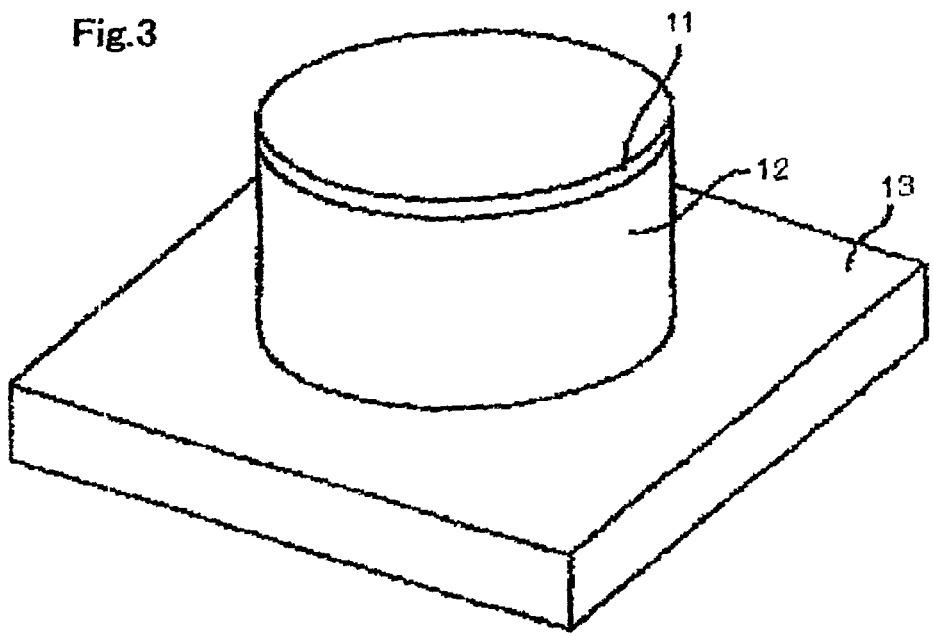
FIG. 3 is a schematic perspective view of another example of the light-emitting device of the present invention.

FIG. 3 is a schematic perspective view of a light-emitting device including this surface emitting-type first illuminant and this film-shaped second illuminant. With reference to FIG. 3, reference numeral 11 represents this second illuminant, reference numeral 12 represents this first illuminant, and reference numeral 13 represents a substrate. This second illuminant 11 contains the above phosphor. This first illuminant 12 is a surface-emitting GaN-based LD. After this first illuminant 12 and this second illuminant 11 are separately prepared, a surface of this first illuminant 12 may be attached to a surface of this second illuminant 11 with an adhesive or another material. Alternatively, this second illuminant 11 may be deposited (formed) on a light-emitting surface of this first illuminant 12. These allow these first and second illuminants 12 and 11 to be in contact with each other.

(Uses of Light-Emitting Device)

Uses of a light-emitting device according to the present invention are not particularly limited. The light-emitting device of the present invention can be used in various fields in which ordinary light-emitting devices are used. The light-emitting device of the present invention has high brightness and high color rendering properties and is suitable for a light source for displays or lighting systems. When the light-emitting device of the present invention is used as such a light source for displays, a color filter is preferably used in combination with the light-emitting device thereof.

The second aspect will now be further described in detail with reference to examples. The present invention is not limited to the examples within the scope of the present invention.

(Source Metals)

Source metals used to produce an alloy are high-purity materials having an impurity content of 0.01 mole percent or less. Sr, which is one of the source metals, is used in the form of agglomerates and the other source metals are used in the form of particles.

Example 2-1

Source metals were weighed such that the ratio (molar ratio) of Al to Si was 1:1. The source metals were melted in an argon atmosphere using a graphite crucible and a high-frequency induction melting furnace. The molten metal mixture was poured into a mold and then solidified, whereby an alloy (a mother alloy) with an Al-to-Si ratio of 1:1 was obtained.

The mother alloy and other source metals were weighed such that the ratio of Eu to Ca to Al to Si was 0.008:0.992:1:1. After the furnace was evacuated to $5 \times 10^{-2}$ Pa, the evacuation of the furnace was stopped and argon was then introduced into the furnace until the pressure in the furnace reached a predetermined value. The mother alloy was melted in a calcia crucible. Ca and Eu were added to the molten mother alloy. After all these components were melted into a mixture and the molten mixture was observed to be agitated by an induction current, the molten mixture was poured into a water-cooled copper mold (a plate shape with a thickness of 40 mm) from the crucible and then solidified, whereby an alloy having a desired composition was obtained.

In an argon atmosphere, the alloy was milled in an alumina crucible, undersize particles of the alloy that passed through a 100-mesh screen were placed on a tray made of boron nitride, and the tray was then set in an alumina reactor disposed in a tubular electric furnace. The undersize particles had a weight-average median diameter $D_{50}$ of 58.6 μm.

Nitrogen was fed through the reactor at atmospheric pressure. The reactor was heated to 1600° C. in such a manner that the concentration of oxygen in the reactor was maintained at 20 ppm or less. The reactor was maintained at that temperature for ten hours, whereby a phosphor was obtained.

The crystal phase of the phosphor was determined by X-ray powder diffraction. This confirmed that an orthorhombic crystal isomorphic to $CaAlSiN_3$ was present. The phosphor was analyzed for composition as follows: metal elements in the phosphor were determined by ICP atomic emission spectrometry (inductively coupled plasma-atomic emission spectrometry, which may be hereinafter referred to as an ICP technique) using the ICP chemical analyzer "JY 38S" manufactured by Jobin-Yvon and N and O in the phosphor were determined with a total oxygen-nitrogen analyzer (manufactured by Leco Corporation). The analysis results were shown in Table 2.

Luminescent properties of the phosphor were measured with a fluorescence spectrophotometer by 465-nm excitation. The emission wavelength of the phosphor was determined. The relative brightness of the phosphor was determined on the basis that the brightness of a phosphor prepared in Comparative Example 2-1 described below was 100%. The analysis results were shown in Table 2.

Example 2-2

Source metals were weighed such that the ratio (molar ratio) of Al to Si was 1:1. The source metals were melted in an argon atmosphere using a graphite crucible and a high-frequency induction melting furnace. The molten metal mixture was poured into a mold and then solidified, whereby an alloy (a mother alloy) with an Al-to-Si ratio of 1:1 was obtained.

The mother alloy and other source metals were weighed such that the ratio of Eu to Sr to Ca to Al to Si was 0.008: 0.792:0.2:1:1. After the furnace was evacuated to $5 \times 10^{-2}$ Pa, the evacuation of the furnace was stopped and argon was then introduced into the furnace until the pressure in the furnace reached a predetermined value. The mother alloy and Sr were melted in a calcia crucible in that order. Ca and Eu were added to the molten mixture. After all these components were melted into an alloy and the molten alloy was observed to be agitated by an induction current, the molten alloy was poured into a water-cooled copper mold (a plate shape with a thickness of 40 mm) from the crucible and then solidified.

A 40-mm thick plate of the obtained alloy was analyzed for composition by an ICP technique. A 10-g sample was taken from a portion close to the center of gravity of the plate and a 10-g sample was taken from an end portion of the plate. The elemental analysis of the samples showed that the ratio of Eu to Sr to Ca to Al to Si in the sample taken from the plate center portion was 0.009:0.782:0.212:1:0.986 and the ratio of Eu to Sr to Ca to Al to Si in the sample taken from the plate end portion was 0.009:0.756:0.210:1:0.962. The samples had substantially the same composition within the scope of analytical precision.

The obtained alloy had an X-ray powder diffraction pattern similar to that of $Sr(Si_{0.5}Al_{0.5})_2$ and therefore was determined to be an $AlB_2$-type intermetallic compound referred to as an alkaline-earth silicide.

The alloy plate was milled in the same manner as that described in Example 2-1. Into a boron nitride crucible (an inner diameter of 18 mm), 1 g of the alloy powder was placed. The boron nitride crucible was set in a hot isostatic press (HIP). The press was evacuated to $5 \times 10^{-1}$ Pa, heated to 300° C., and then further evacuated at 300° C. for one hour. Nitrogen was introduced into the press such that the pressure in the press was increased to 1 MPa. After the press was cooled, the pressure in the press was reduced to 0.1 MPa. Nitrogen was introduced into the press again such that the pressure in the press was increased to 1 MPa. This procedure was repeated twice. Before the press was heated, nitrogen was introduced into the press such that the pressure in the press was increased to 50 MPa. The sample was heated to 1800° C. at a heating rate of about 600° C./hr. The pressure in the press was increased to 135 MPa at a rate of about 50 MPa/hr by the heating process. The pressure in the press was increased to 180 MPa. The sample was maintained at 1800° C. and 180 MPa for one hour, whereby a phosphor was obtained.

The crystal phase of the phosphor was determined by X-ray powder diffraction. This confirmed that an orthorhombic crystal isomorphic to $CaAlSiN_3$ was present.

The phosphor was analyzed for composition in the same manner as that described in Example 2-1. The analysis results were shown in Table 2.

Luminescent properties of the phosphor were measured with a fluorescence spectrophotometer by 465-nm excitation. The emission wavelength of the phosphor was determined. The relative brightness of the phosphor was determined on the basis that the brightness of a phosphor prepared in Comparative Example 2-1 described below was 100%. The analysis results were shown in Table 2.

Example 2-3

The phosphor prepared in Example 2-2 was reheated with the same hot isostatic press as that used in Example 2-2 under the same conditions as those described in Example 2-2, whereby another phosphor was obtained.

The crystal phase of this phosphor was determined by X-ray powder diffraction. This confirmed that an orthorhombic crystal isomorphic to $CaAlSiN_3$ was present.

This phosphor was analyzed for composition in the same manner as that described in Example 2-1. The analysis results were shown in Table 2.

Luminescent properties of this phosphor were measured with a fluorescence spectrophotometer by 465-nm excitation. The emission wavelength of this phosphor was determined. The relative brightness of this phosphor was determined on the basis that the brightness of a phosphor prepared in Comparative Example 2-1 described below was 100%. The analysis results were shown in Table 2.

Comparative Example 2-1

$Eu_2O_3$, $Ca_3N_2$, AlN, and $Si_3N_4$ were weighed in an argon atmosphere such that the ratio of Eu to Ca to Al to Si was 0.008:0.992:1:1. These compounds were mixed together with a kneader. The mixture was placed into a boron nitride crucible, which was then set in an atmosphere furnace. The furnace was evacuated to $1 \times 10^{-2}$ Pa, the evacuation of the furnace was stopped, nitrogen was introduced into the furnace such that the pressure in the furnace was increased to 0.1 MPa, and the mixture was then heated at 1600° C. for five hours, whereby a phosphor was obtained.

The crystal phase of the phosphor was determined by X-ray powder diffraction. This confirmed that an orthorhombic crystal isomorphic to $CaAlSiN_3$ was present.

The phosphor was analyzed for composition in the same manner as that described in Example 2-1. The analysis results were shown in Table 2.

Luminescent properties of the phosphor were measured with a fluorescence spectrophotometer by 465-nm excitation. The emission wavelength of the phosphor was determined and then shown in Table 2. The brightness of the phosphor was shown to be 100%.

Comparative Example 2-2

EuN, $Sr_3N_2$, $Ca_2N_3$, AlN, and $Si_3N_4$ were weighed in an argon atmosphere such that the ratio of Eu to Sr to Ca to Al to Si was 0.008:0.792:0.2:1:1. These compounds were mixed together with a kneader. The mixture was placed into a boron nitride crucible, which was then set in an atmosphere furnace. The furnace was evacuated to $1\times10^{-2}$ Pa, the evacuation of the furnace was stopped, nitrogen was introduced into the furnace such that the pressure in the furnace was increased to 0.9 MPa, and the mixture was then heated at 1800° C. for two hours, whereby a phosphor was obtained.

The crystal phase of the phosphor was determined by X-ray powder diffraction. This confirmed that an orthorhombic crystal isomorphic to $CaAlSiN_3$ was present.

The phosphor was analyzed for composition in the same manner as that described in Example 2-1. The analysis results were shown in Table 2.

Luminescent properties of the phosphor were measured with a fluorescence spectrophotometer by 465-nm excitation. The emission wavelength of the phosphor was determined. The relative brightness of the phosphor was determined on the basis that the brightness of a phosphor prepared in Comparative Example 2-1 described above was 100%. The analysis results were shown in Table 2.

TABLE 2

| | Analytical data of phosphor composition (atomic ratio/Al = 1.00) | | | | | | Emission peak wavelength | Relative brightness |
|---|---|---|---|---|---|---|---|---|
| | Al | Si | Ca | Sr | Eu | N | O | (nm) | (%) |
| Example 2-1 | 1.00 | 0.87 | 0.825 | — | 0.0050 | 2.74 | 0.04 | 648 | 109 |
| Comparative Example 2-1 | 1.00 | 1.11 | 1.01 | — | 0.0082 | 3.19 | 0.14 | 648 | 100 |
| Example 2-2 | 1.00 | 1.00 | 0.210 | 0.783 | 0.0089 | 3.01 | 0.19 | 624 | 138 |
| Example 2-3 | 1.00 | 1.04 | 0.212 | 0.788 | 0.0089 | 3.04 | 0.11 | 628 | 184 |
| Comparative Example 2-2 | 1.00 | 1.13 | 0.182 | 0.668 | 0.0101 | 2.84 | 0.43 | 632 | 124 |

As is clear from Table 2, the phosphors prepared by nitrating the alloys by the method of the present invention have significantly higher brightness as compared to the phosphors prepared from the nitridates by a conventional method.

Example 2-4

Figure 4:
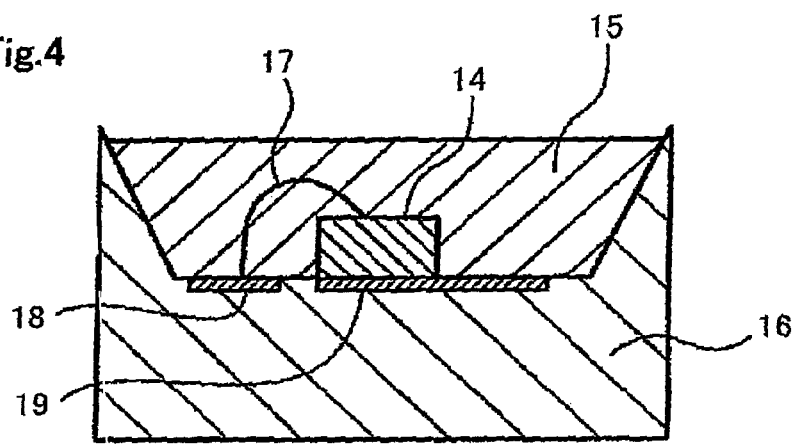
FIG. 4 is a schematic sectional view of an example of a light-emitting device.

A light-emitting device shown in FIG. 4 was prepared. A procedure for preparing the light-emitting device was as described below. In Example 2-4, reference numerals of components shown in FIG. 4 were bracketed.

A first illuminant (14) used was a blue light-emitting diode (hereinafter simply referred to as an LED), named 460 MB, available from Cree Incorporation. The LED emitted light with a dominant wavelength of 456 nm-458 nm. The blue LED (14) was connected to a terminal (19) disposed at the bottom of a recessed portion of a frame (16) with a silver paste serving as an adhesive by die bonding. In consideration of the dissipation of the heat generated from the blue LED (14), the silver paste, which serves as an adhesive, was spread uniformly. After the silver paste was cured by heating the silver paste at 150° C. for two hours, an electrode of the blue LED (14) was connected to a terminal (18) connected to the frame (16) by wire bonding (17). A wire used in this operation was a gold wire with a diameter of 25 μm.

Luminescent substances contained in a phosphor-containing section (15) were the orange phosphor (hereinafter referred to as a phosphor (A) in some cases) described in Example 3 and a $Ba_{1.39}Sr_{0.46}Eu_{0.15}SiO_4$ phosphor (hereinafter referred to as a phosphor (B) in some cases) emitting light with a wavelength of about 520 nm-760 nm. The phosphors (A) and (B) were used to prepare a phosphor-containing composition. The phosphor-containing composition was placed into the recessed portion, which had a cup shape, of the frame (16) and then cured by heating, whereby the phosphor-containing section (15) was formed.

The obtained light-emitting device was operated in such a manner that a current of 20 mA was applied to the blue LED (14) at room temperature, whereby light was emitted form the light-emitting device. The measurement of its white chromaticity point showed that x/y=0.31/0.33 and its color rendering index (Ra) was 90.

Figure 5:
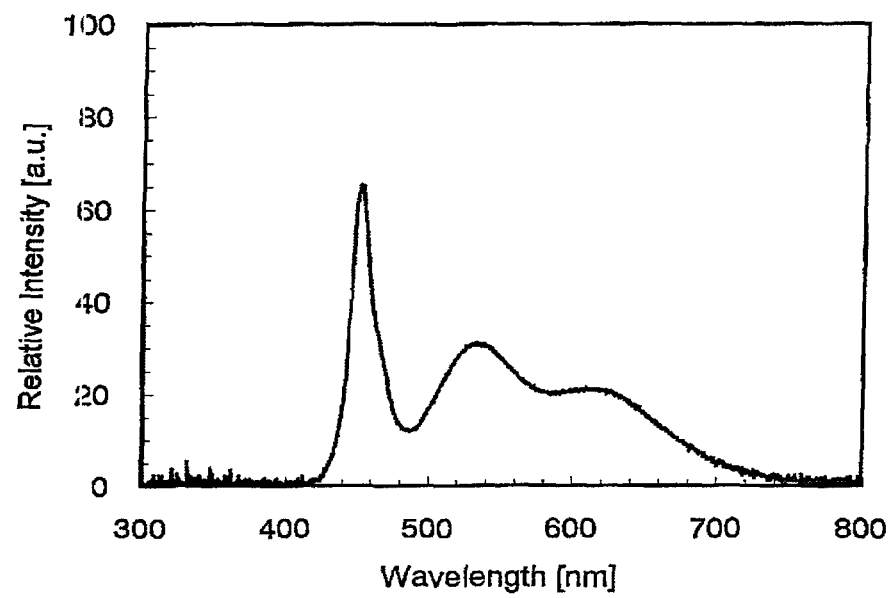
FIG. 5 is a chart showing the emission spectrum of a light-emitting device.

FIG. 5 shows the emission spectrum of the light-emitting device.

Example 2-5

A light-emitting device was prepared in substantially the same manner as that described in Example 2-4 except that a $Ca_{2.94}Ce_{0.06}Sc_{1.94}Mg_{0.06}Si_3O_{12}$ phosphor (hereinafter referred to as a phosphor (C) in some cases) emitting light with a wavelength of about 560 nm-750 nm was used instead of the phosphor (B) used in Example 2-4.

The obtained light-emitting device was operated to emit light under the same conditions as those described in Example 2-4. The measurement of its white chromaticity point showed that x/y=0.31/0.33 and its color rendering index (Ra) was 88.

Figure 6:
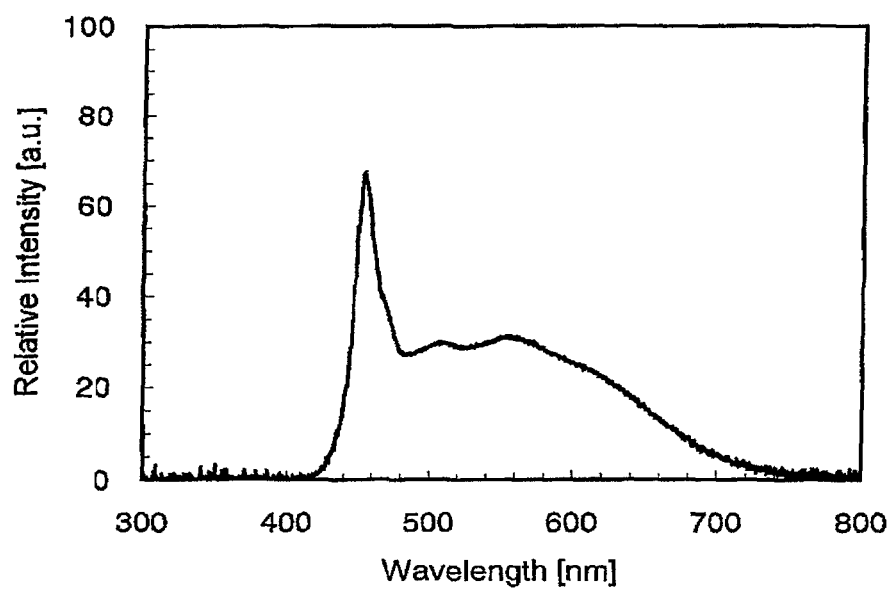
FIG. 6 is a chart showing the emission spectrum of a light-emitting device.

FIG. 6 shows the emission spectrum of the light-emitting device.

A nitride- or oxynitride-based phosphor produced by a method according to the present invention is suitable for fluorescent tubes, vacuum fluorescent displays (VFD), field emission displays (FED), plasma display panels (PDP), cathode ray tubes (CRT), white light-emitting diodes (LED), and the like.

Detailed Description of Third Aspect

The inventors have found that the luminous efficiency of a nitride- or oxynitride-based phosphor produced from an alloy correlates with the electric conductivity of a supernatant liquid that is obtained in such a manner that the phosphor is milled, the phosphor powder is classified as required, particles of the phosphor are dispersed in a tenfold weight of water, and the dispersion is then allowed to stand for one hour. The electric conductivity thereof is an index showing the amount of ions dissolved in the supernatant liquid.

A phosphor according to a third aspect is characterized in that a supernatant liquid obtained from a dispersion has an electric conductivity of 50 mS/m or less, the dispersion being prepared by dispersing a nitride- or oxynitride-based phosphor in a tenfold weight of water and then allowed to stand for one hour.

The phosphor may contain an activating element $M^1$, a tetravalent metal element $M^4$ including Si, and one or more metal elements other than Si.

The phosphor may contain a divalent metal element $M^2$ in addition to the activating element $M^1$ and the tetravalent metal element $M^4$.

In the phosphor, the divalent metal element $M^2$ may be an alkaline-earth metal.

The phosphor may further contain a trivalent metal element $M^3$.

In the phosphor, the activating element $M^1$ may be at least one selected from the group consisting of Cr, Mn, Fe, Ce, Pr, Nd, Sm, Eu, Tb, Dy, Ho, Er, Tm, and Yb.

The divalent metal element $M^2$ may be at least one selected from the group consisting of Mg, Ca, Sr, Ba, and Zn. The trivalent metal element $M^3$ may be at least one selected from the croup consisting of Al, Ga, In, and Sc. The tetravalent metal element $M^4$ may be at least one selected from the croup consisting of Si, Ge, Sn, Ti, Zr, and Hf.

Fifty mole percent or more of the divalent metal element $M^2$ may be Ca and/or Sr. Fifty mole percent or more of the trivalent metal element $M^3$ may be Al. Fifty mole percent or more of the tetravalent metal element $M^4$ may be Si.

In the phosphor, the activating element $M^1$ may be Eu and/or Ce, the divalent metal element $M^2$ may be Ca and/or Sr, the trivalent metal element $M^3$ may be Al, and the tetravalent metal element $M^4$ may be Si.

Water used to disperse the phosphor may have an electric conductivity of 0.001 mS/m-1 mS/m.

The phosphor is preferably produced from an alloy.

The third aspect provides a phosphor-containing composition containing the phosphor and a liquid medium.

The third aspect provides a light-emitting device including an excitation light source and a phosphorescent body for converting the wavelength of a portion of the light emitted from the excitation light source. The phosphorescent body contains the phosphor.

The third aspect provides a display including the light-emitting device.

The third aspect provides a lighting system including the light-emitting device.

According to the third aspect, the brightness of the phosphor can be increased by a simple technique.

A light-emitting device with high emission efficiency can be obtained by the use of the phosphor. This light-emitting device is suitable for display or lighting system applications.

The third aspect will now be further described in detail. The third aspect is not limited to examples below. Various modifications may be made within the scope of the present invention.

In the description of the third aspect, a numerical range expressed with the symbol "-" includes values which are each placed on the left or right of the symbol "-" and which each corresponds to a lower limit or an upper limit.

[Composition of Phosphor]

The composition of the nitride- or oxynitride-based phosphor according to the third aspect is not particularly limited and is as exemplified below.

The phosphor of the third aspect preferably contains the activating element $M^1$, the tetravalent metal element $M^4$ including Si, and one or more metal elements other than Si. In particular, the phosphor of the present invention contains the activating element $M^1$, the divalent metal element $M^2$, and the tetravalent metal element $M^4$. An example of the phosphor is $Sr_2Si_5N_8$:Eu, Ce or the like. The divalent metal element $M^2$ is preferably an alkaline-earth metal.

The phosphor according to the third aspect may contain the activating element $M^1$, the divalent metal element $M^2$, the trivalent metal element $M^3$, and the tetravalent metal element $M^4$ and is preferably made of a nitride or oxynitride represented by the following formula:

$$M^1_a M^2_b M^3_c M^4_d N_e O_f \quad (2)$$

wherein a, b, c, d, e, and f satisfy the following formulas:

$$0.00001 \leq a \leq 0.15,$$

$$a+b=1,$$

$$0.5 \leq c \leq 1.5,$$

$$0.5 \leq d \leq 1.5,$$

$$2.5 \leq e \leq 3.5, \text{ and}$$

$$0 \leq f \leq 0.5.$$

The description of the composition of the phosphor is common to that of the phosphor of the first aspect.

The description of the activating element $M^1$ is the same as described in the first aspect. The description made in the first aspect is applied to the activating element $M^1$.

The descriptions of elements other than the activating element $M^1$ are the same as described in the first aspect.

The description made in the first aspect is applied to these elements.

The description of the divalent metal element $M^2$ is the same as described in the first aspect. The description made in the first aspect is applied to the divalent metal element $M^2$.

The description of the trivalent metal element $M^3$ is the same as described in the first aspect. The description made in the first aspect is applied to the trivalent metal element $M^3$.

The description of the tetravalent metal element $M^4$ including Si is the same as described in the first aspect. The description made in the first aspect is applied to the tetravalent metal element $M^4$.

It is preferable that 50 mole percent or more of the divalent metal element $M^2$ be Ca and/or Sr, 50 mole percent or more of the trivalent metal element $M^3$ be Al, and 50 mole percent or more of the tetravalent metal element $M^4$ be Si, because the produced phosphor as well as that of the first aspect has high luminescent properties.

The numerical ranges of a to f in Formula (2) and the reasons why the numerical ranges thereof are preferable are the same as described in the first aspect. The description made in the first aspect is applied to the numerical ranges thereof.

The phosphor is represented by Formula (2) as described above. Alternatively, the phosphor may be represented by the following formula:

$$M^{1'}_{a'} Sr_{b'} Ca_{c'} M^{2'}_{d'} Al_{e'} Si_{f'} N_{g'} \quad (3)$$

wherein a', b', c', d', e', f', and g' satisfy the following formulas:

$$0.00001 \leq a' \leq 0.15,$$

$0.1 \leq b' \leq 0.99999,$ $0 \leq c' \leq 1,$ $0 \leq d' \leq 1,$ $a'+b'+c'+d'=1,$ $0.5 \leq e' \leq 1.5,$ $0.5 \leq f' \leq 1.5,$ and $0.8 \times (2/3+e'+4/3 \times f') \leq g' \leq 1.2 \times (2/3+e'+4/3 \times f').$ The description of Formula (3) is the same as described in the second aspect. The description made in the second aspect is applied to Formula (3).

Oxygen in the phosphor of the third aspect is an impurity contained in source metals or probably contaminates the sources metals in production steps such as a milling step and a nitridation step.

The content of oxygen in the phosphor is within such a range that reductions in luminescent properties of the phosphor are acceptable. The oxygen content of the phosphorus is usually five weight percent or less, preferably two weight percent or less, and more preferably one weight percent or less. The oxygen content thereof is likely to be reduced by washing as described below.

Examples of the phosphor include (Sr, Ca, Mg)AlSiN$_3$:Eu, (Sr, Ca, Mg)AlSiN$_3$:Ce, (Sr, Ca)$_2$Si$_5$N$_8$:Eu, and (Sr, Ca)$_2$Si$_5$N$_8$:Ce.

[Method for Producing Phosphor]

In order to produce the phosphor of the third aspect, the source metals or alloys thereof are weighed such that a composition represented by, for example, the following formula is, obtained; the composition is melted into an alloy for a phosphor precursor; the alloy is milled into a powder; and the alloy powder is nitridated and then washed:

$$M^1_a M^2_b M^3_c M^4_d \quad (1)$$

wherein M$^3$, M$^2$, M$^3$, M$^4$, a, b, c, and d are the same as the above. When the alloy contains Si and the alkaline-earth metal, it is preferable that metallic Si and/or a Si-containing alloy, which has a high melting point (a high boiling point), be primarily melted and the alkaline-earth metal, which has a low melting point (a low boiling point), be then melted.

(Purity of Source Metals)

The purity of the source metals, which are used to produce the alloy, is the same as that described in the first aspect. The description made in the first aspect is applied to the purity thereof.

(Form of Source Metals)

The form of the source metals is the same as that described in the first aspect. The description made in the first aspect is applied to the form thereof.

(Fusion of Source Metals)

The fusion of the source metals is the same as that described in the first aspect. The description made in the first aspect is applied to the fusion thereof.

(Casting of Molten Alloy)

The casting of the molten alloy is the same as that described in the first aspect. The description made in the first aspect is applied to the casting thereof.

(Milling of Cast Ingot)

The milling of an ingot of the alloy is the same as that described in the first aspect. The description made in the first aspect is applied to the milling thereof.

(Classification of Alloy Powder)

The Classification of a Powder of the Alloy is the Same as that described in the first aspect. The description made in the first aspect is applied to the classification thereof.

((Nitridation of Alloy))

The nitridation of the phosphor precursor-use alloy is the same as that described in the first aspect. The description made in the first aspect is applied to the nitridation thereof.

(Washing)

The phosphor, which is produced by nitridating the phosphor precursor-use alloy, is coarsely milled with a jaw crusher, a stamp mill, or a hammer mill and a coarse powder of the phosphor is washed with a neutral liquid or an acidic solution.

The neutral liquid used is preferably water. The type of the water used herein is not particularly limited. The water used is preferably desalted or distillated. The water used usually has an electric conductivity of not smaller than 0.001 mS/m particularly not smaller than 0.01 mS/m and not greater than 1 mS/m particularly not greater than 0.1 mS/m. The temperature of the water used is usually equal to room temperature (about 25° C.). Alternatively, warm or hot water that is preferably maintained at not lower than 40° C. particularly not lower than 50° C. and not higher than 90° C. particularly not higher than 80° C. may be used because the number of times the phosphor is washed can be reduced.

The acidic solution is preferably an acidic aqueous solution. The type of the acidic aqueous solution is not particularly limited and the acidic aqueous solution may contain one or more mineral acids such as hydrochloric acid and sulfuric acid. The acid concentration of the acidic aqueous solution is usually not lower than 0.1 mol/L particularly not lower than 0.2 mol/L and not higher than 5 mol/L particularly not higher than 2 mol/L. The acidic aqueous solution is more preferable than a neutral aqueous solution because the amount of ions dissolved from the alloy can be efficiently reduced. When the acid concentration of the acidic aqueous solution exceeds 5 mol/L, a surface portion of the phosphor may be dissolved. This is not preferable. When the acid concentration thereof is less than 0.1 mol/L, any sufficient advantage cannot be achieved. In the present invention, any corrosive acid such as fluoric acid is not necessary.

A technique for washing the phosphor is not particularly limited. In particular, particles of the phosphor are added to the neutral or acidic solution (hereinafter referred to as a washing medium in some cases), dispersed in the washing medium by stirring the washing medium, and then separated from the washing medium. A stirring technique used to wash the phosphor is not particularly limited and is preferably effective in uniformly dispersing the phosphor particles in the washing medium. For example, a chip stirrer or an agitator may be used.

The amount of the washing medium used is not particularly limited. When the amount of the washing medium used is extremely small, a sufficient advantage cannot be achieved. It is unreasonable to use an excessively large amount of the washing medium. Hence, the weight of the washing medium used is preferably not less than 2 times more preferable not less than 5 times and preferably not more than 1000 times more preferably not more than 100 times of the weight of the phosphor to be washed.

In an example below, the washing time of the phosphor is ten minutes. The washing time thereof needs to be sufficient to contact the phosphor with the washing medium and is usually one minute to one hour.

A technique for separating the phosphor particles from the washing medium is not particularly limited. Examples of the separating technique include filtration, centrifugal separation, and decantation.

The separating technique is not limited to a technique in which the phosphor particles are dispersed in the washing medium and then separated from the washing medium. The phosphor particles may be exposed to the washing medium that is flowing.

A plurality of such washing steps may be performed.

In the case where the washing steps are performed, the phosphor may be washed with water and the acidic aqueous solution. In order to prevent an acid from remaining on the phosphor, it is preferable that the phosphor be washed with the acidic aqueous solution and water in that order. The phosphor may be washed with water, the acidic aqueous solution, and then water.

In the case where the washing steps are performed, the milling step and/or the classifying step may be performed between the washing steps.

In the present invention, the phosphor is washed until the electric conductivity of a supernatant liquid is reduced to a predetermined value or less, the supernatant liquid being obtained from a water-dispersing test to which the washed phosphor is subjected to.

In the water-dispersing test, the washed phosphor is crushed or milled in a dry ball mill as required; the phosphor powder is classified by sieving or levigation such that classified particles of the phosphor have a predetermined weight-average median diameter $D_{50}$; the phosphor particles are dispersed in a tenfold weight of water by mixing the phosphor particles and water for a predetermined time, for example, ten minutes; and the dispersion is allowed to stand for one hour such that the phosphor particles, which have a density greater than that of water, settle down. The supernatant liquid obtained from this test is measured for electric conductivity. The phosphor is repeatedly washed as required until the electric conductivity of the supernatant liquid is usually reduced to 50 mS/s or less, preferably 10 mS/m or less, and more preferably 5 mS/s or less.

The water used for the water-dispersing test is not particularly limited and is preferably desalted or distillate as described for the washing medium. The electric conductivity of the water used therefor is usually not smaller than 0.001 mS/m particularly not smaller than 0.01 mS/m and not greater than 1 mS/m particularly not greater than 0.1 mS/m. The temperature of the water used therefor is usually equal to room temperature (about 25° C.).

Since the phosphor is washed as described above, the supernatant liquid, which is obtained in such a manner that the phosphor particles are dispersed in a tenfold weight of the water and the dispersion is allowed to stand for one hour, has an electric conductivity of 50 mS/m or less.

The supernatant liquid, which is obtained from the water-dispersing test of the phosphor, may be measured for electric conductivity with the conductivity meter EC METER CM-30G, manufactured by DKK-TOA Corporation, or the like.

The electric conductivity of the supernatant liquid, which is obtained from the water-dispersing test of the phosphor, is increased because components of the phosphor are dissolved in the water to form ions. The fact that the electric conductivity of the supernatant liquid is low means that the content of the water-soluble components of the phosphor is small.

The oxygen content of the phosphor is reduced by washing the phosphor as described above. This is probably because oxygen-containing impurities, for example, hydroxides produced by the hydrolysis of nitrides with low crystallinity are removed from the phosphor.

For example, in a step of washing the SCASN phosphor, phenomena below probably occur.

(1) Nitrides with low crystallinity are hydrolyzed into hydroxides such as $Sr(OH)_2$ and the hydroxides are dissolved in water. If the SCASN phosphor is washed with hot water of a dilute acid, these compounds are efficiently removed and the electric conductivity is reduced. However, if the SCASN phosphor is washed with an extremely concentrated acid or is exposed to an acid, the SCASN phosphor may be degraded. This is not preferable.

(2) Boron leaks out of a boron nitride (BN) crucible used to fire the alloy in the nitridating step to form water-soluble boron/nitrogen-alkaline earth compounds, which contaminate the phosphor. The compounds are decomposed or removed by washing.

The reason why the phosphor of the third aspect has high luminous efficiency and brightness is not completely clear; however, the reason is probably because portions of the phosphor that have been unconverted or insufficiently converted are decomposed and the decomposition products are removed by washing since the phosphor slightly smells like ammonia when the phosphor is taken into the air immediately after the phosphor is fired.

The phosphor is used in the form of powder and is dispersed in a dispersion medium in many cases. In order to facilitate a dispersion operation, those skilled in the art usually surface-treat phosphors. It is appropriate to consider these phosphors that have not yet been surface-treated to be the same as the phosphor of the present invention.

After the phosphor is washed, the phosphor is dried such that no water remains on the phosphor. The resulting phosphor is provided for use.

[Properties of Phosphor]

X-Ray Powder Diffraction Pattern

A diffraction pattern obtained by analyzing the unwashed SCASN phosphor using a Cu—Kα line (1.54184 Å) usually has a peak centered at 2θ=33.2±0.20. The intensity (height) of the peak is likely to be small after washing. This shows that impurities are removed from the phosphor by washing.

In the X-ray powder diffraction pattern of the SCASN phosphor, the intensity ratio defined by the equation $I=(I_p \times 100)/I_{max}$ is usually 15% or less, preferably 10% or less, more preferably 5% or less, and further more preferably 3% or less, wherein $I_{max}$ represents the height of the most intense peak in the 2θ range from 35.5° to 37° and $I_P$ represents the height of the peak centered at 2θ=33.2°±0.2°. The intensity of each peak is a value obtained after background correction.

Emission Spectrum

The emission spectrum of the SCASN phosphor activated with Eu according to the third aspect is the same as described in the second aspect. The description made in the second aspect is applied to the emission spectrum thereof.

Weight-Average Median Diameter $D_{50}$

The weight-average median diameter $D_{50}$ of the phosphor according to the third aspect is the same as described in the second aspect. The description made in the second aspect is applied to the weight-average median diameter $D_{50}$ thereof.

Other Properties

The phosphor of the present invention preferably has high internal quantum efficiency. The description made in the second aspect is applied to the internal quantum efficiency of the phosphor.

The phosphor of the present invention preferably has high absorption efficiency. The description made in the second aspect is applied to the absorption efficiency of the phosphor.
[Uses of Phosphor]
The description made in the second aspect is applied to uses of the phosphor of the third aspect.
[Phosphor-Containing Composition]
In the case where the phosphor of the present invention is used for applications such as light-emitting devices, the phosphor is preferably dispersed in a liquid medium. The description made in the second aspect is applied to the dispersion of the phosphor.
[Light-Emitting Device]
The light-emitting device according to the third aspect will now be described. The light-emitting device of the third aspect includes a first illuminant serving as an excitation light source and a second illuminant that emits visible light when the second illuminant is irradiated with the light emitted from the first illuminant. The light-emitting device is the same as that of the second aspect. The description made in the second aspect is applied to the light-emitting device. FIGS. 1 to 3 can be used to describe the light-emitting device.
[Uses of Light-Emitting Device]
The description made in the second aspect is applied to uses of the light-emitting device of the present invention. The third aspect will now be further described in detail with reference to examples. The present invention is not limited to the examples within the scope of the present invention.

In the examples and comparative examples described below, various evaluations were made as described below.
(Electric Conductivity of Supernatant Liquid Obtained from Water-Dispersing Test)
Particles of a phosphor that had a weight-average median diameter of 9 μm were obtained by sieve classification (if particles of the washed phosphor have a weight-average median diameter of 9 μm, the phosphor particles are not subjected to classification). The phosphor particles were put in a tenfold weight of water and the mixture was agitated for ten minutes with a stirrer, whereby the phosphor particles were dispersed in the water. After the dispersion was allowed to stand for one hour, the phosphor particles were confirmed to settle down and a supernatant liquid obtained from the dispersion was then measured for electric conductivity.

The electric conductivity of the supernatant liquid was measured with the conductivity meter EC METER CM-30G manufactured by DKK-TOA Corporation. Washing and measurement were performed at room temperature.

The water used in the water-dispersing test for phosphors or used to wash the phosphors in the examples and comparative examples had an electric conductivity of 0.03 mS/m.
(Emission Spectrum, Color Coordinates, and Brightness)
A spectrofluorometer, including a 150-W Xenon lamp serving as an excitation light source, available from JASCO Corporation was used. The light emitted from the Xenon lamp was filtered through a grating monochromator with a focal length of 10 cm, whereby a light component with a wavelength of 450 nm-475 nm was obtained. The light component was applied to each phosphor through an optical fiber. The light emitted from the phosphor by irradiation with excitation light was filtered through a grating monochromator with a focal length of 25 cm, whereby light components with a wavelength of 300 nm-800 nm were obtained. The light components were measured for intensity with the multichannel CCD detector C7041 manufactured by Hamamatsu Photonics K.K. The emission spectrum of the phosphor was obtained through signal treatment such as sensitivity correction with a personal computer.

From the data of 480 nm-800 nm wavelengths in the emission spectrum, x- and y-color coordinates in the XYZ color system according to JIS Z8701 were calculated.

The relative brightness of each phosphor was calculated from a Y-stimulus value, calculated according to JIS Z8724, in the XYZ color system on the basis that the Y-stimulus value of a phosphor prepared in Reference Example 3-3 described below was 100%.

The color coordinates and brightness of each phosphor were measured by cutting blue excitation light.
(Chemical Composition)
Each phosphor was analyzed for composition by ICP atomic emission spectrometry (inductively coupled plasma-atomic emission spectrometry, which may be hereinafter referred to as an ICP technique) using the ICP chemical analyzer "JY38S" manufactured by Jobin-Yvon.
(Weight-Average Median Diameter $D_{50}$ of Phosphors)
In advance of measurement, each sample was dispersed in a dispersion medium for 25 seconds by applying an ultrasonic wave having a frequency of 19 kHz and a power of 5 W to the sample using an ultrasonic disperser (manufactured by Kaijo Corporation). The dispersion medium contained water and a trace amount of surfactant for preventing the re-agglomeration of particles of the sample.

The weight-average median diameter was determined with a laser diffraction/scattering particle size distribution analyzer (manufactured by Horiba Ltd.).
(X-Ray Powder Diffraction Measurement)
Details of Conditions for X-Ray Powder Diffraction were as described below.
Diffractometer: PW1700, manufactured by PANalytical
Conditions for X-ray powder diffraction
X-ray source: Cu—Kα line (λ=1.54184 Å)
Predetermined output: 40 kV·30 mA
Optical conditions: divergence slit=1°
  Scattering slit=1°
  Receiving slit=0.2 mm
  Position of diffraction peak: 2θ (diffraction angle)
  Range: 2θ=10°–89.95°
Scanning speed: 0.05 degree (2θ) per second, continuous scanning
Preparation of samples: Each phosphor was manually milled in an agate mortar and the phosphor powder was molded with a molding tool (PW1001/00, manufactured by former Philips).
Sample holder: PW1781/00, manufactured by PANalytical
Size of sample section
  Outer diameter: 53 mm
  Inner diameter: 27 mm
  Depth: 2.6 mm
(Source Metals)
Source metals used to produce each alloy described below are high-purity materials having an impurity content of 0.01 mole percent or less. Sr, which is one of the source metals, is used in the form of agglomerates and the other source metals are used in the form of particles.

Synthesis Example 3-1

The alloy prepared in Example 2-2 of the second aspect was used in this example. As described in the second aspect, a 10-g sample was taken from a portion close to the center of gravity of a 40-mm thick plate of the alloy and another 10-g sample was taken from an end portion of the plate. The samples were subjected to elemental analysis by an ICP technique. The elemental analysis of the samples showed that the ratio of Eu to Sr to Ca to Al to Si in the sample taken from the plate center portion was 0.009:0.782:0.212:1:0.986 and the ratio of Eu to Sr to Ca to Al to Si in the sample taken from the plate end portion was 0.009:0.756:0.210:1:0.962. The samples had substantially the same composition within the scope of analytical precision. Therefore, these elements such as Sr were probably distributed uniformly.

As described in the second aspect, the alloy had an X-ray powder diffraction pattern similar to that of $Sr(Si_{0.5}Al_{0.5})_2$ and therefore was determined to be an $AlB_2$-type intermetallic compound referred to as an alkaline-earth silicide.

The alloy plate was milled into an alloy powder with a weight-average median diameter of 17.4 μm in a nitrogen flow. Onto a boron nitride tray with an inner diameter of 55 mm, 5 g of the alloy powder was placed. The boron nitride tray was set in a hot isostatic press (HIP). The press was evacuated, heated to 300° C., and then further evacuated at 300° C. for one hour. Nitrogen was introduced into the press such that the pressure in the press was increased to 1 MPa. After the press was cooled, the pressure in the press was reduced to 0.1 MPa. Nitrogen was introduced into the press again such that the pressure in the press was increased to 1 MPa. This procedure was repeated twice. Before the press was heated, nitrogen was introduced into the press such that the pressure in the press was increased to 50 MPa. The sample was heated to 1900° C. at a heating rate of about 600° C./hr while the pressure in the press was being increased to 190 MPa at an average rate of about 50 MPa/hr. The sample was maintained at 1900° C. for one hour while the pressure in the press was maintained at 190 MPa, whereby a target phosphor was obtained. The phosphor was coarsely milled.

The characterization of the phosphor by X-ray powder diffraction showed the presence of an orthorhombic crystal isomorphic to $CaAlSiN_3$.

Example 3-1

The phosphor prepared in Synthesis Example 3-1 was put into a tenfold weight of water, which was then stirred with a stirrer for 10 minutes, whereby the phosphor was dispersed therein. After the dispersion was allowed to stand for one hour, the phosphor was confirmed to settle down. The dispersion was filtered, whereby the phosphor was isolated.

The washed phosphor was subjected to the water-dispersing test. A supernatant liquid obtained from the test was measured for electric conductivity. The measurement result was shown in Table 3-1.

The washed phosphor was dried at 120° C. and then measured for luminescent properties. The measurement results were shown in Table 3-1.

In Table 3-1, the brightness was shown on the basis that the brightness of a phosphor prepared in Reference Example 3-3 described below was 100%.

Example 3-2

The phosphor prepared in Synthesis Example 3-1 was put into a tenfold weight of water, which was then stirred with a stirrer for 10 minutes, whereby the phosphor was dispersed therein. After the dispersion was allowed to stand for one hour, the phosphor was confirmed to settle down. The dispersion was filtered, whereby the phosphor was isolated. This procedure was repeated 17 times.

The washed phosphor was subjected to the water-dispersing test. A supernatant liquid obtained from the test was measured for electric conductivity. The measurement result was shown in Table 3-1.

The washed phosphor was dried at 120° C. and then measured for luminescent properties. The measurement results were shown in Table 3-1.

Example 3-3

The phosphor prepared in Synthesis Example 3-1 was put into a fivefold weight of a 0.5 mol/L aqueous solution of hydrochloric acid. The solution was stirred with a stirrer for ten minutes, whereby the phosphor was dispersed in the solution. After the dispersion was allowed to stand for one hour, the phosphor was confirmed to settle down. The dispersion was filtered, whereby the phosphor was isolated. This procedure was repeated six times.

The washed phosphor was subjected to the water-dispersing test. A supernatant liquid obtained from the test was measured for electric conductivity. The measurement result was shown in Table 3-1.

Figure 7:
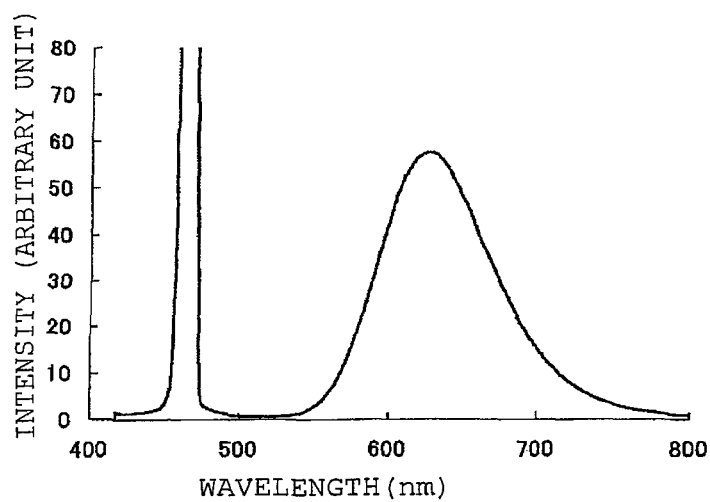
FIG. 7 is a chart showing the emission spectrum of a washed phosphor.

The washed phosphor was dried at 120° C. and then measured for luminescent properties. The emission spectrum of the phosphor was shown in FIG. 7. Luminescent properties of the phosphor were shown in Tables 3-1 and 3-2.

In Table 3-2, the relative peak intensity was shown on the basis that the relative peak intensity of the phosphor prepared in Reference Example 3-3 described below was 100%.

Figure 8:
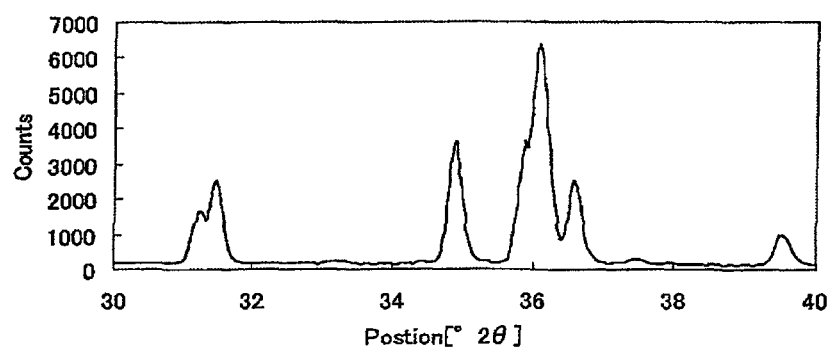
FIG. 8 is a chart showing the X-ray powder diffraction pattern of a washed phosphor.

An X-ray powder diffraction pattern of the washed phosphor was shown in FIG. 8. FIG. 8 showed that the intensity ratio I of a peak centered at $2\theta=33.2°\pm0.2°$ to the most intense peak ($I_{max}$) present in the $2\theta$ range from 35.5° to 37° was 1.9%.

Reference Example 3-1

The phosphor prepared in Synthesis Example 3-1 was subjected to the water-dispersing test without washing the phosphor. A supernatant liquid obtained from the test was measured for electric conductivity. The measurement result was shown in Table 3-1.

The phosphor was measured for luminescent properties. The measurement results were shown in Tables 3-1 and 3-2.

Figure 9:
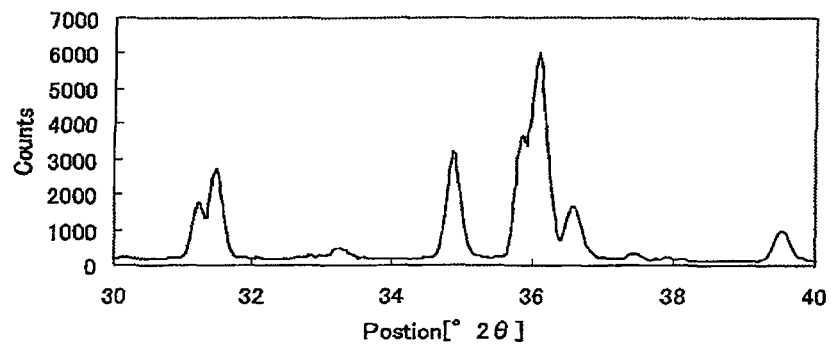
FIG. 9 is a chart showing the X-ray powder diffraction pattern of an unwashed phosphor.

An X-ray powder diffraction pattern of the phosphor was shown in FIG. 9. FIG. 9 showed that the intensity ratio I of a peak centered at $2\theta=33.2°\pm0.2°$ to the most intense peak in the $2\theta$ range from 35.5° to 37° was 4.6%.

Synthesis Example 3-2

A phosphor was synthesized in substantially the same manner as that described in Synthesis Example 3-1 except that before the alloy was fired in the HIP, the alloy was pre-fired at 1030° C. for eight hours in an atmospheric pressure nitrogen flow. The phosphor was used in Example 3-4 and Comparative Example 3-2.

Example 3-4

The phosphor prepared in Synthesis Example 3-2 was put into a tenfold weight of water the mixture was then stirred with a stirrer for 10 minutes, whereby the phosphor was dispersed therein. After the dispersion was allowed to stand for one hour, the phosphor was confirmed to settle down. The dispersion was filtered, whereby the phosphor was isolated. The resulting phosphor was milled in a ball mill. Particles of the phosphor that had a weight-average median diameter $D_{50}$ of 9 μm were obtained by classification. The phosphor was put into a fivefold weight of a 0.5 mol/L aqueous solution of hydrochloric acid. The solution was stirred with a stirrer for 10 minutes, whereby the phosphor was dispensed in the solution. After the dispersion was allowed to stand for one hour, the dispersion was filtered, whereby the phosphor was isolated. The phosphor was further dispersed in a tenfold weight of water and this dispersion was filtered. This procedure was repeated six times. Since the weigh-average median diameter $D_{50}$ of the phosphor was 9 μm, the weight-average median diameter $D_{50}$ thereof was not varied by the above washing procedure.

The washed phosphor was subjected to the water-dispersing test. A supernatant liquid obtained from the test was measured for electric conductivity. The measurement result was shown in Table 3-1. The phosphor was measured for luminescent properties. The measurement results were shown in Table 3-1.

Reference Example 3-2

The phosphor prepared in Synthesis Example 3-2 was subjected to the water-dispersing test without washing the phosphor. A supernatant liquid obtained from the test was measured for electric conductivity. The measurement result was shown in Table 3-1. The phosphor was measured for luminescent properties. The measurement results were shown in Table 3-1.

Reference Example 3-3

The phosphor prepared in Comparative Example 2-1 of the second aspect was used.

The phosphor was measured for luminescent properties with a fluorescence spectrophotometer by 465-nm excitation. This showed that the emission wavelength of the phosphor was 648 nm.

[Table 3]

with a reduction in the electric conductivity of the supernatant liquids obtained from the water-dispersing test.

The comparison between the X-ray powder diffraction pattern of the phosphor of Example 3-3 and that of Comparative Example 3-1 shows that the phosphor of Example 3-3 has higher crystallinity. This means that low-crystallinity portions are removed by washing.

Detailed Description of Fourth Aspect

The inventors have found that a phosphor produced from an alloy has high brightness and emission efficiency and there are only small peaks corresponding to impurities in the X-ray powder diffraction pattern of the phosphor.

A phosphor according to a fourth aspect is made of a nitride or an oxynitride. In the X-ray powder diffraction pattern of the nitride or the oxynitride that is determined using a Cu—Kα line (1.54184 Å), peaks present in Regions 1 to 6 have an intensity ratio I of 8% or less.

In an X-ray powder diffraction pattern in the 2θ range from 10° to 60°, the intensity ratio I is defined by the formula $(I_p \times 100)/I_{max}$ (%), wherein $I_{max}$ represents the height of the most intense peak in the 2θ range from 34° to 37° and $I_p$ represents the height of each peak. The intensity of each peak is a value obtained after background correction.

The phosphor may contain a tetravalent metal element $M^4$ including Si and one or more metal elements other than Si. The phosphor may contain a activating element $M^1$ and a divalent metal element $M^2$ in addition to the tetravalent metal element $M^4$.

In the phosphor, the divalent metal element may be an alkaline-earth metal.

The phosphor may further contain a trivalent metal element $M^3$.

TABLE 3-1

| | Treatment | Electric conductivity (mS/m) | Brightness (%) | Emission peak Wavelength (nm) |
|---|---|---|---|---|
| Example 3-1 | Washed with water once | 50 | 188 | 627 |
| Example 3-2 | Washed with water 17 times | 2.68 | 190 | 627 |
| Example 3-3 | Washed with hydrochloric acid six times | 1.20 | 194 | 626 |
| Example 3-4 | Washed with water once, washed with hydrochloric acid once, and then washed with water six times | 1.13 | 202 | 630 |
| Reference Example 3-1 | Not washed with water | 221 | 183 | 627 |
| Reference Example 3-2 | Not washed with water | 645 | 171 | 630 |

TABLE 3-2

| | Luminescent properties | | | |
|---|---|---|---|---|
| | Emission peak wavelength | Color coordinates | | Relative peak intensity |
| | (nm) | X | y | (%) |
| Example 3-3 | 626 | 0.630 | 0.366 | 99.2 |
| Reference Example 3-1 | 627 | 0.632 | 0.364 | 95.5 |

As is clear from these results, the washed phosphors have high brightness. The brightness of the phosphors increases In the phosphor, the activating element $M^1$ may be at least one selected from the group consisting of Cr, Mn, Fe, Ce, Pr, Nd, Sm, Eu, Tb, Dy, Ho, Er, Tm, and Yb.

The divalent metal element $M^2$ may be at least one selected from the group consisting of Mg, Ca, Sr, Ba, and Zn. The trivalent metal element $M^3$ may be at least one selected from the croup consisting of Al, Ga, In, and Sc. The tetravalent metal element $M^4$ may be at least one selected from the croup consisting of Si, Ge, Sn, Ti, Zr, and Hf.

Fifty mole percent or more of the divalent metal element $M^2$ may be Ca and/or Sr. Fifty mole percent or more of the trivalent metal element $M^3$ may be Al. Fifty mole percent or more of the tetravalent metal element $M^4$ may be Si.

In the phosphor, the activating element $M^1$ may be Eu and/or Ce, the divalent metal element $M^2$ may be Ca and/or Sr, the trivalent metal element $M^3$ may be Al, and the tetravalent metal element $M^4$ may be Si.

The phosphor is preferably produced from an alloy. The phosphor preferably has a peak emission wavelength of 590 nm-650 nm.

The fourth aspect provides a phosphor-containing composition containing the phosphor and a liquid medium.

The fourth aspect provides a light-emitting device including an excitation light source and a phosphorescent body for converting the wavelength of a portion of the light emitted from the excitation light source. The phosphorescent body contains the phosphor.

The fourth aspect provides a display including the light-emitting device.

The fourth aspect provides a lighting system including the light-emitting device.

The nitride- or oxynitride-based phosphor according to the fourth aspect emits brighter light as compared to conventional nitride or oxynitride phosphors and is effective in emitting yellow to orange light or orange to red light. Even if the phosphor of the fourth aspect is exposed to an excitation source for a long time, the phosphor is hardly reduced in brightness. The phosphor is suitable for use in VFD, FED, PDP, CRT, white LED, and the like. The host material of the phosphor is reddish and absorbs ultraviolet light; hence, the phosphor is suitable for red pigments and ultraviolet light absorbents.

The phosphor-containing composition is useful in manufacturing light-emitting devices with high emission efficiency. The light-emitting device is suitable for applications such as displays and lighting systems.

The fourth aspect will now be further described in detail. The fourth aspect is not limited to descriptions below. Various modifications may be made within the scope of the present invention.

In the description of the fourth aspect, a numerical range expressed with the symbol "-" includes values which are each placed on the left or right of the symbol "-" and which each corresponds to a lower limit or an upper limit.

[Composition of Phosphor]

The composition of the nitride- or oxynitride-based phosphor according to the fourth aspect is the same as that described in the third aspect. The whole description of the composition of the third aspect is cited in the fourth aspect. The description of the alloy composition of the first aspect and that of the second aspect are also cited in the fourth aspect as cited in the third aspect.

The composition of the phosphor of the fourth aspect is briefly described below for confirmation.

The phosphor of this aspect, as well as that of the third aspect, preferably contains the activating element $M^1$, the tetravalent metal element $M^4$ including Si, and one or more metal elements other than Si. In particular, the phosphor of the present invention contains the activating element $M^1$, the divalent metal element $M^2$, and the tetravalent metal element $M^4$. An example of the phosphor is $Sr_2Si_5N_8$:Eu, Ce or the like. The divalent metal element $M^2$ is preferably an alkaline-earth metal.

The phosphor of the third aspect may contain the activating element $M^1$, the divalent metal element $M^2$, the trivalent metal element $M^3$, and the tetravalent metal element $M^4$ and is preferably made of a nitride or oxynitride represented by the following formula:

 (2)

Alternatively, the phosphor, which is preferably represented by Formula (2), may be represented by the following formula:

 (3)

Formulas (2) and (3) have been sufficiently described above. Therefore, the descriptions made in the prior aspects can be used in this aspect.

[Method for Producing Phosphor]

In order to produce the phosphor of the fourth aspect, source metals or alloys thereof are weighed such that a composition represented by, for example, the following formula is obtained; the composition is melted into an alloy for a phosphor precursor; the alloy is milled into a powder; and the alloy powder is nitridated:

 (1)

wherein $M^1$, $M^2$, $M^3$, $M^4$, a, b, c, and d are as described in the first aspect. When the alloy contains Si and the alkaline-earth metal, it is preferable that metallic Si and/or a Si-containing alloy, which has a high melting point (a high boiling point), be primarily melted and the alkaline-earth metal, which has a low melting point (a low boiling point), be then melted.

(Purity of Source Metals)

The purity of the source metals, which are used to produce the alloy, is the same as that described in the first aspect. The description made in the first aspect is applied to the purity thereof.

(Form of Source Metals)

The form of the source metals is the same as that described in the first aspect. The description made in the first aspect is applied to the form thereof.

(Fusion of Source Metals)

The fusion of the source metals is the same as that described in the first aspect. The description made in the first aspect is applied to the fusion thereof.

(Casting of Molten Alloy)

The casting of the molten alloy is the same as that described in the first aspect. The description made in the first aspect is applied to the casting thereof.

(Milling of Cast Ingot)

The milling of an ingot of the alloy is the same as that described in the first aspect. The description made in the first aspect is applied to the milling thereof.

(Classification of Alloy Powder)

The Classification of a Powder of the Alloy is the Same as that described in the first aspect. The description made in the first aspect is applied to the classification thereof.

(Production of Phosphor)

A method for producing the phosphor of the fourth aspect from the alloy powder is not particularly limited. Reaction conditions are set depending on the type of the phosphor, which may be made of an oxide, a sulfide, or a nitride. The nitridation of the alloy powder is exemplified below.

((Nitridation of Alloy))

The nitridation of the alloy powder is the same as that described in the first aspect. The description made in the first aspect is applied to the nitridation thereof.

(Treatment Subsequent to Nitridation)

The phosphor, which is prepared by the nitridation of the alloy, is preferably milled, followed by classification. The phosphor is particularly preferably milled such that, for example, 90% or more of classified particles of the alloy have a size of 5 μm-20 μm.

[Properties of Phosphor]

Crystal Structure

The crystal structure of the phosphor of the fourth aspect will now be described.

The phosphor of the present invention has the same crystal structure as the structure of an orthorhombic crystal (Cmc2I, #36) isomorphic to the CASN structure disclosed in WO 2005/052087. The lattice constants of the phosphor are usually as follows: 9.8 Å≦a≦9.93 Å, 5.6 Å≦b≦5.8 Å, 5.0 Å≦c≦5.2 Å, and 280 Å$^3$≦V≦300 Å$^3$. The lattice constants thereof are preferably as follows: 9.8 Å≦a≦9.93 Å, 5.69 Å≦b≦5.77 Å, 5.1 Å≦c≦5.18 Å, and 285 Å$^3$≦V≦298 Å$^3$.

X-Ray Powder Diffraction Pattern

The inventors have characterized examples of the phosphor of the fourth aspect by X-ray powder diffraction using a CuKα line (1.54184 Å). Table 4 shows the X-ray powder diffraction patterns of the examples. With reference to Table 1, the position of each X-ray powder diffraction peak is expressed with a 2θ value (ranging from 10° to 60°).

The Sr content and Ca content of the phosphor of the present invention may be varied as described for Formula (1) With reference to Table 4, the content of Ca decreases and the content of Sr increases in the order of Example 1, Example 2, Example 3, Example 4, and Example 5. Examples 1 to 5 are orthorhombic crystals isomorphic to $CaAlSiN_3$ and each have the most intense peak and some peaks.

Table 4 shows that the positions of the diffraction peaks shift depending on the content of Sr. Since Sr has an ion radius greater than that of Ca, an increase in the content of Sr increases each lattice constant and reduces the 2θ value expressing the peak position.

TABLE 4

| Peaks | Example 1 2θ | Example 2 2θ | Example 3 2θ | Example 4 2θ | Example 5 2θ |
|---|---|---|---|---|---|
| 1 | 18.10 | 18.12 | 18.088 | 18.076 | 17.868 |
| 2 | 25.29 | 25.081 | 24.975 | 24.833 | 24.697 |
| 3 | 31.61 | 31.344 | 31.215 | 31.016 | 30.921 |
| 4 | — | 31.581 | 31.504 | 31.437 | 31.137 |
| 5 | 35.43 | 35.077 | 34.9 | 34.666 | 34.465 |
| 6 | — | 36.035 | 35.878 | 35.645 | 35.512 |
| 7 | 36.36 | 36.245 | 36.133 | 36.018 | 35.753 |
| 8 | 40.06 | 39.756 | 39.581 | 39.364 | 39.083 |
| 9 | — | 40.619 | 40.461 | 40.245 | 40.026 |
| 10 | — | 47.711 | 47.517 | 47.195 | 46.973 |
| 11 | 48.22 | 47.911 | 47.72 | 47.492 | 47.124 |
| 13 | 51.89 | 51.477 | 51.248 | 50.939 | 50.646 |
| 14 | — | 51.687 | 51.504 | 51.313 | 50.837 |
| 15 | 52.06 | 52.393 | 52.224 | 52.031 | 51.607 |
| 16 | — | 55.942 | 55.732 | 55.441 | 55.132 |
| 17 | 56.34 | 56.389 | 56.275 | 56.233 | 55.537 |
| 18 | 56.50 | — | 56.8 | 56.461 | 56.119 |

The Lower limits and upper limits of the positions of peaks in an X-ray powder diffraction pattern obtained from the same crystal structure as that of a $CaAlSiN_3$ crystal in the phosphor of the fourth aspect are the positions of peaks of Example 5 and the positions of peaks of Example 1, respectively, and preferably the positions of peaks of Example 4 and the positions of peaks of Example 2, respectively. The position of each peak in the X-ray powder diffraction pattern is more preferably in the range from a value that is 0.2° less than the position of each corresponding peak of the Example 3 to a value that is 0.2° greater than the position of this peak.

The phosphor of the fourth aspect usually has seven or more and preferably ten or more of the peaks shown in Table 4.

The phosphor of the fourth aspect has features below in addition to the peaks.

Peaks present in Regions 1 to 6 below suggest the presence of a crystal other than the phosphor of the fourth aspect; hence, these peaks preferably have low intensity. These peaks in Regions 1 to 6 usually have an intensity ratio I of 8% or less, preferably 5% or less, and more preferably 3% or less.

In an X-ray powder diffraction pattern in the 2θ range from 10° to 60°, the intensity ratio I is defined by the formula $(I_p \times 100)/I_{max}$ (%), wherein $I_{max}$ represents the height of the most intense peak present in the 2θ range from 34° to 37° and $I_p$ represents the height of each peak. The intensity of each peak is a value obtained after background correction.

Region 1 is the 2θ range from 10° to 17°.
Region 2 is the 2θ range from 18.3° to 24°.
Region 3 is the 2θ range from 25.3° to 30.7°.
Region 4 is the 2θ range from 32° to 34.3°.
Region 5 is the 2θ range from 37° to 40°.
Region 6 is the 2θ range from 41.5° to 47°.

Emission Spectrum

The emission spectrum of the SCASN phosphor activated with Eu according to the fourth aspect is the same as described in the second aspect. The description made in the second aspect is applied to the emission spectrum thereof.

Weight-Average Median Diameter $D_{50}$

The weight-average median diameter $D_{50}$ of the phosphor according to the fourth aspect is the same as described in the second aspect. The description made in the second aspect is applied to the weight-average median diameter $D_{50}$ thereof.

Other Properties

The phosphor of the fourth aspect preferably has high internal quantum efficiency. The description made in the second aspect is applied to the internal quantum efficiency of the phosphor.

The phosphor of the fourth aspect preferably has high absorption efficiency. The description made in the second aspect is applied to the absorption efficiency of the phosphor.

[Uses of Phosphor]

The description made in the second aspect is applied to uses of the phosphor of the fourth aspect.

[Phosphor-Containing Composition]

In the case where the phosphor of the present invention is used for applications such as light-emitting devices, the phosphor is preferably dispersed in a liquid medium. The description made in the second aspect is applied to the dispersion of the phosphor.

[Light-Emitting Device]

The light-emitting device according to the fourth aspect will now be described. The light-emitting device of the fourth aspect includes a first illuminant serving as an excitation light source and a second illuminant that emits visible light when the second illuminant is irradiated with the light emitted from the first illuminant. The light-emitting device is the same as that of the second aspect. The description made in the second aspect is applied to the light-emitting device. FIGS. 1 to 3 can be used to describe the light-emitting device.

[Uses of Light-Emitting Device]

The description made in the second aspect is applied to uses of the light-emitting device of the present invention.

The fourth aspect will now be further described in detail with reference to examples. The present invention is not limited to the examples within the scope of the present invention.

In the examples and comparative examples below, various evaluations were made as described below.

(Emission Spectrum, Color Coordinates, and Brightness)

The description made in the third aspect is applied to the measurement of emission spectrum, color coordinates, and brightness.

(Analysis for Chemical Composition)

The description made in the third aspect is applied to analysis for chemical composition.

(X-Ray Powder Diffraction Measurement)

The description made in the third aspect is applied to conditions for X-ray powder diffraction measurement.

(Source Metals)

Source metals used to produce each alloy described below are high-purity materials having an impurity content of 0.01 mole percent or less. Sr, which is one of the source metals, is used in the form of agglomerates and the other source metals are used in the form of particles.

Example 4-1

The alloy prepared in Example 2-2 of the second aspect was used in this example. As described in the second aspect, a 10-g sample was taken from a portion close to the center of gravity of a 40-mm thick plate of the alloy and another 10-g sample was taken from an end portion of the plate. The samples were subjected to elemental analysis by an ICP technique. The elemental analysis of the samples showed that the ratio of Eu to Sr to Ca to Al to Si in the sample taken from the plate center portion was 0.009:0.782:0.212:1:0.986 and the ratio of Eu to Sr to Ca to Al to Si in the sample taken from the plate end portion was 0.009:0.756:0.210:1:0.962. The samples had substantially the same composition within the scope of analytical precision. Therefore, these elements such as Sr were probably distributed uniformly.

As described in the second aspect, the alloy had an X-ray powder diffraction pattern similar to that of $Sr(Si_{0.5}Al_{0.5})_2$ and therefore was determined to be an $AlB_2$-type intermetallic compound referred to as an alkaline-earth silicide.

The alloy plate was milled into an alloy powder with a weight-average median diameter of 20.0 μm in a nitrogen flow. Onto a boron nitride tray with an inner diameter of 55 mm, 5 g of the alloy powder was placed. The boron nitride tray was set in a hot isostatic press (HIP). The press was evacuated to $5 \times 10^{-1}$ Pa, heated to 300° C., and then further evacuated at 300° C. for one hour. Nitrogen was introduced into the press such that the pressure in the press was increased to 1 MPa. After the press was cooled, the pressure in the press was reduced to 0.1 MPa. Nitrogen was introduced into the press again such that the pressure in the press was increased to 1 MPa. This procedure was repeated twice. Before the press was heated, nitrogen was introduced into the press such that the pressure in the press was increased to 50 MPa. The sample was heated to 1900° C. at a heating rate of about 600° C./hr while the pressure in the press was being increased to 190 MPa at an average rate of about 45 MPa/hr. The sample was maintained at 1900° C. for two hours while the pressure in the press was maintained at 190 MPa, whereby a phosphor was obtained.

Figure 10:
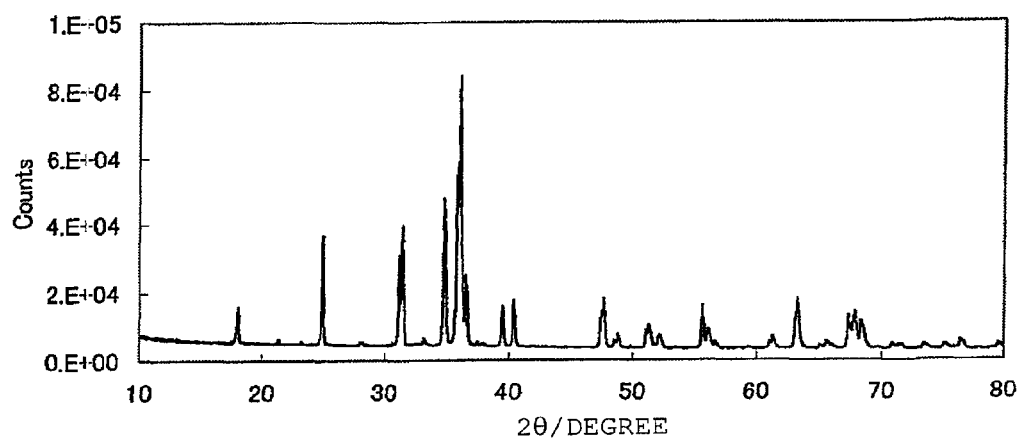
FIG. 10 is a chart showing the X-ray powder diffraction pattern of a phosphor.

FIG. 10 shows the X-ray powder diffraction pattern of the obtained phosphor and suggests the presence of an orthorhombic crystal isomorphic to $CaAlSiN_3$. The positions (2θ) of peaks in the pattern are as shown in Table 5-3. The intensity ratio of a peak present in each region of the phosphor is as shown in Table 5-1.

Luminescent properties of the phosphor are shown in Table 5-1 and the ICP chemical analysis results of the phosphor are shown in Table 5-2.

With reference to Table 5-1, the brightness of the phosphor is shown on the basis that the brightness of a phosphor prepared in Reference Example 4-1 described below is 100%.

Comparative Example 4-1

EuN, $Sr_3N_2$, $Ca_2N_3$, AlN, and $Si_3N_4$ were weighed in an argon atmosphere such that the ratio of Eu to Sr to Ca to Al to Si was 0.008:0.792:0.2:1:1. These compounds were mixed together in a mortar. The mixture was heated under a nitrogen atmosphere at a pressure of 0.92 MPa and a temperature of 1600° C. for two hours and then further heated for two hours at a temperature of 1800° C., whereby a phosphor was obtained.

Figure 11:
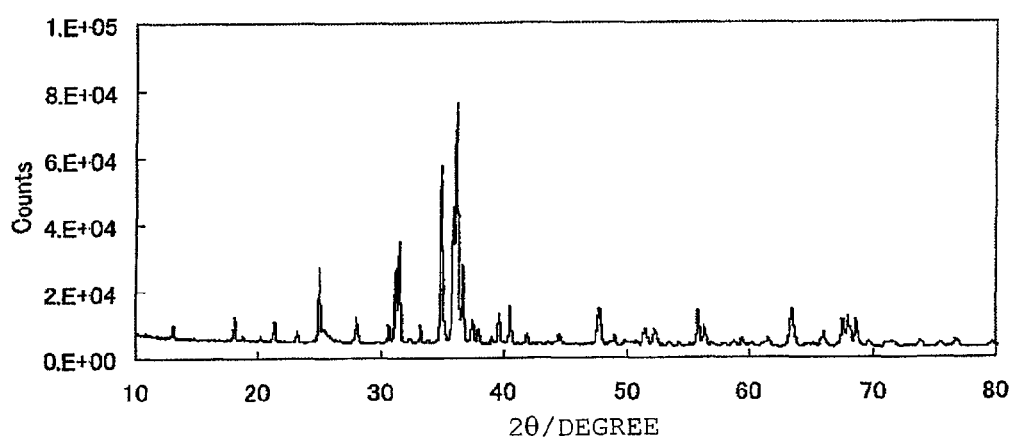
FIG. 11 is a chart showing the X-ray powder diffraction pattern of a phosphor.

The X-ray powder diffraction pattern of the phosphor was shown in FIG. 11. The evaluation results of the phosphor were shown in Tables 5-1 and 5-2.

The phosphor was characterized by X-ray powder diffraction. The characterization results showed the presence of impurities having peaks in Regions 1 to 6 described above in addition to the presence of an orthorhombic crystal isomorphic to $CaAlSiN_3$. The phosphor had a peak emission wavelength of 628 nm.

Comparative Example 4-2

A phosphor was prepared in substantially the same manner as that described in Example 4-1 except that nitridation was performed in an atmosphere furnace (1600° C., atmospheric pressure). The evaluation results of the phosphor were shown in Tables 5-1 and 5-2.

The phosphor had a peak emission wavelength of 641 nm and a relative brightness of 117%.

Reference Example 4-1

The phosphor prepared in Comparative Example 2-1 of the second aspect was used in this example. The phosphor had a peak emission wavelength of 648 nm. The positions (2θ) of peaks in the X-ray powder diffraction pattern of the phosphor were shown in Table 5-3.

[Table 5]

TABLE 5-1

| | Intensity ratio of X-ray powder diffraction peaks (%) | | | | | | Emission peak wavelength (nm) | Relative brightness (%) |
| --- | --- | --- | --- | --- | --- | --- | --- | --- |
| | Region 1 | Region 2 | Region 3 | Region 4 | Region 5 | Region 6 | | |
| Example 4-1 | <0.2 | 0.8 | 0.8 | 1.7 | 0.8 | <0.2 | 627 | 195 |
| Comparative Example 4-1 | 5.6 | 7.8 | 11 | 7.2 | 9.4 | 5 | 628 | 143 |
| Comparative Example 4-2 | 4.7 | 33 | 29 | 9 | 26 | 12 | 641 | 117 |

TABLE 5-2

| | Composition of phosphors (atomic ratio, Al = 1) | | | | | |
| --- | --- | --- | --- | --- | --- | --- |
| | Al | Si | Ca | Sr | Eu | Sr/(Ca + Sr + Eu) |
| Example 4-1 | 1 | 1 | 0.21 | 0.79 | 0.0089 | 0.78 |
| Comparative Example 4-1 | 1 | 1.13 | 0.182 | 0.67 | 0.01 | 0.78 |

TABLE 5-2-continued

Composition of phosphors (atomic ratio, Al = 1)

| | Al | Si | Ca | Sr | Eu | Sr/(Ca + Sr + Eu) |
|---|---|---|---|---|---|---|
| Comparative Example 4-2 | 1 | 1 | 0.3 | 0.51 | 0.01 | 0.62 |

TABLE 5-3

Peak positions (2θ)

| Reference Example 4-1 | Example 4-1 |
|---|---|
| 18.10 | 18.05 |
| 25.29 | 25.00 |
| 31.61 | 31.20 |
| | 31.40 |
| 35.43 | 34.82 |
| | 35.84 |
| 36.36 | 36.05 |
| 40.06 | 39.60 |
| | 40.49 |
| | 47.59 |
| 48.22 | 48.59 |
| | 48.84 |
| 51.89 | 51.34 |
| 52.06 | 52.22 |
| | 55.72 |
| 56.34 | 56.19 |
| 56.50 | 56.73 |

Detailed Description of Fifth Aspect

The inventors have found that a phosphor produced from an alloy has high performance and properties of the phosphor correlates with the valence and percentage of an activating element. This has led to a fifth aspect.

A phosphor according to the fifth aspect is made of a nitride or an oxynitride and contains an activating element $M^1$. In the phosphor, 85 mole percent or more of the activating element $M^1$ has a valence less than its maximum oxidation number.

The phosphor may contain a tetravalent metal element $M^4$ including Si and one or more metal elements other than Si. The phosphor may contain a activating element $M^1$ and a divalent metal element $M^2$ in addition to the tetravalent metal element $M^4$ including Si.

In the phosphor, the divalent metal element may be an alkaline-earth metal.

The phosphor may further contain a trivalent metal element $M^3$.

In the phosphor, the activating element $M^1$ may be at least one selected from the group consisting of Cr, Mn, Fe, Ce, Pr, Nd, Sm, Eu, Tb, Dy, Ho, Er, Tm, and Yb. The divalent metal element $M^2$ may be at least one selected from the group consisting of Mg, Ca, Sr, Ba, and Zn. The trivalent metal element $M^3$ may be at least one selected from the group consisting of Al, Ga, In, and Sc. The tetravalent metal element $M^4$ may be at least one selected from the group consisting of Si, Ge, Sn, Ti, Zr, and Hf. Fifty mole percent or more of the divalent metal element $M^2$ may be Ca and/or Sr. Fifty mole percent or more of the trivalent metal element $M^3$ may be Al. Fifty mole percent or more of the tetravalent metal element $M^4$ may be Si.

In the phosphor, the activating element $M^1$ may be Eu and/or Ce, the divalent metal element $M^2$ may be Ca and/or Sr, the trivalent metal element $M^3$ may be Al, and the tetravalent metal element $M^4$ may be Si.

The phosphor is preferably produced from an alloy.

The phosphor preferably has a peak emission wavelength of 590 nm-650 nm.

The fifth aspect provides a phosphor-containing composition containing the phosphor and a liquid medium.

The fifth aspect provides a light-emitting device including an excitation light source and a phosphorescent body for converting the wavelength of a portion of the light emitted from the excitation light source. The phosphorescent body contains the phosphor.

The fifth aspect provides a display including the light-emitting device.

The fifth aspect provides a lighting system including the light-emitting device.

The nitride- or oxynitride-based phosphor according to the fifth aspect emits brighter light as compared to conventional nitride or oxynitride phosphors and is effective in emitting yellow to orange light or orange to red light. Even if the phosphor of the fifth aspect is exposed to an excitation source for a long time, the phosphor is hardly reduced in brightness. The phosphor is suitable for use in VFD, FED, PDP, CRT, white LED, and the like. The host material of the phosphor is reddish and absorbs ultraviolet light; hence, the phosphor is suitable for red pigments and ultraviolet light absorbents.

The phosphor-containing composition is useful in manufacturing light-emitting devices with high emission efficiency. The light-emitting device is suitable for applications such as displays and lighting systems.

The fifth aspect will now be further described in detail. The fifth aspect is not limited to descriptions below. Various modifications may be made within the scope of the present invention.

In the description of the fifth aspect, a numerical range expressed with the symbol "-" includes values which are each placed on the left or right of the symbol "-" and which each corresponds to a lower limit or an upper limit.

[Composition of Phosphor]

The composition of the nitride- or oxynitride-based phosphor according to the fifth aspect is the same as that described in the third aspect. The whole description of the composition of the third aspect is cited in the fifth aspect. The description of the alloy composition of the first aspect and that of the second aspect are also cited in the fifth aspect as cited in the third aspect.

The composition of the phosphor of the fifth aspect is briefly described below for confirmation.

The phosphor of this aspect, as well as that of the third aspect, preferably contains the activating element $M^1$, the tetravalent metal element $M^4$ including Si, and one or more metal elements other than Si. In particular, the phosphor of the present invention contains the activating element $M^1$, the divalent metal element $M^2$, and the tetravalent metal element $M^4$. An example of the phosphor is $Sr_2Si_5N_8$:Eu, Ce or the like. The divalent metal element $M^2$ is preferably an alkaline-earth metal.

The phosphor of the third aspect may contain the activating element $M^1$, the divalent metal element $M^2$, the trivalent metal element $M^3$, and the tetravalent metal element $M^4$ and is preferably made of a nitride or oxynitride represented by the following formula:

  (2)

Alternatively, the phosphor, which is preferably represented by Formula (2), may be represented by the following formula:

  (3)

Formulas (2) and (3) have been sufficiently described above. Therefore, the descriptions made in the prior aspects can be used in this aspect.

[Method for Producing Phosphor]

In order to produce the phosphor of the fifth aspect, source metals or alloys thereof are weighed such that a composition represented by, for example, the following formula is obtained; the composition is melted into an alloy for a phosphor precursor; the alloy is milled into a powder; and the alloy powder is nitridated:

$$M^1_a M^2_b M^3_c M^4_d \quad (1)$$

wherein $M^1$, $M^2$, $M^3$, $M^4$, a, b, c, and d are as described in the first aspect. When the alloy contains Si and the alkaline-Earth metal, it is preferable that metallic Si and/or a Si-containing alloy, which has a high melting point (a high boiling point), be primarily melted and the alkaline-earth metal, which has a low melting point (a low boiling point), be then melted.

(Purity of Source Metals)

The purity of the source metals, which are used to produce the alloy, is the same as that described in the first aspect. The description made in the first aspect is applied to the purity thereof.

(Form of Source Metals)

The form of the source metals is the same as that described in the first aspect. The description made in the first aspect is applied to the form thereof.

(Fusion of Source Metals)

The fusion of the source metals is the same as that described in the first aspect. The description made in the first aspect is applied to the fusion thereof.

(Casting of Molten Alloy)

The casting of the molten alloy is the same as that described in the first aspect. The description made in the first aspect is applied to the casting thereof.

(Milling of Cast Ingot)

The milling of an ingot of the alloy is the same as that described in the first aspect. The description made in the first aspect is applied to the milling thereof.

(Classification of Alloy Powder)

The Classification of a Powder of the Alloy is the Same as that described in the first aspect. The description made in the first aspect is applied to the classification thereof.

(Production of Phosphor)

A method for producing the phosphor of the fifth aspect from the alloy powder is not particularly limited. Reaction conditions are set depending on the type of the phosphor, which may be made of an oxide, a sulfide, or a nitride. The nitridation of the alloy powder is exemplified below.

((Nitridation of Alloy))

The nitridation of the alloy powder is the same as that described in the first aspect. The description made in the first aspect is applied to the nitridation thereof.

(Treatment Subsequent to Nitridation)

The phosphor, which is prepared by the nitridation of the alloy, is preferably milled, followed by classification. The phosphor is particularly preferably milled such that, for example, 90% or more of classified particles of the alloy have a size of 5 μm-20 μm.

[Properties of Phosphor]

Valence and Percentage of Activating Element

In the phosphor of the fifth aspect, 85 mole percent or more of the activating element $M^1$ has a valence less than its maximum oxidation number.

Eu, which is one of preferable activating elements allowing the phosphor of the fifth aspect to emit orange or red light, is exemplified below. A portion of Eu, which is the activating element $M^1$, is present in the form of divalent ions. The percentage of $Eu^{2+}$ in Eu contained in the phosphor is preferably high. In particular, the percentage of $Eu^{2+}$ in Eu is usually 85 mole percent or more, preferably 90 mole percent or more, and more preferably 92 mole percent or more. A known technique for increasing the percentage of $Eu^{2+}$ in Eu is as follows: a material for forming the phosphor is fired in a reducing atmosphere such as a carbon monoxide atmosphere, a nitrogen/hydrogen atmosphere, or a hydrogen atmosphere during the production of the phosphor. In the present invention, the use of an alloy as a starting material has succeeded in increasing the percentage of $Eu^{2+}$ in Eu.

An example of a technique for increasing the percentage of $Eu^{2+}$ in Eu is described below.

The percentage of $Eu^{2+}$ in Eu can be determined by the analysis of the XANES spectrum of, for example, an Eu-$L_3$ absorption edge. XANES is a generic name for a particular absorption edge of an element and resonant absorption peaks located near the absorption edge and is sensitive to the valence and structure the element. In general, the energy of a large resonant peak in the XANES spectrum of the $L_3$ absorption edge of a rare earth element is known to depend on the valence of the rare earth element. For Eu, the peak corresponding to $Eu^{2+}$ has an energy that is about 8 eV less than that of the peak corresponding to $Eu^{3+}$; hence, these two peaks can be separately determined.

The local structure around a luminescent center atom can be determined by the analysis of the EXAFS spectrum of the Eu-$L_3$ absorption edge or an Eu—K absorption edge. EXAFS is a fine oscillating structure located on the high-energy side of a particular absorption edge of an element and is sensitive to the local structure around an absorbing element. The radial structure function around the absorbing element can be obtained in such a manner that an EXAFS spectrum is appropriately processed and then Fourier-transformed. In general, for similar compositions and crystal structures, the uniformity of the coordination structure around Eu increases the intensity of peaks.

In the Fourier transform of the EXAFS spectrum of the Eu-$L_3$ absorption edge or the Eu—K absorption edge, the peak corresponding to a first vicinal atom (an anion such as a nitrogen anion or an oxygen anion) is preferably sharp. The intensity of the peak corresponding to the first vicinal atom (an anion such as an N anion or an O anion) is 50% or more of the intensity of the peak corresponding to a second vicinal atom (a cation such as a Si cation, an Al cation, a Sr cation, or a Ca cation).

Since the energy level of the outermost orbital, that is, the 5d orbital of an activating element, such as $Eu^{2+}$ or $Ce^{3+}$, exhibiting luminescence due to 4f5d-4f transition is affected by a crystal field, luminescent properties are known to strongly depend on the environment of the activating element. In particular, an environment, formed by the first vicinal atom, surrounding the activating element probably has a significant affect on luminescent properties.

From the Fourier transform of EXAFS spectra, the inventors have found that emission intensity and brightness are likely to be high when the intensity of the peak corresponding to the first vicinal atom is high relatively to the intensity of the peak corresponding to the second vicinal atom. The fact that the intensity (height) of the peak corresponding to the first vicinal atom is relatively high means that the distribution of distance between the first vicinal atom and the activating element is relatively small, that is, the activating element-surrounding environment formed by the first vicinal atom is uniform. Luminous efficiency probably increases because the activating element-surrounding environment becomes uniform.

Emission Spectrum

The emission spectrum of the SCASN phosphor activated with Eu according to the fifth aspect is the same as described in the second aspect. The description made in the second aspect is applied to the emission spectrum thereof.

Weight-Average Median Diameter $D_{50}$

The weight-average median diameter $D_{50}$ of the phosphor according to the fifth aspect is the same as described in the second aspect. The description made in the second aspect is applied to the weight-average median diameter $D_{50}$ thereof.

Other Properties

The phosphor of the fifth aspect preferably has high internal quantum efficiency. The description made in the second aspect is applied to the internal quantum efficiency thereof.

The phosphor of the fifth aspect preferably has high absorption efficiency. The description made in the second aspect is applied to the absorption efficiency of the phosphor.

[Uses of Phosphor]

The description made in the second aspect is applied to uses of the phosphor of the fifth aspect.

[Phosphor-Containing Composition]

In the case where the phosphor of the present invention is used for applications such as light-emitting devices, the phosphor is preferably dispersed in a liquid medium. The description made in the second aspect is applied to the dispersion of the phosphor.

[Light-Emitting Device]

The light-emitting device according to the fifth aspect will now be described. The light-emitting device of the fifth aspect includes a first illuminant serving as an excitation light source and a second illuminant that emits visible light when the second illuminant is irradiated with the light emitted from the first illuminant. The light-emitting device is the same as that of the second aspect. The description made in the second aspect is applied to the light-emitting device. FIGS. 1 to 3 can be used to describe the light-emitting device.

[Uses of Light-Emitting Device]

The description made in the second aspect is applied to uses of the light-emitting device of the present invention. The fifth aspect will now be further described in detail with reference to examples. The present invention is not limited to the examples within the scope of the present invention.

In the examples and comparative examples below, various evaluations were made as described below.

(Emission Spectrum, Color Coordinates, and Brightness)

The description made in the fourth aspect is applied to the measurement of emission spectrum, color coordinates, and brightness.

(Analysis for Chemical Composition)

The description made in the third aspect is applied to analysis for chemical composition.

(XANES and EXAFS Measurement)

The X-ray absorption near-edge fine structure (XANES) spectrum and extended X-Ray absorption fine structure (EXAFS) spectrum of an Eu-$L_3$ absorption edge of each phosphor were measured with an XAFS measurement system placed in Beamline BL9A in Photon Factory, Institute of Materials Structure Science, High Energy Accelerator Research Organization, using a Si(111) two-crystal spectrometer and a high order light-cutting mirror.

The energy of an X-ray used was calibrated in such a manner that the spectrometer angle corresponding to a pre-edge peak located at 8980.3 eV in the XANES spectrum of a Cu—K absorption edge of a copper foil was set to 12.7185°.

Furthermore, the small drift of the spectrometer was corrected by measuring the XANES spectrum of an Eu-$L_3$ absorption edge of europium oxide. The EXAFS spectrum of an Eu—K absorption edge measured with an XAFS measurement system placed in the first hatch of Beamline BL19B2 in the large synchrotron radiation facility (SPring-8), Japan Synchrotron Radiation Research Institute, using a Si(311) two-crystal spectrometer.

The XANES spectrum and EXAFS spectrum of the Eu-$L_3$ absorption edge were measured in a range of about 700 eV covering the Eu-$L_3$ absorption edge (about 6970 eV) by a transmission method. An ionization chamber with an electrode length of 17 cm and another ionization chamber with an electrode length of 31 cm were used to detect an incident X-ray and an X-ray passing through a sample, respectively, the ionization chambers being filled with nitrogen gas. The X-ray absorption coefficient was defined by the equation $\mu t = \ln(IO/I)$ according to the Lambert-Beer law, wherein IO represents the intensity of the incident X-ray and I represents the intensity of the X-ray passing through the sample. In the vicinity of the Eu-$L_3$ absorption edge, measurement intervals were set to 0.25 eV (corresponding to a spectrometer angle of 0.0006 degree) to precisely measure the energy of a peak. The EXAFS spectrum of the Eu—K absorption edge was measured in a range of about 2000 eV covering the Eu—K absorption edge (about 48530 eV) by a transmission method. The following chambers were used to detect an incident X-ray and an X-ray passing through a sample: an ionization chamber, filled with a gas mixture containing 75% argon and 25% krypton, having an electrode length of 17 cm and another ionization chamber, filled with krypton gas, having an electrode length of 31 cm. The X-ray absorption coefficient was defined by the equation $\mu t = \ln(IO/I)$ according to the Lambert-Beer law.

Samples for measurement were prepared as follows: about 400 mg of a phosphor powder fired and then sieved or 15 mg of a phosphor powder was mixed with about 60 mg of boron nitride and the mixture was homogenized in an agate mortar and then formed into 10-mm diameter tablets under a pressure of 150 kgf/cm$^2$.

The XANES spectrum of the Eu-$L_3$ absorption edge was first differentiated to eliminate background effects, whereby the spectrum pattern corresponding to Eu$^{2+}$ was obtained in the range from 6965 eV to 6976 eV and the spectrum pattern corresponding to Eu$^{3+}$ was obtained in the range from 6976 eV to 6990 eV. The difference between the local maximum and local minimum of the differentiated spectrum was determined in each energy range. This difference was divided by the difference between the local maximum and local minimum of the differentiated XANES spectrum of the Eu-$L_3$ absorption edge of an Eu$^{2+}$ or Eu$^{3+}$ standard sample, whereby a normalized index was obtained. The index was defined as the intensity of the Eu$^{2+}$ or Eu$^{3+}$ peak. The percentage of Eu$^{2+}$ in Eu was defined by the equation r=p/(p+q), wherein r represents the percentage of Eu$^{2+}$ in Eu, p represents the intensity of the Eu$^{2+}$ peak, and q represents the intensity of the Eu$^{3+}$ peak.

On the other hand, the EXAFS spectrum of the Eu-$L_3$ absorption edge and the EXAFS spectrum of the Eu—K absorption edge were subjected to date processing by an ordinary technique. That is, the background before each absorption edge was eliminated by the fitting of a function similar to the Victoreen function ($\mu t = C\lambda 3 - D\lambda 4$), the X-ray energy was converted into a wavenumber represented by k with reference to the inflection point of the absorption edge, atomic absorption was removed by a cubic spline method, and the intensity of each peak was normalized, whereby the EXAFS function χ(k) was obtained. The function k3χ(k) obtained by multiplying the EXAFS function by the cube of the wavenumber was Fourier-transformed in the range from about 3 Å$^{-1}$ to 9 Å$^{-1}$, whereby a radial structure function was obtained. The following peaks were obtained from the radial structure function: the peak, corresponding to the first vicinal atom (an anion such as a nitrogen anion or an oxygen anion) of Eu, ranging from 1.5 Å to 2.2 Å and the peak, corresponding to the second vicinal atom (a cation such as a Si cation, an Al cation, a Sr cation, or a Ca cation) of Eu, ranging from 2.2 Å to 3.4 Å. The ratio of the peak intensity of the first vicinal atom to that of the second vicinal atom was defined by the equation s=t/u, wherein s represents the ratio thereof, t represents the peak intensity of the first vicinal atom, and u represents the peak intensity of the second vicinal atom.

(Source Metals)

Source metals used to produce each alloy described below were high-purity materials having an impurity content of 0.01 mole percent or less. Sr, which was one of the source metals, was used in the form of agglomerates and the other source metals were used in the form of particles.

Example 5-1

The phosphor synthesized in Example 4-1 of the fourth aspect was used.

The characterization of the phosphor by X-ray powder diffraction showed the presence of an orthorhombic crystal isomorphic to CaAlSiN$_3$.

The phosphor was measured for luminescent properties with a fluorescence spectrophotometer by 465-nm excitation. The relative brightness of the phosphor was determined on the basis that the brightness of a phosphor prepared in Reference Example 5-1 described below was 100%. These showed that the phosphor had a relative brightness of 195% and a peak emission wavelength of 627 nm.

The ICP elemental analysis results of the phosphor, the percentage of Eu$^{2+}$, and the EXAFS analysis results of the phosphor were shown in Table 6. The emission peak wavelength and brightness of the phosphor were shown in Table 7. The color coordinates and peak emission intensity of the phosphor were shown in Table 8, the peak emission intensity thereof being determined on the basis that the peak emission intensity of the phosphor of Reference Example 5-1 was 100%.

The EXAFS spectrum of the Eu—K absorption edge of the phosphor was shown in FIG. 12. The XANES spectrum of the Eu-L$_3$ absorption edge of the phosphor was shown in FIG. 13.

Comparative Example 5-1

EuN, Sr$_3$N$_2$, Ca$_2$N$_3$, AlN, and Si$_3$N$_4$ were weighed in an argon atmosphere such that the ratio of Eu to Sr to Ca to Al to Si was 0.008:0.792:0.2:1:1. These compounds were mixed together in a mortar. The mixture was nitridated in substantially the same manner as that described in Example 5-1 except that the mixture was heated at 1800° C. for one hour under a pressure of 180 MPa, whereby a phosphor was prepared.

The phosphor was measured for luminescent properties with a fluorescence spectrophotometer by 465-nm excitation. The relative brightness of the phosphor was determined on the basis that the brightness of the phosphor of Reference Example 5-1 was 100%. The phosphor had a peak emission wavelength of 628 nm. The ICP elemental analysis results of the phosphor, the percentage of Eu$^{2+}$, and the EXAFS analysis results of the phosphor were shown in Table 6. The emission peak wavelength and brightness of the phosphor were shown in Table 7.

The EXAFS spectrum of the Eu—K absorption edge of the phosphor was shown in FIG. 12. The XANES spectrum of the Eu-L$_3$ absorption edge of the phosphor was shown in FIG. 13.

With reference to FIG. 12, the peak (located at about 2 Å) corresponding to the first vicinal atom (an anion such as a nitrogen anion or an oxygen anion) of Eu in the phosphor of Example 5-1 is sharper as compared to that of Comparative Example 5-1. This shows that the coordination environment, formed by the first vicinal atom, around Eu in the phosphor of Example 5-1 is better than that in the phosphor (Comparative Example 5-1) prepared by a conventional nitride mixture method.

Reference Example 5-1

The phosphor prepared in Comparative Example 2-1 of the second aspect was used.

TABLE 6

| | Atomic ratio (Al = 1) | | | | | Percentage of | Intensity ratio s of Fourier-transformed first vicinal atom (%) | |
| --- | --- | --- | --- | --- | --- | --- | --- | --- |
| | Eu | Sr | Ca | Al | Si | N | Eu$^{2+}$ in Eu (%) | Eu-L$_3$ | Eu—K |
| Example 5-1 | 0.0089 | 0.79 | 0.21 | 1 | 1 | 3.01 | 94 | 52 | 68 |
| Comparative Example 5-1 | 0.01 | 0.67 | 0.2 | 1 | 1.13 | 2.84 | 78 | 41 | 38 |

TABLE 7

| | Emission peak wavelength (nm) | Brightness |
| --- | --- | --- |
| Example 5-1 | 627 | 195 |
| Comparative Example 5-1 | 628 | 143 |

TABLE 8

| | Color coordinates | | Relative peak intensity |
| --- | --- | --- | --- |
| | x | y | (%) |
| Example 5-1 | 0.634 | 0.362 | 102 |

While the present invention has been described in detail with respect to the specific embodiments, it is apparent for those skilled in the art that various modifications can be made without departing from the spirit and scope of the present invention.

The present application is based on a Japanese patent application (Japanese Patent Application No. 2005-106285) filed on Apr. 1, 2005; a Japanese patent application (Japanese Patent Application No. 2006-085148) filed on Mar. 27, 2006; a Japanese patent application (Japanese Patent Application No. 2006-085149) filed on Mar. 27, 2006; a Japanese patent application (Japanese Patent Application No. 2006-085150) filed on Mar. 27, 2006; a Japanese patent application (Japanese Patent Application No. 2006-086849) filed on Mar. 28, 2006; and Japanese patent application (Japanese Patent Application No. 2006-086850) filed on Mar. 28, 2006. These applications are fully incorporated herein by reference.

The invention claimed is:

1. A composition, comprising a phosphor that is a nitride or an oxynitride represented by the following formula:

$$M^{1'}_{a'}Sr_{b'}Ca_{c'}M^{2'}_{d'}Al_{e'}Si_{f'}N_{g'}$$

wherein:
a', b', c', d', e', f' and g' satisfy the following:

$0.00001 \leq a' \leq 0.15;$ $0.1 \leq b' \leq 0.99999;$ $0 \leq c' < 1;$ $0 \leq d' < 1;$ $a'+b'+c'+d'=1;$ $0.5 \leq e' \leq 1.5;$ $0.5 \leq f' \leq 1.5;$ and $0.8 \times (2/3+e'+4/3 \times f') \leq g' \leq 1.2 \times (2/3+e'+4/3 \times f');$ $M^{1'}$ represents an activating element selected from the group consisting of Cr, Mn, Fe, Ce, Pr, Nd, Sm, Eu, Tb, Dy, Ho, Er, Tm, and Yb;
$M^{2'}$ represents Mg and/or Ba;
an oxygen content of the phosphor is 5 wt % or less;
the composition has an X-ray powder diffraction pattern measured in a 2θ range of from 10° to 60° using a CuKα line (1.54184 Å) including Regions 1 to 6:
Region 1 is a 2θ range of from 10° to 17°;
Region 2 is a 2θ range of from 18.3° to 24°;
Region 3 is a 2θ range of from 25.3° to 30.7°;
Region 4 is a 2θ range of from 32° to 34.3°;
Region 5 is a 2θ range of from 37° to less than 39.083°; and
Region 6 is a 2θ range of from 41.5° to less than 46.973°;
each peak of the X-ray powder diffraction pattern in Regions 1 to 6 has an intensity ratio I of 8% or less; and
the intensity ratio I is defined by the formula $(I_p \times 100)/I_{max}$ (%), where $I_{max}$ represents a height of a most intense peak present in a 2θ range from 34° to 37° and $I_p$ represents a height of a measured peak, the intensity ratio being determined after background correction.

2. The composition according to claim 1, wherein each peak of the X-ray powder diffraction pattern in Regions 1 to 6 has an intensity ratio I of 5% or less.

3. The composition according to claim 1, wherein each peak of the X-ray powder diffraction pattern in Regions 1 to 6 has an intensity ratio I of 3% or less.

4. The composition according to claim 1, wherein $M^{1'}$ comprises Eu and/or Ce.

5. The composition according to claim 1, wherein $M^{1'}$ comprises Eu.

6. The composition according to claim 1, wherein b' is $0.6 \leq b' \leq 0.99999$.

7. The composition according to claim 1, wherein d' is 0.

8. The composition according to claim 1, wherein the composition is produced from an alloy.

9. The composition according to claim 1, wherein the composition has a peak emission wavelength of 590 nm to 650 nm.

10. A liquid composition, comprising the composition according to claim 1 in a liquid medium.

11. A light-emitting device, comprising:
an excitation light source; and
a phosphorescent body;
wherein the phosphorescent body comprises the composition according to claim 1.

12. A display comprising the light-emitting device according to claim 11.

13. A lighting system comprising the light-emitting device according to claim 11.

14. A composition comprising a
phosphor that is a nitride or an oxynitride comprising:
Sr and Ca;
Eu and/or Ce; and
optionally Mg and/or Ba;
wherein:
a ratio of a molar amount of Sr to a total molar amount of Sr, Ca, Mg, Ba, Eu, and Ce is from 0.1 to 0.99999;
the composition has an X-ray powder diffraction pattern measured in a 2θ range of from 10° to 60° using a CuKα line (1.54184 Å) including Regions 1 to 6:
Region 1 is a 2θ range of from 10° to 17°;
Region 2 is a 2θ range of from 18.3° to 24°;
Region 3 is a 2θ range of from 25.3° to 30.7°;
Region 4 is a 2θ range of from 32° to 34.3°;
Region 5 is a 2θ range of from 37° to less than 39.083°; and
Region 6 is a 2θ range of from 41.5° to less than 46.973°;
each peak of the X-ray powder diffraction pattern in Regions 1 to 6 has an intensity ratio I of 8% or less; and
the intensity ratio I is defined by the formula $(I_p \times 100)$, where $I_{max}$ represents a height of a most intense peak present in a 2θ range from 34° to 37° and $I_p$ represents a height of a measured peak, the intensity ratio being determined after background correction.

15. The composition according to claim 14, wherein the phosphor has an orthorhombic crystal system which is identified by an X ray diffraction pattern wherein lattice constants a, b, c and v of the crystal system are:

$9.8 \text{ Å} \leq a \leq 9.93 \text{ Å}$ $5.6 \text{ Å} \leq b \leq 5.8 \text{ Å}$ $5.0 \text{ Å} \leq c \leq 5.2 \text{ Å}$ $280 \text{ Å} \leq v \leq 300 \text{ Å}.$ 16. The composition according to claim 14, wherein each peak of the X-ray powder diffraction pattern in Regions 1 to 6 has an intensity ratio I of 5% or less.

17. The composition according to claim 14, wherein each peak of the X-ray powder diffraction pattern in Regions 1 to 6 has an intensity ratio I of 3% or less.

18. The composition according to claim 14, wherein the phosphor comprises Eu.

19. The composition according to claim 18, wherein:
a ratio of a molar amount of Sr to a total molar amount of Sr, Ca, Mg, Ba, Eu, and Ce in the phosphor is from 0.6 to 0.99999; and
the composition has a peak emission wavelength of 590 nm to 650 nm.

20. The composition according to claim 14, wherein the composition is produced from an alloy.

21. The composition according to claim 14, wherein the composition has a peak emission wavelength of 590 nm to 650 nm.

22. The composition according to claim 14, wherein the phosphor comprises oxygen in an amount of 5 wt % or less.

23. The composition according to claim 14, wherein a ratio of a molar amount of Sr to a total molar amount of Sr, Ca, Mg, Ba, Eu, and Ce in the phosphor is from 0.6 to 0.99999.

24. The composition according to claim 23, wherein:
the phosphor comprises Eu; and
the composition has a peak emission wavelength of 590 nm to 650 nm.

25. The composition according to claim 14, wherein the phosphor is free of Mg and Ba.

26. A liquid composition, comprising the composition according to claim 14 in a liquid medium.

27. A light-emitting device, comprising:
an excitation light source; and
a phosphorescent body;
wherein the phosphorescent body comprises the composition according to claim 14.

28. A display comprising the light-emitting device according to claim 27.

29. A lighting system comprising the light-emitting device according to claim 27.

30. A composition, comprising a phosphor that is a nitride or an oxynitride represented by the following formula:

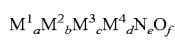

wherein:
a, b, c, d, e, and f satisfy the following:

$0.00001 \leq a' \leq 0.15;$ $a+b=1;$ $0.5 \leq c \leq 1.5;$ $0.5 \leq d \leq 1.5;$ $2.5 \leq e \leq 3.5;$ and $0 \leq f \leq 0.5;$ $M^1$ comprises at least one element selected from the group consisting of Cr, Mn, Fe, Ce, Pr, Nd, Sm, Eu, Tb, Dy, Ho, Er, Tm, and Yb;
$M^2$ comprises Ca and Sr;
$M^3$ comprises at least one element selected from the group consisting of Al, Ga, In, and Sc;
$M^4$ comprises at least one element selected from the group consisting of Si, Ge, Sn, Ti, Zr, and Hf;
a ratio of a molar amount of Sr to a total molar amount of $M^1$ and $M^2$ in the phosphor is from 0.1 to 0.99999;

the composition has an X-ray powder diffraction pattern measured in a 2θ range of from 10° to 60° using a CuKα line (1.54184 Å) including Regions 1 to 6:
Region 1 is a 2θ range of from 10° to 17°;
Region 2 is a 2θ range of from 18.3° to 24°;
Region 3 is a 2θ range of from 25.3° to 30.7°;
Region 4 is a 2θ range of from 32° to 34.3°;
Region 5 is a 2θ range of from 37° to less than 39.083°; and
Region 6 is a 2θ range of from 41.5° to less than 46.973°;
each peak of the X-ray powder diffraction pattern in Regions 1 to 6 has an intensity ratio I of 8% or less; and
the intensity ratio I is defined by the formula $(I_p \times 100)/I_{max}$ (%), where $I_{max}$ represents a height of a most intense peak present in a 2θ range from 34° to 37° and $I_p$ represents a height of a measured peak, the intensity ratio being determined after background correction.

31. The composition according to claim 30, wherein each peak of the X-ray powder diffraction pattern in Regions 1 to 6 has an intensity ratio I of 5% or less.

32. The composition according to claim 30, wherein each peak of the X-ray powder diffraction pattern in Regions 1 to 6 has an intensity ratio I of 3% or less.

33. The composition according to claim 30, wherein $M^1$ comprises Eu and/or Ce.

34. The composition according to claim 30, wherein $M^1$ comprises Eu.

35. The composition according to claim 30, wherein a ratio of a molar amount of Sr to a total molar amount of $M^1$ and $M^2$ in the phosphor is from 0.6 to 0.99999.

36. The composition according to claim 30, wherein the composition is produced from an alloy.

37. The composition according to claim 30, wherein the composition has a peak emission wavelength of 590 nm to 650 nm.

38. The composition according to claim 35, wherein:
the phosphor comprises Eu; and
the composition has a peak emission wavelength of 590 nm to 650 nm.

39. A liquid composition, comprising the composition according to claim 30 in a liquid medium.

40. A light-emitting device, comprising:
an excitation light source; and
a phosphorescent body;
wherein the phosphorescent body comprises the composition according to claim 30.

41. A display comprising the light-emitting device according to claim 40.

42. A lighting system comprising the light-emitting device according to claim 40.

43. A composition comprising a phosphor that is a nitride or an oxynitride comprising:
Sr and Ca;
Eu and/or Ce; and
optionally Mg and/or Ba;
wherein:
a ratio of a molar amount of Sr to a total molar amount of Sr, Ca, Mg, Ba, Eu, and Ce is from 0.1 to 0.99999;
the composition has an X-ray powder diffraction pattern measured in a 2θ range of from 10° to 60° using a CuKα line (1.54184 Å) including Regions 1 to 6:
Region 1 is a 2θ range of from 10° to 17°;
Region 2 is a 2θ range of from 18.3° to 24°;
Region 3 is a 2θ range of from 25.3° to 30.7°;
Region 4 is a 2θ range of from 32° to 34.3°;
Region 5 is a 2θ range of from 37° to 40°; and
Region 6 is a 2θ range of from 41.5° to 47°;

each peak of the X-ray diffraction pattern in Regions 1 to 6 has an intensity ratio I of 8% or less;

the intensity ratio I is defined by the formula $(I_p \times 100)/I_{max}$ (%), where $I_{max}$ represents a height of a most intense peak present in a 2θ range from 34° to 37° and $I_p$ represents a height of a measured peak, the intensity ratio being determined after background correction; and the peaks in Regions 1 to 6 originate from a crystal other than the phosphor.

44. The composition according to claim 43, wherein the phosphor has an orthorhombic crystal system which is identified by an X ray diffraction pattern wherein lattice constants a, b, c and v of the crystal system are:

$9.8\ Å \leq a \leq 9.93\ Å$ $5.6\ Å \leq b \leq 5.8\ Å$ $5.0\ Å \leq c \leq 5.2\ Å$ $280\ Å \leq v \leq 300\ Å$.

45. The composition according to claim 43, wherein each peak of the X-ray powder diffraction pattern in Regions 1 to 6 has an intensity ratio I of 5% or less.

46. The composition according to claim 43, wherein each peak of the X-ray powder diffraction pattern in Regions 1 to 6 has an intensity ratio I of 3% or less.

47. The composition according to claim 43, wherein the phosphor comprises Eu.

48. The composition according to claim 43, wherein the composition is produced from an alloy.

49. The composition according to claim 43, wherein the composition has a peak emission wavelength of 590 nm to 650 nm.

50. The composition according to claim 43, wherein a ratio of a molar amount of Sr to a total molar amount of Sr, Ca, Mg, Ba, Eu, and Ce is from 0.6 to 0.99999.

51. The composition according to claim 43, wherein the phosphor comprises oxygen in an amount of 5 wt % or less.

52. The composition according to claim 50, wherein:
the phosphor comprises Eu; and
the composition has a peak emission wavelength of 590 nm to 650 nm.

53. The composition according to claim 43, wherein the phosphor is free of Mg and Ba.

54. A liquid composition, comprising the composition according to claim 43 in a liquid medium.

55. A light-emitting device, comprising:
an excitation light source; and
a phosphorescent body;
wherein the phosphorescent body comprises the composition according to claim 43.

56. A display comprising the light-emitting device according to claim 55.

57. A lighting system comprising the light-emitting device according to claim 55.

* * * * *